(12) United States Patent
Hwang et al.

(10) Patent No.: US 12,274,062 B2
(45) Date of Patent: Apr. 8, 2025

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Younjeong Hwang, Hwaseong-si (KR); Minbum Kim, Hwaseong-si (KR); Hojun Seong, Suwon-si (KR); Sung-Hun Lee, Yongin-si (KR); Juneon Jin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 533 days.

(21) Appl. No.: 17/729,549

(22) Filed: Apr. 26, 2022

(65) Prior Publication Data

US 2022/0367511 A1    Nov. 17, 2022

(30) Foreign Application Priority Data

May 17, 2021 (KR) .................. 10-2021-0063376

(51) Int. Cl.
*H01L 27/11582* (2017.01)
*H01L 23/522* (2006.01)
(Continued)

(52) U.S. Cl.
CPC ......... *H10B 43/27* (2023.02); *H01L 23/5226* (2013.01); *H01L 23/5283* (2013.01);
(Continued)

(58) Field of Classification Search
CPC ........ H01L 27/11517–1156; H01L 2924/1438; H01L 29/42324–42336;
(Continued)

(56) References Cited

U.S. PATENT DOCUMENTS 8,461,639 B2    6/2013    Jeong et al.
8,497,555 B2    7/2013    Kim et al.
(Continued)

FOREIGN PATENT DOCUMENTS

| CN | 111106116 A | 5/2020 |
|---|---|---|
| KR | 10-2056401 B1 | 12/2019 |
| KR | 2021-0052753 A | 5/2021 |

*Primary Examiner* — Jarrett J Stark
(74) *Attorney, Agent, or Firm* — Harness, Dickey & Pierce, P.L.C.

(57) ABSTRACT

A three-dimensional semiconductor memory device may include a source structure on a substrate, a stack structure including electrode layers and inter-electrode insulating layers, which are on the source structure and are alternately stacked, a vertical structure penetrating the stack structure and the source structure and being adjacent to the substrate, and a separation insulation pattern penetrating the stack structure and the source structure and being spaced apart from the vertical structure. The uppermost one of the inter-electrode insulating layers may include a first impurity injection region located at a first height from a top surface of the substrate. The stack structure may define a groove, in which the separation insulation pattern is located. An inner sidewall of the groove may define a recess region, which is located at the first height from the top surface of the substrate and is recessed toward the vertical structure.

20 Claims, 41 Drawing Sheets

(51) Int. Cl.
  *H01L 23/528* (2006.01)
  *H10B 41/10* (2023.01)
  *H10B 41/27* (2023.01)
  *H10B 41/35* (2023.01)
  *H10B 41/40* (2023.01)
  *H10B 43/10* (2023.01)
  *H10B 43/27* (2023.01)
  *H10B 43/35* (2023.01)
  *H10B 43/40* (2023.01)

(52) U.S. Cl.
  CPC ............. *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
  CPC ..... H01L 29/788–7889; H01L 23/5226; H01L 23/5283; G11C 11/5621–5642; G11C 16/0408–0458; G11C 16/0483; G11C 27/005; H10B 43/27; H10B 41/10; H10B 41/35; H10B 43/10; H10B 43/35; H10B 41/20; H10B 41/50; H10B 43/50; H10B 43/20
  See application file for complete search history.

(56) References Cited

U.S. PATENT DOCUMENTS

| | | | |
|---|---|---|---|
| 8,847,302 B2 * | 9/2014 | Alsmeier | H01L 21/764 257/390 |
| 9,263,536 B2 | 2/2016 | Kim et al. | |
| 9,530,788 B2 * | 12/2016 | Oginoe | H01L 29/7889 |
| 9,576,967 B1 * | 2/2017 | Kimura | H10B 43/10 |
| 9,634,022 B2 | 4/2017 | Lee et al. | |
| 9,691,783 B2 * | 6/2017 | Yoon | H10B 43/27 |
| 9,768,192 B1 * | 9/2017 | Nakamura | H10B 43/27 |
| 9,780,034 B1 * | 10/2017 | Tsutsumi | H10B 43/35 |
| 9,871,052 B2 * | 1/2018 | Lee | H10B 43/27 |
| 9,960,181 B1 * | 5/2018 | Cui | H10B 41/50 |
| 9,985,098 B2 * | 5/2018 | Matsumoto | H10B 41/41 |
| 9,991,280 B2 * | 6/2018 | Nakamura | H01L 28/00 |
| 10,115,627 B2 * | 10/2018 | Miyano | H01L 23/5226 |
| 10,192,784 B1 * | 1/2019 | Cui | H10B 43/50 |
| 10,242,994 B2 * | 3/2019 | Inomata | H10B 43/27 |
| 10,256,248 B2 * | 4/2019 | Lu | H01L 23/498 |
| 10,319,680 B1 * | 6/2019 | Sel | H10B 41/27 |
| 10,354,980 B1 * | 7/2019 | Mushiga | H01L 21/76898 |
| 10,381,322 B1 * | 8/2019 | Azuma | H01L 24/05 |
| 10,600,802 B2 * | 3/2020 | Nakamura | H01L 29/1037 |
| 10,797,028 B2 * | 10/2020 | Liu | H01L 23/49827 |
| 10,847,533 B2 | 11/2020 | Lee et al. | |
| 10,886,380 B2 | 1/2021 | Zhu | |
| 10,930,663 B2 * | 2/2021 | Lu | H10B 41/10 |
| 10,937,804 B2 * | 3/2021 | Oh | H10B 43/10 |
| 10,957,680 B2 * | 3/2021 | Yada | H01L 23/528 |
| 10,957,706 B2 * | 3/2021 | Otsu | H10B 43/27 |
| 10,964,714 B2 | 3/2021 | Lim et al. | |
| 11,004,773 B2 * | 5/2021 | Wu | H01L 25/50 |
| 11,031,377 B2 * | 6/2021 | Liu | H01L 24/08 |
| 11,232,839 B1 * | 1/2022 | Lee | G11C 16/08 |
| 11,251,197 B2 | 2/2022 | Lee | |
| 11,302,713 B2 * | 4/2022 | Baraskar | H01L 21/7813 |
| 11,417,675 B2 * | 8/2022 | Jang | H01L 21/76805 |
| 11,862,565 B2 * | 1/2024 | Sun | H01L 21/76805 |
| 2012/0001252 A1 * | 1/2012 | Alsmeier | H01L 29/66825 257/E21.679 |
| 2012/0003800 A1 * | 1/2012 | Lee | H01L 29/7889 257/E21.645 |
| 2013/0130468 A1 * | 5/2013 | Higashitani | H01L 28/88 257/E21.004 |
| 2014/0252454 A1 * | 9/2014 | Rabkin | H10B 63/34 257/329 |
| 2014/0273373 A1 * | 9/2014 | Makala | H01L 29/7926 438/270 |
| 2015/0155296 A1 * | 6/2015 | Yoon | H01L 29/6656 257/324 |
| 2017/0236835 A1 * | 8/2017 | Nakamura | H01L 28/00 257/314 |
| 2017/0271261 A1 * | 9/2017 | Tsutsumi | H10B 43/10 |
| 2017/0358593 A1 * | 12/2017 | Yu | H10B 43/27 |
| 2018/0374865 A1 * | 12/2018 | Shimabukuro | H10B 43/35 |
| 2020/0075629 A1 | 3/2020 | Park et al. | |
| 2020/0279733 A1 | 9/2020 | Kumakura et al. | |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0063376, filed on May 17, 2021, in the Korean Intellectual Property Office, the entire contents of which are hereby incorporated by reference.

BACKGROUND

The present inventive concepts relate to semiconductor devices and electronic systems including the same, and in particular, to three-dimensional semiconductor memory devices with improved reliability and increased integration density and electronic systems including the same.

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices.

SUMMARY

Some example embodiments of the inventive concepts provide a three-dimensional semiconductor memory device with improved reliability and an electronic system including the same.

According to some example embodiments of the inventive concepts, a three-dimensional semiconductor memory device may include a source structure on a substrate, a stack structure including electrode layers and inter-electrode insulating layers, which are alternately stacked on the source structure, a vertical structure penetrating the stack structure and the source structure and being adjacent to the substrate, and a separation insulation pattern penetrating the stack structure and the source structure and being spaced apart from the vertical structure. The uppermost one of the inter-electrode insulating layers may include a first impurity injection region located at a first height from a top surface of the substrate. The stack structure may define a groove, in which the separation insulation pattern is located. An inner sidewall of the groove may define a recess region, which is located at the first height from the top surface of the substrate and is recessed toward the vertical structure.

According to some example embodiments of the inventive concepts, a three-dimensional semiconductor memory device may include a peripheral circuit structure and a cell array structure on the peripheral circuit structure. The cell array structure may include a first substrate including a cell array region and a connection region, a source structure on the first substrate, a stack structure including electrode layers and inter-electrode insulating layers, which are alternately stacked on the first substrate, a planarization insulating layer on the connection region and covering an end portion of the stack structure, a plurality of vertical patterns on the cell array region and penetrating the stack structure and the source structure and adjacent to the first substrate, bit line pads on the vertical patterns, respectively, and a separation insulation pattern on the cell array region and penetrating the stack structure and the source structure. The uppermost one of the inter-electrode insulating layers may include a first impurity injection region that is located at a first height from a top surface of the first substrate. The stack structure may define a groove in which the separation insulation pattern is located. An upper sidewall of the groove may define a recess region which is located at the first height from the top surface of the first substrate and is recessed toward at least one vertical pattern of the plurality of vertical patterns. The bit line pads may be doped with impurities with a doping concentration ranging from $9\times10^{20}$ ions/cm$^3$ to $2\times10^{21}$ ions/cm$^3$.

According to some example embodiments of the inventive concepts, an electronic system may include a semiconductor device including a peripheral circuit structure, a cell array structure disposed on the peripheral circuit structure, and an input/output pad electrically connected to the peripheral circuit structure, and a controller electrically connected to the semiconductor device through the input/output pad and configured to control the semiconductor device. The cell array structure may include a first substrate including a cell array region and a connection region, a source structure on the first substrate, a stack structure including electrode layers and inter-electrode insulating layers alternately stacked on the first substrate, a planarization insulating layer on the connection region and covering an end portion of the stack structure, a plurality of vertical patterns on the cell array region and penetrating the stack structure and the source structure and to be adjacent to the first substrate, and a separation insulation pattern on the cell array region and penetrating the stack structure and the source structure. The uppermost one of the inter-electrode insulating layers may include a first impurity injection region at a first height from a top surface of the first substrate. The stack structure may define a groove in which the separation insulation pattern is located. An upper sidewall of the groove may define a recess region located at the first height from the top surface of the first substrate and recessed toward at least one vertical pattern of the plurality of vertical patterns.

DETAILED DESCRIPTION

Figure 1A:
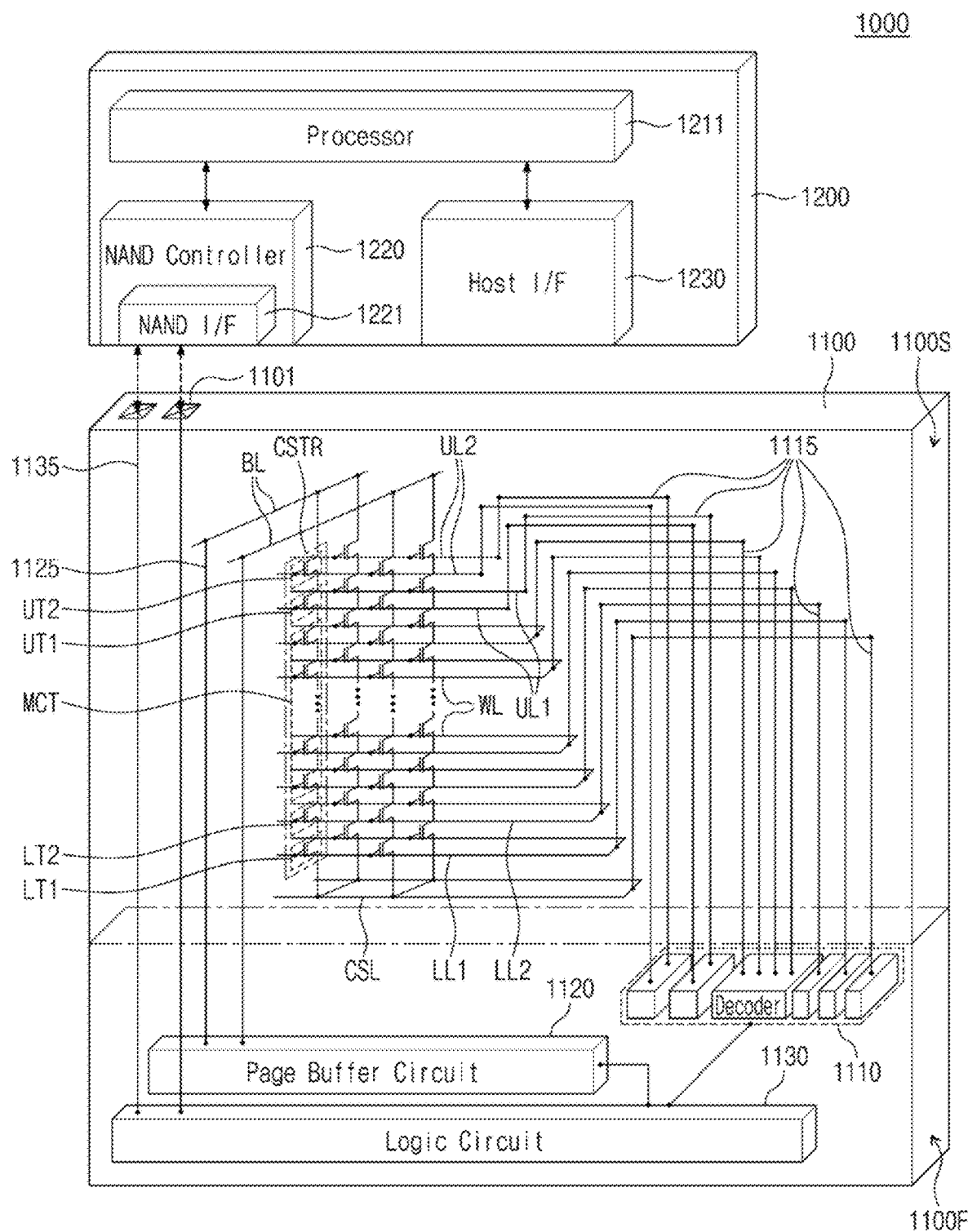
FIG. 1A is a diagram schematically illustrating an electronic system including a semiconductor device according to some example embodiments of the inventive concepts.

Some example embodiments of the inventive concepts will now be described more fully with reference to the accompanying drawings, in which some example embodiments are shown.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1A is a diagram schematically illustrating an electronic system including a semiconductor device according to some example embodiments of the inventive concepts.

Referring to FIG. 1A, an electronic system 1000 according to some example embodiments of the inventive concepts may include a semiconductor device 1100 and a controller 1200 electrically connected to the semiconductor device 1100. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In some example embodiments, the first structure 1100F may be disposed beside the second structure 1100S. The first structure 1100F may be a peripheral circuit structure including a decoder circuit 1110, a page buffer circuit 1120, and a logic circuit 1130. The second structure 1100S may be a memory cell structure (e.g., a cell array structure according to any of the example embodiments) including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In some example embodiments, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In some example embodiments, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer circuit 1120 through second connection lines 1125, which are extended from the first structure 1100F to the second structure 1100S.

In the first structure 1100F, the decoder circuit 1110 and the page buffer circuit 1120 may be configured to perform a control operation on at least selected one of the memory cell transistors MCT. The decoder circuit 1110 and the page buffer circuit 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is extended from the first structure 1100F to the second structure 1100S. The input/output pad 1101 may be electrically connected to the first structure 1100F (e.g., a peripheral circuit structure according to any of the example embodiments). The controller 1200 may be electrically connected to the semiconductor device 1100 through the input/output pad 1101. Thus, the controller 1200 may be electrically connected to a semiconductor device, semiconductor storage device, or the like that may be included in and/or at least partially comprise the semiconductor device 1100, through the input/output pad 1101. The controller 1200 may be configured to control the semiconductor device 1100 (e.g., via communication with the semiconductor device 1100 through the input/output pad 1101).

The controller 1200 may include a processor 1211, a NAND controller 1220, and a host interface 1230. In some example embodiments, the electronic system 1000 may include a plurality of semiconductor devices 1100, and in this case, the controller 1200 may control the semiconductor devices 1100.

The processor 1211 may control overall operations the electronic system 1000 including the controller 1200. The processor 1211 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be configured to transmit and receive control commands, which are used to control the semiconductor device 1100, data, which are written in or read from the memory cell transistors MCT of the semiconductor device 1100, and so forth. The host interface 1230 may be configured to allow for communication between the electronic system 1000 and an external host. When the processor 1211 receives a control command transmitted from the external host through the host interface 1230, the processor 1211 may control the semiconductor device 1100 in response to the control command.

Figure 1B:
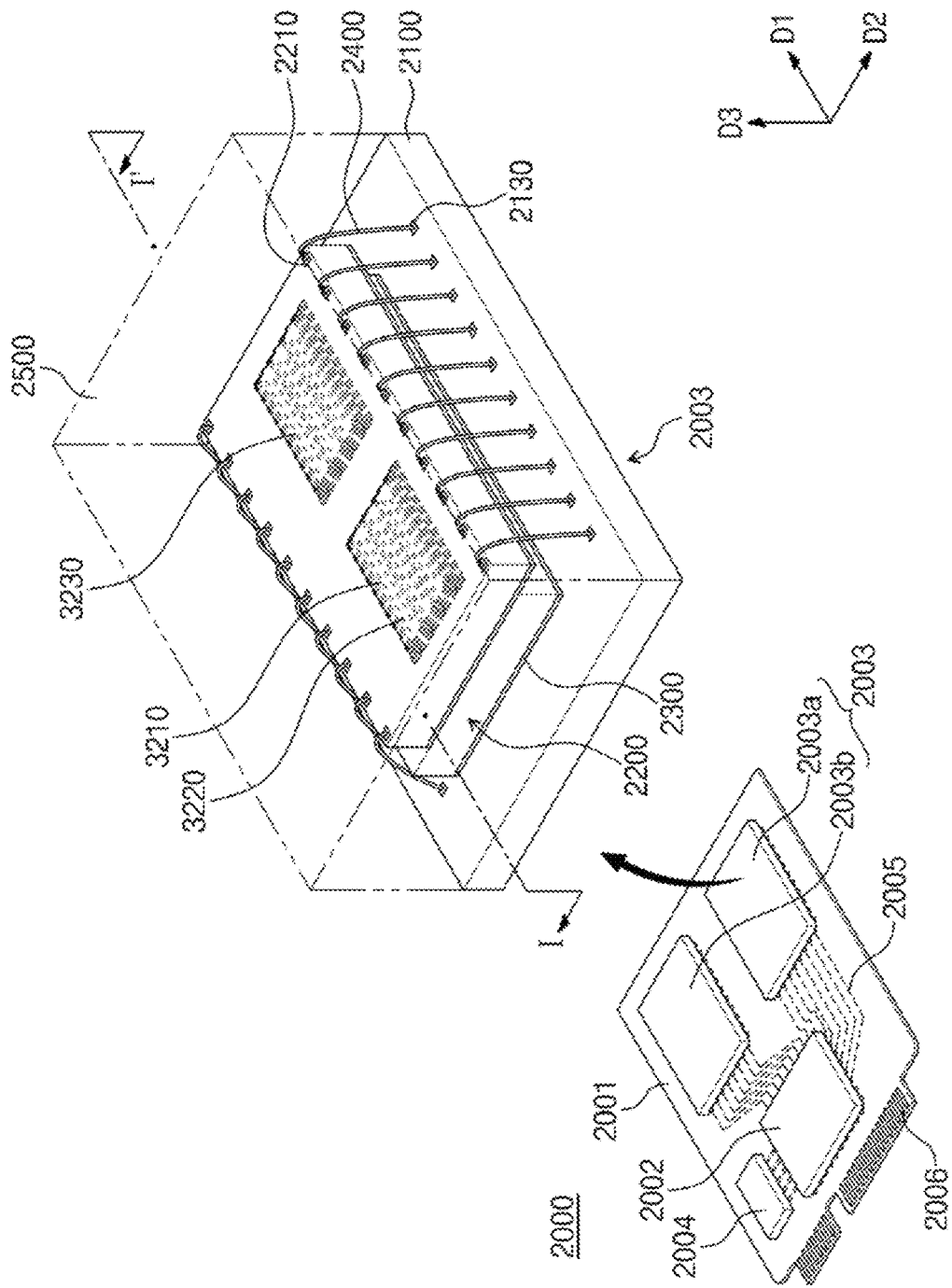
FIG. 1B is a perspective view schematically illustrating an electronic system including a semiconductor device according to some example embodiments of the inventive concepts.

FIG. 1B is a perspective view schematically illustrating an electronic system including a semiconductor device according to some example embodiments of the inventive concepts.

Referring to FIG. 1B, an electronic system 2000 according to some example embodiments of the inventive concepts may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 by interconnection patterns 2005, which are formed in the main substrate 2001.

The main substrate 2001 may include a connector 2006, which includes a plurality of pins coupled to an external host. In the connector 2006, the number and arrangement of the pins may be changed depending on a communication interface between the electronic system 2000 and the external host. In some example embodiments, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In some example embodiments, the electronic system 2000 may be driven by a power, which is supplied from the external host through the connector 2006. The electronic system 2000 may further include a Power Management Integrated Circuit (PMIC) that is configured to distribute a power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In some example embodiments, the DRAM 2004 in the electronic system 2000 may serve as a cache memory and may be used as a storage space, which is configured to store data temporarily during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1A. Each of the semiconductor chips 2200 may include gate stacks 3210 and vertical structures 3220. Each of the semiconductor chips 2200 may include a semiconductor device, which will be described below, according to some example embodiments of the inventive concepts.

In some example embodiments, the connection structure 2400 may be a bonding wire, which is provided to electrically connect the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. Alternatively, in each of the first and second semiconductor packages 2003a and 2003b, the semiconductor chips 2200 may be electrically connected to each other by a connection structure including through-silicon vias (TSVs), not by the connection structure 2400 provided in the form of bonding wires.

In some example embodiments, the controller 2002 and the semiconductor chips 2200 may be included in a single package. In some example embodiments, the controller 2002 and the semiconductor chips 2200 may be mounted on an additional interposer substrate different from the main substrate 2001 and may be connected to each other through interconnection lines, which are provided in the interposer substrate.

Figure 1C:
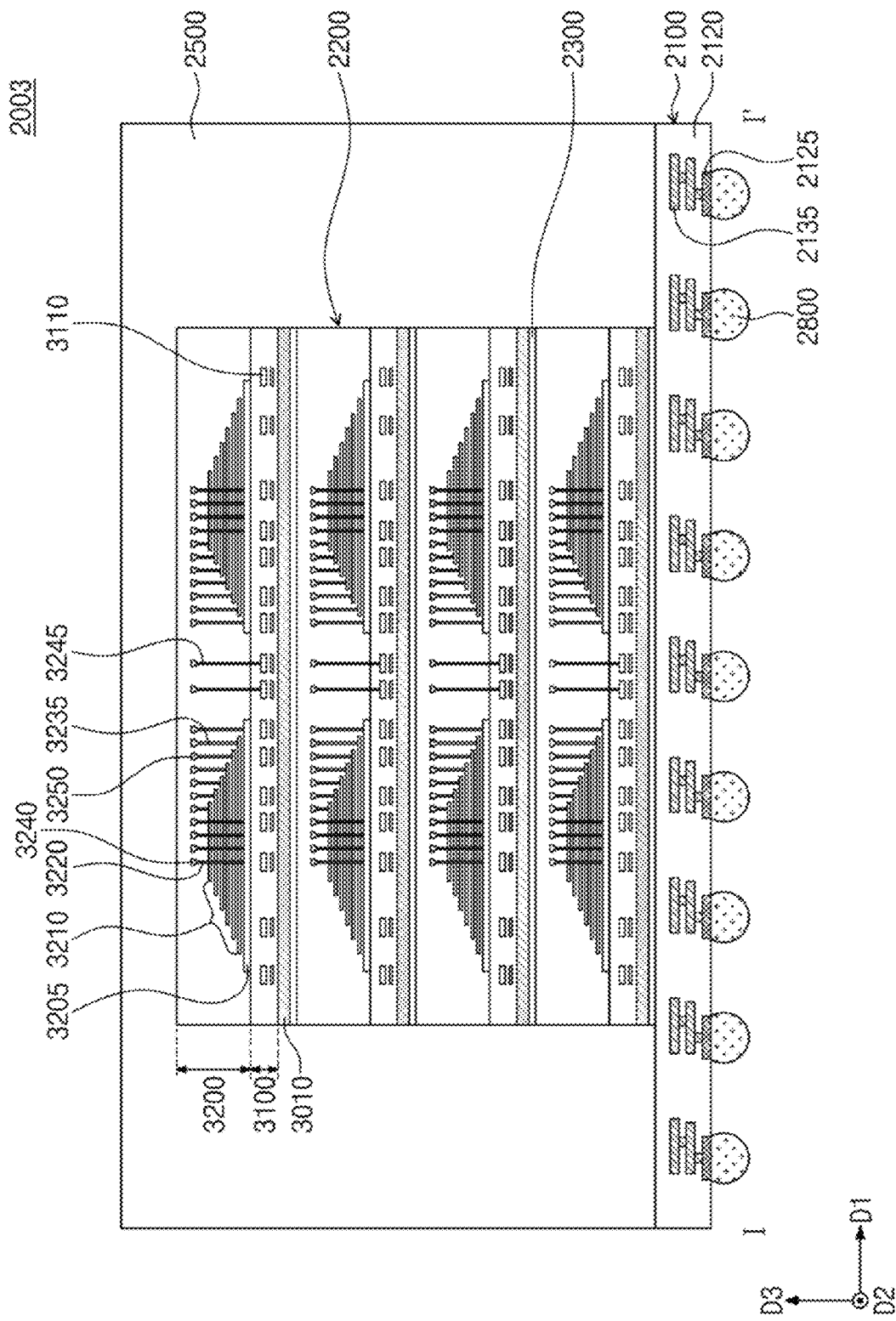
FIGS. 1C and 1D are sectional views, each of which schematically illustrates a semiconductor package according to some example embodiments of the inventive concepts.
Figure 1D:
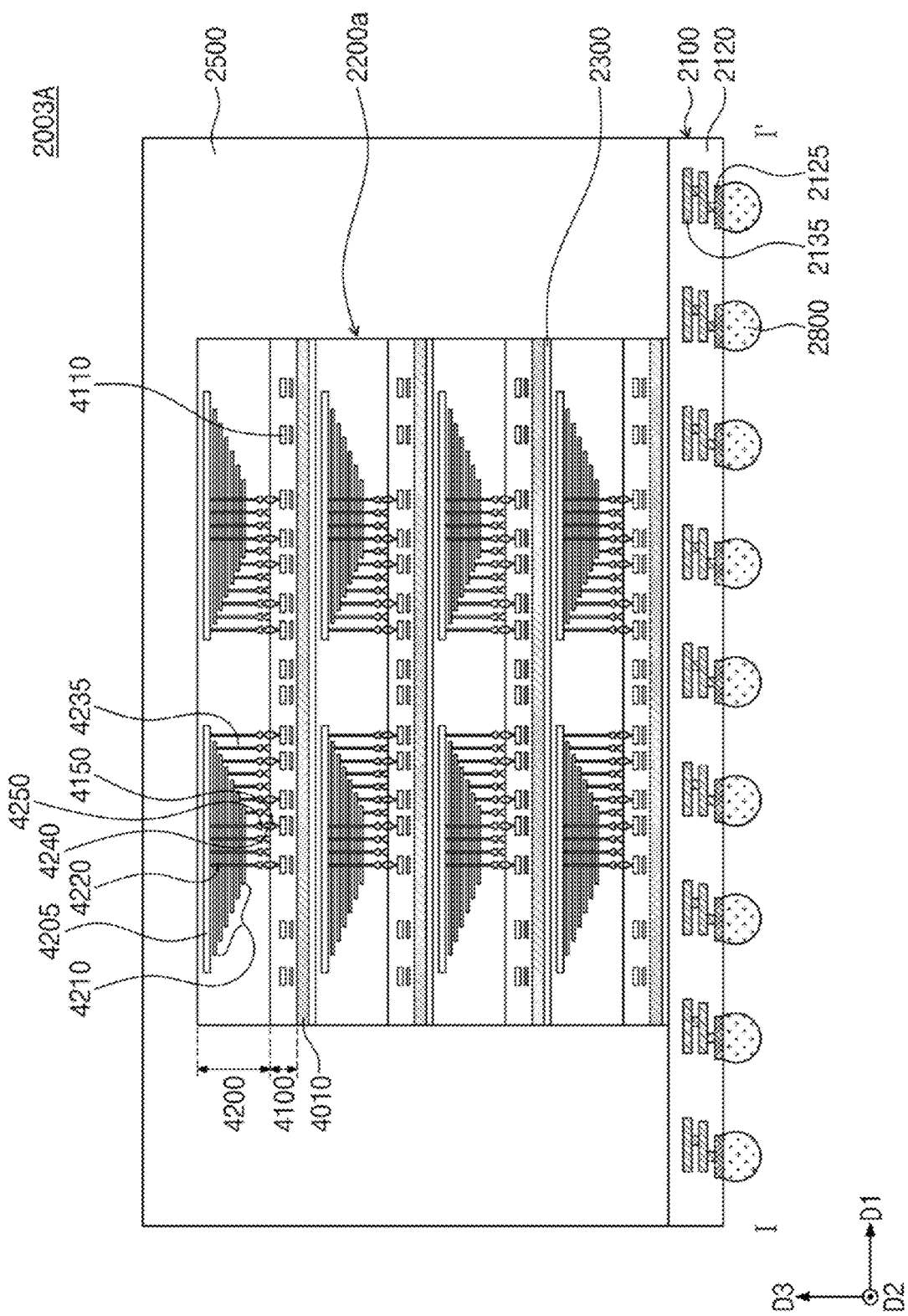

FIGS. 1C and 1D are sectional views, each of which schematically illustrates a semiconductor package according to some example embodiments of the inventive concepts. FIGS. 1C and 1D are sectional views, which are taken along a line I-I' of FIG. 1B, and illustrate two different examples of the semiconductor package of FIG. 1B.

Referring to FIG. 1C, the package substrate 2100 of the semiconductor package 2003 may be a printed circuit board. The package substrate 2100 may include a package substrate body portion 2120, the package upper pads 2130 (e.g., see FIG. 1B), which are disposed on a top surface of the package substrate body portion 2120, lower pads 2125, which are disposed on or exposed through a bottom surface of the package substrate body portion 2120, and internal lines 2135, which are disposed in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005 of the main substrate 2001 of the electronic system 2000 shown in FIG. 1B through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region including peripheral lines 3110. The second structure 3200 may include a source structure 3205, a stack 3210 on the source structure 3205, the vertical structures 3220 and separation structures 3230 penetrating the stack 3210, bit lines 3240 electrically connected to the vertical structures 3220, junction structures 3250, and cell contact plugs 3235 electrically connected to the word lines WL (e.g., see FIG. 1) of the stack 3210. Each of the first and second structures 3100 and 3200 and the semiconductor chips 2200 may further include separation structures to be described below.

Each of the semiconductor chips 2200 may include a penetration line 3245, which is electrically connected to the peripheral lines 3110 of the first structure 3100 and is extended into the second structure 3200. The penetration line 3245 may be disposed outside the stack 3210, and in some example embodiments, the penetration line 3245 may be provided to further penetrate the stack 3210. Each of the semiconductor chips 2200 may further include the input/output pad 2210 (e.g., see FIG. 1B), which is electrically connected to the peripheral lines 3110 of the first structure 3100.

Referring to FIG. 1D, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded to the first structure 4100 in a wafer bonding manner.

The first structure 4100 may include a peripheral circuit region including a peripheral line 4110 and first junction structures 4150. The second structure 4200 may include a source structure 4205, a stack 4210 between the source structure 4205 and the first structure 4100, vertical structures 4220 and a separation structure 3230 penetrating the stack 4210, and second junction structures 4250, which are electrically and respectively connected to the vertical structures 4220 and the word lines WL (e.g., see FIG. 1A) of the stack 4210. For example, the second junction structures 4250 may be electrically connected to the vertical structures 4220 and the word lines WL (e.g., see FIG. 1A), respectively, through bit lines 4240 electrically connected to the vertical structures 4220 and cell contact plugs 4235 electrically connected to the word lines WL (e.g., see FIG. 1A). The first junction structures 4150 of the first structure 4100 may be in contact with and bonded to the second junction structures 4250 of the second structure 4200. The bonded portions of the first junction structures 4150 and the second junction structures 4250 may be formed of or include, for example, copper (Cu).

Each of the first and second structures 4100 and 4200 and the semiconductor chips 2200a may further include a source structure according to some example embodiments to be described below. Each of the semiconductor chips 2200a may further include the input/output pad 2210 (e.g., see FIG. 1B), which is electrically connected to the peripheral lines 4110 of the first structure 4100.

The semiconductor chips 2200 of FIG. 1C and the semiconductor chips 2200a of FIG. 1D may be electrically connected to each other by the connection structures 2400, which are provided in the form of bonding wires. However, in some example embodiments, semiconductor chips provided in each semiconductor package (e.g., the semiconductor chips 2200 of FIG. 1C and the semiconductor chips 2200a of FIG. 1D) may be electrically connected to each other through a connection structure including through-silicon vias (TSVs).

The first structure 3100 of FIG. 1C and the first structure 4100 of FIG. 1D may correspond to a peripheral circuit structure in some example embodiments to be described below, and the second structure 3200 of FIG. 1C and the second structure 4200 on the first structure 4100 of FIG. 1D may correspond to a cell array structure in some example embodiments to be described below.

Figure 2:
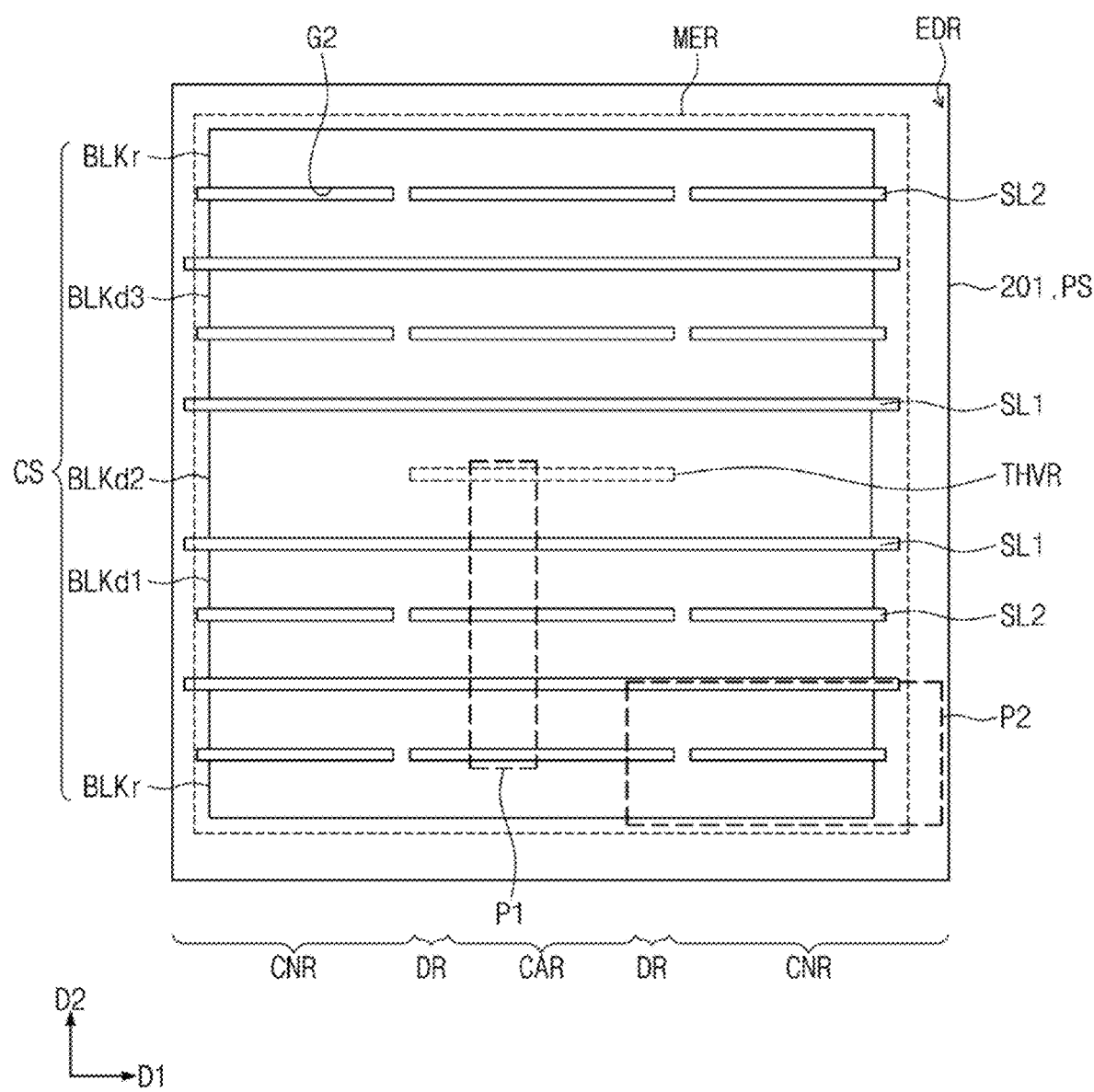
FIG. 2 is a plan view illustrating a three-dimensional semiconductor memory device according to some example embodiments of the inventive concepts.
Figure 3A:
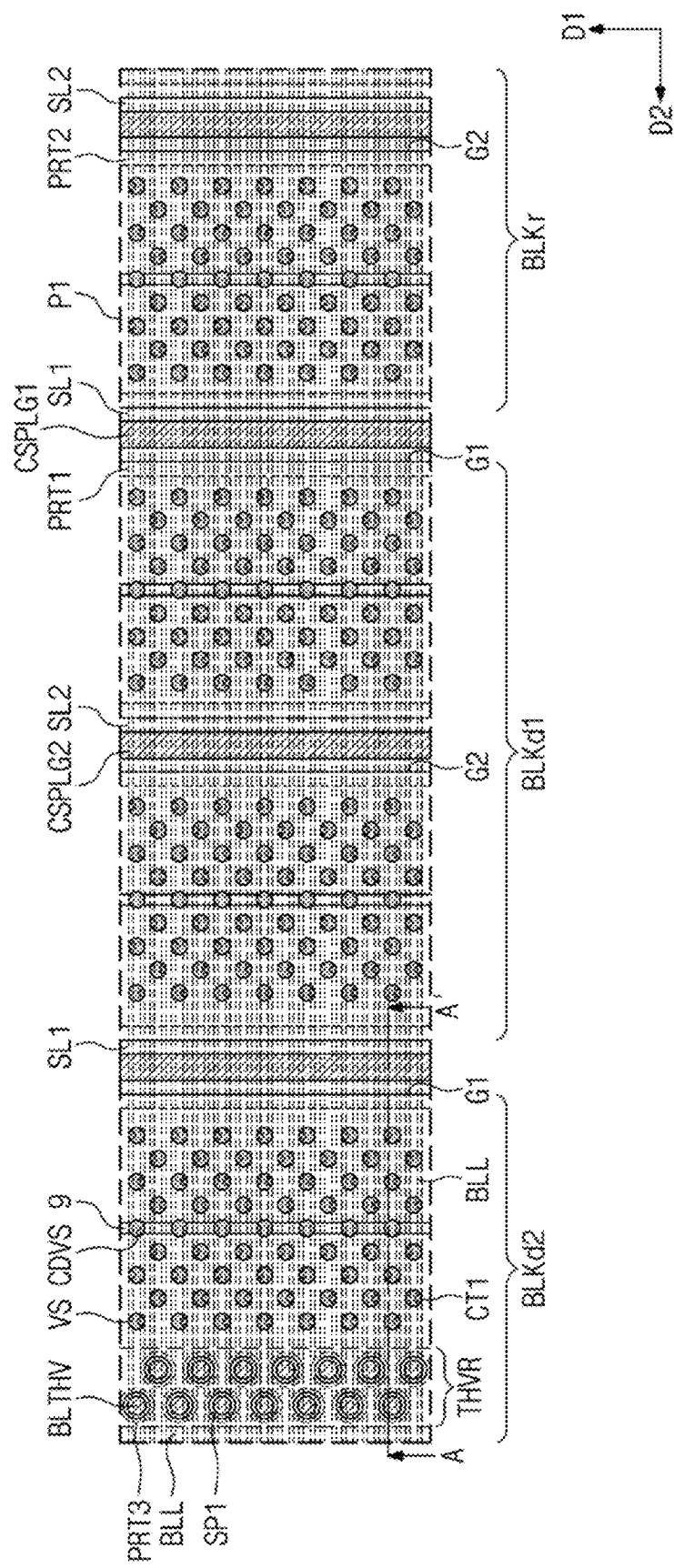
FIG. 3A is an enlarged plan view illustrating a detailed structure of a portion 'P1' of FIG. 2.
Figure 3B:
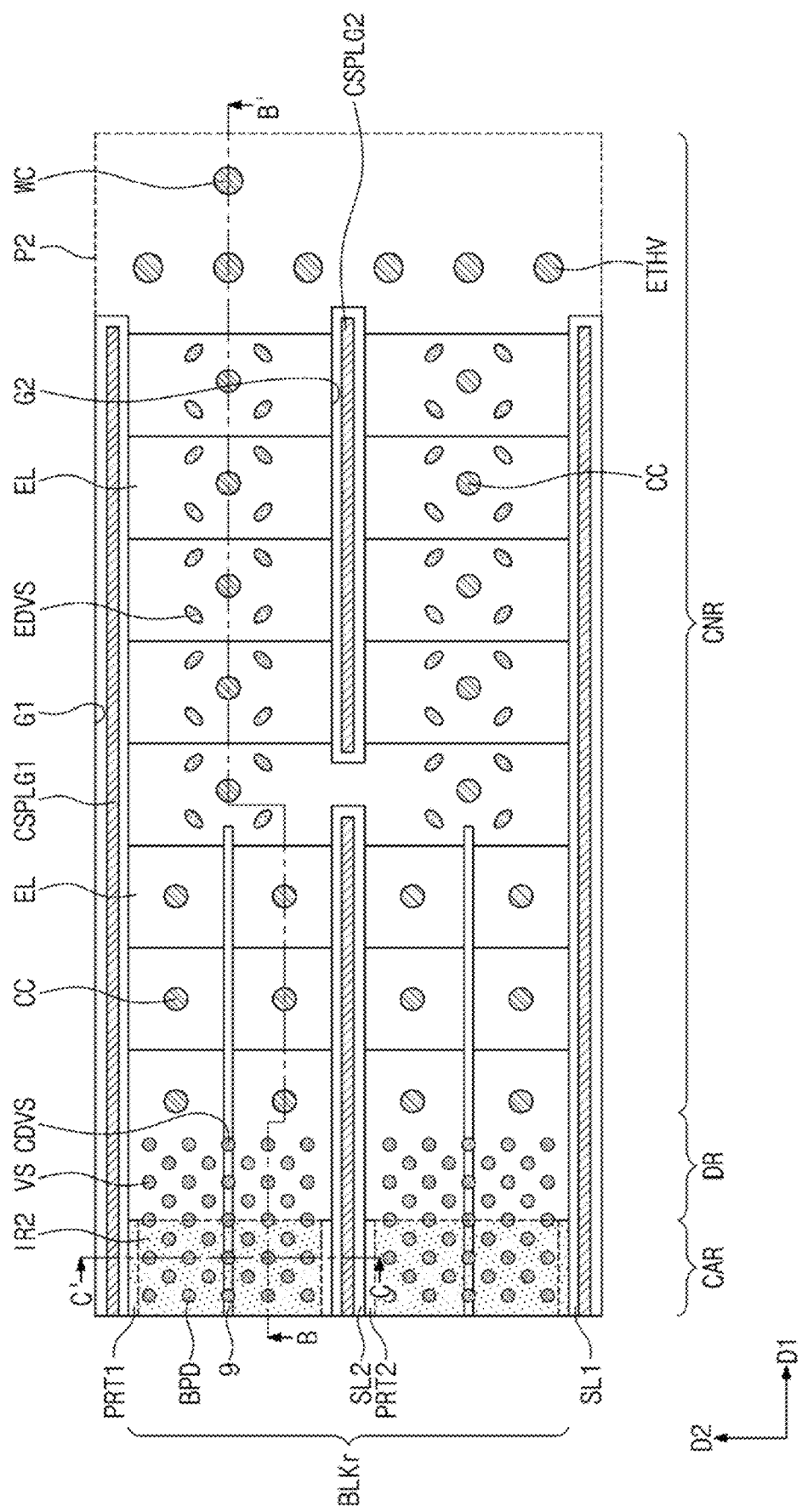
FIG. 3B is an enlarged plan view illustrating a detailed structure of a portion 'P2' of FIG. 2.

FIG. 2 is a plan view illustrating a three-dimensional semiconductor memory device according to some example embodiments of the inventive concepts. FIG. 3A is an enlarged plan view illustrating a detailed structure of a portion 'P1' of FIG. 2. FIG. 3B is an enlarged plan view illustrating a detailed structure of a portion 'P2' of FIG. 2.

Referring to FIGS. 2, 3A, and 3B, a cell array structure CS may be disposed on a peripheral circuit structure PS. When viewed in a plan view, the cell array structure CS may include a memory region MER and an edge region EDR enclosing the memory region MER. The cell array structure CS may include real blocks BLKr, which are provided in the memory region MER and are arranged in a second direction D2. The real blocks BLKr may be memory blocks, in which operations of storing, erasing, and reading data are actually performed. Each of dummy blocks BLKd1 to BLKd3 may be disposed between two adjacent ones of the real blocks BLKr located at specific positions. The dummy blocks BLKd1 to BLKd3 may include first to third dummy blocks BLKd1 to BLKd3 arranged in the second direction D2. The dummy blocks BLKd1 to BLKd3 may not be used as the memory blocks. In other words, the operations of storing, erasing, and reading data may not be performed in the dummy blocks BLKd1 to BLKd3.

Referring to FIG. 2, first separation insulation patterns SL1 may be respectively interposed between the blocks BLKr and BLKd1 to BLKd3. The first separation insulation pattern SL1 may be disposed in a first groove G1. The first separation insulation pattern SL1 may be a line-shaped pattern extending in a first direction D1. The first separation insulation patterns SL1 may have a single- or multi-layered structure including at least one of a silicon oxide layer, a silicon nitride layer, a silicon oxynitride layer, or a porous insulating layer. Each of the blocks BLKr and BLKd1 to BLKd3 may include a cell array region CAR and connection regions CNR, which are disposed at both sides of the cell array region CAR. Each of the blocks BLKr and BLKd1 to BLKd3 may include a dummy region DR interposed between the cell array region CAR and the connection region CNR. As shown, a cell array region CAR, a dummy region DR, and a connection region CNR may be disposed side by side in the first direction D1.

Each of the real blocks BLKr and the first and third dummy blocks BLKd1 and BLKd3 may have second grooves G2 in the cell array region CAR and the connection regions CNR. In each of the real blocks BLKr and the first and third dummy blocks BLKd1 and BLKd3, the second grooves G2 may be arranged in the first direction D1 and may be spaced apart from each other. A second separation insulation pattern SL2 may be disposed in the second groove G2. The second dummy block BLKd2 may not have the second groove G2. The second dummy block BLKd2 may further include a central through-via region THVR disposed in the cell array region CAR.

Figure 4A:
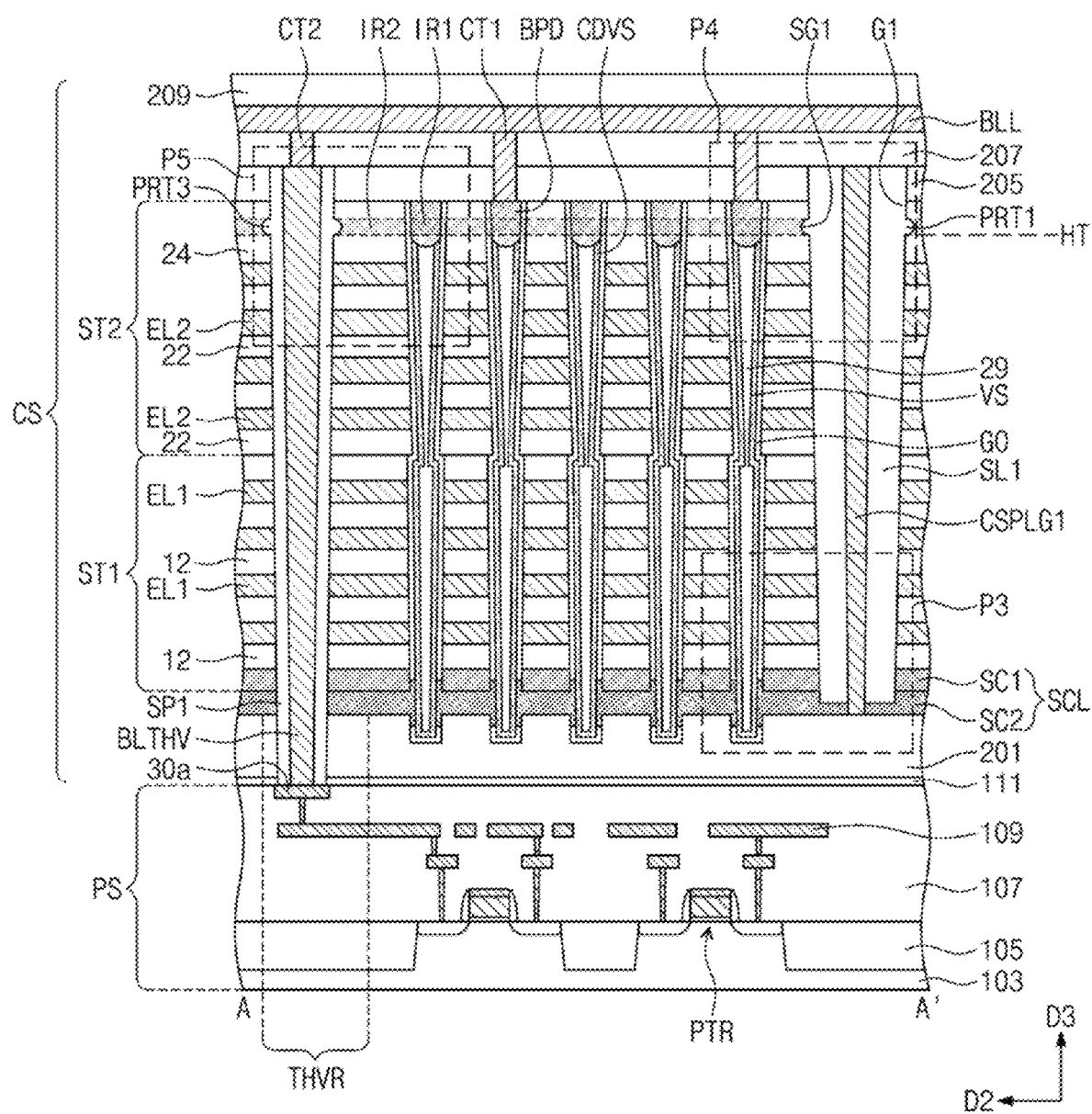
FIG. 4A is a sectional view taken along a line A-A' of FIG. 3A to illustrate a three-dimensional semiconductor memory device according to some example embodiments of the inventive concepts.
Figure 4B:
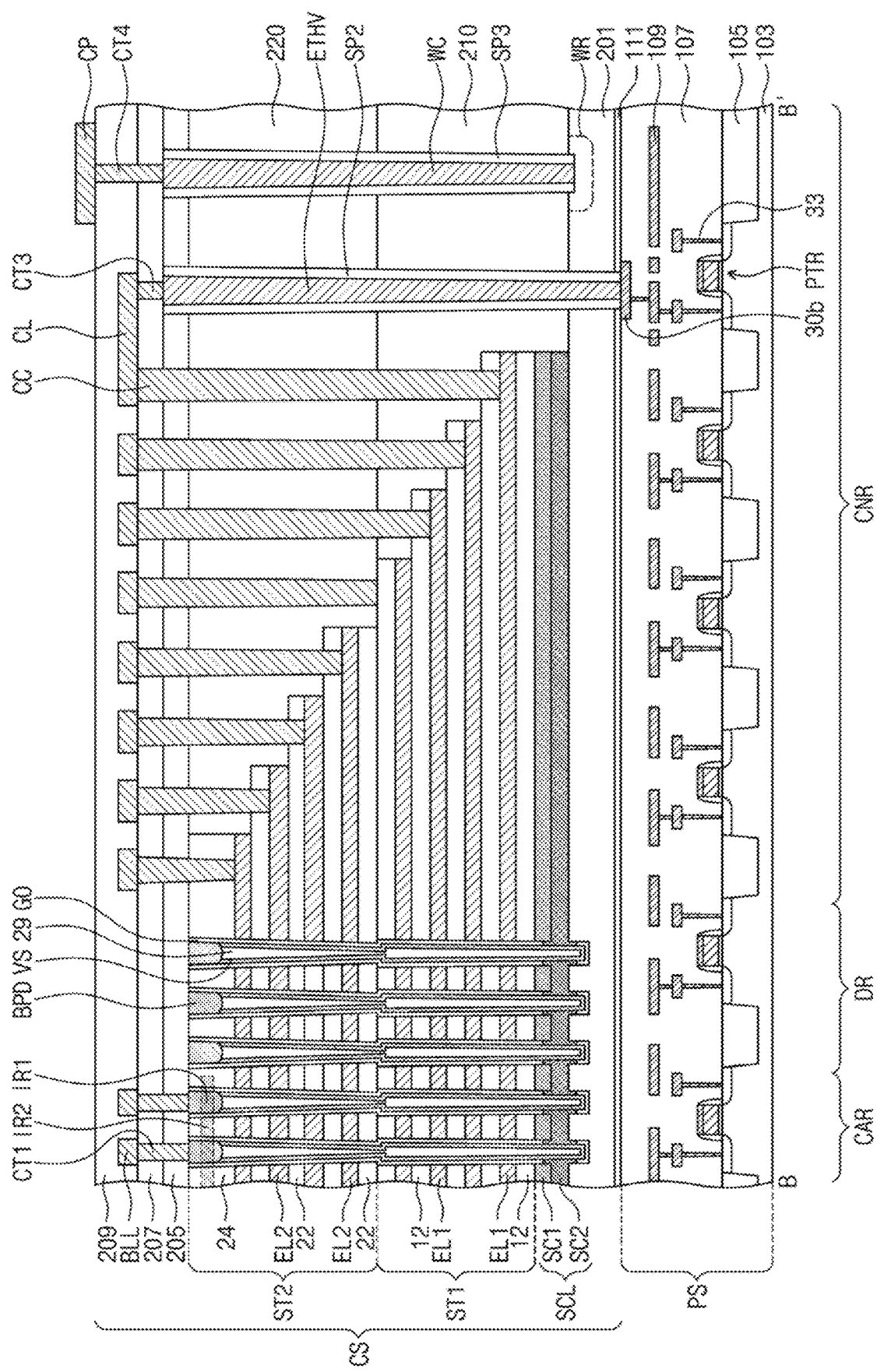
FIG. 4B is a sectional view taken along a line B-B' of FIG. 3B to illustrate a three-dimensional semiconductor memory device according to some example embodiments of the inventive concepts.
Figure 4C:
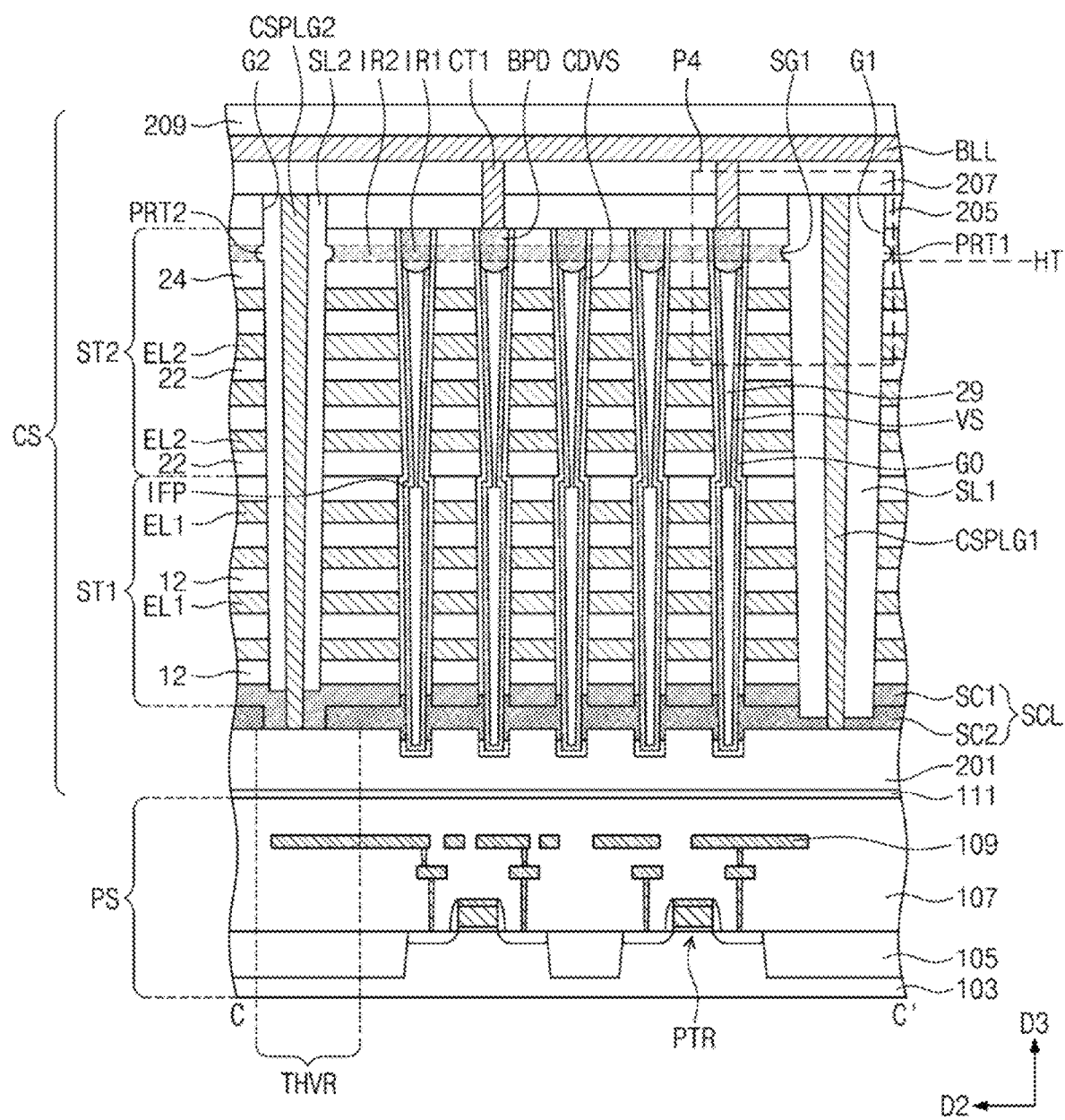
FIG. 4C is a sectional view taken along a line C-C' of FIG. 3B to illustrate a three-dimensional semiconductor memory device according to some example embodiments of the inventive concepts.

FIG. 4A is a sectional view taken along a line A-A' of FIG. 3A to illustrate a three-dimensional semiconductor memory device according to some example embodiments of the inventive concepts. FIG. 4B is a sectional view taken along a line B-B' of FIG. 3B to illustrate a three-dimensional semiconductor memory device according to some example embodiments of the inventive concepts. FIG. 4C is a sectional view taken along a line C-C' of FIG. 3B to illustrate a three-dimensional semiconductor memory device according to some example embodiments of the inventive concepts.

Referring to FIGS. 3A, 3B, and 4A to 4C, the peripheral circuit structure PS may include a first substrate 103. The first substrate 103 may be a single crystalline silicon substrate or a silicon-on-insulator (SOI) substrate. A device isolation layer 105 may be disposed in the first substrate 103 to delimit active regions. Peripheral transistors PTR may be disposed on the active regions. Each of the peripheral transistors PTR may include a peripheral gate electrode, a peripheral gate insulating layer, and peripheral source/drain regions, which are formed in the first substrate 103 and at both sides of the peripheral gate electrode. The peripheral transistors PTR may be covered with a peripheral interlayer insulating layer 107. The peripheral interlayer insulating layer 107 may include at least one of a silicon oxide layer, a silicon nitride layer, a silicon oxynitride layer, and a porous insulating layer and may have a single or multi-layered structure. Peripheral lines 109 and peripheral contacts 33 may be disposed in the peripheral interlayer insulating layer 107. The peripheral lines 109 and the peripheral contacts 33 may be formed of or include at least one of conductive materials.

Portions of the peripheral lines 109 and the peripheral contacts 33 may be electrically connected to the peripheral transistors PTR. The peripheral lines 109 and the peripheral transistors PTR may constitute the page buffer circuit 1120 and the decoder circuit 1110 of FIG. 1A. The peripheral circuit structure PS may include first and second peripheral conductive pads 30a and 30b, which are disposed at the topmost level thereof.

An etch stop layer 111 may be disposed on the peripheral circuit structure PS. The etch stop layer 111 may be formed of or include a material having an etch selectivity with respect to a second substrate 201 and the peripheral interlayer insulating layer 107. For example, the etch stop layer 111 may be formed of or include silicon nitride or silicon oxide. The etch stop layer 111 may be referred to as an adhesive layer.

The cell array structure CS may be disposed on the peripheral interlayer insulating layer 107. Each of the blocks BLKr and BLKd1 to BLKd3, which are included in the cell array structure CS, may include the second substrate 201, a source structure SCL, a first stack structure ST1, a second stack structure ST2, and first and second interlayer insulating layers 205 and 207, which are sequentially stacked. The first stack structure ST1 may include first electrode layers EL1 and first inter-electrode insulating layers 12, which are alternately stacked on the source structure SCL. The second stack structure ST2 may include second electrode layers EL2 and second inter-electrode insulating layers 22, which are alternately stacked, and an uppermost second inter-electrode insulating layer 24, which is provided at the uppermost level of the second stack structure ST2. The second substrate 201 may be, for example, a single crystalline silicon layer, a silicon epitaxial layer, or a SOI substrate. The second substrate 201 may be doped with impurities of a first conductivity type. In some example embodiments, the impurity may be boron, and the first conductivity type may be p-type. In some example embodiments, the impurity may be arsenic or phosphorus and the first conductivity type may be n-type.

The lowermost and next lowermost ones of the first electrode layers EL1 may correspond to the first and second gate lower lines LL1 and LL2 of FIG. 1A or may correspond to the gate electrodes of the lower transistors LT1 and LT2 (i.e., the lower erase control transistor LT1 and the ground selection transistor LT2).

In one of the blocks BLKr, BLKd1, and BLKd3, at least two topmost ones of the second electrode layers EL2 may be divided into a plurality of lines, which are used as the gate upper lines UL1 and UL2, by a central separation pattern 9 and the second groove G2. The lowermost and next lowermost ones of the second electrode layers EL2 may correspond to the gate electrodes of the upper transistors UT1 and UT2 (i.e., the upper erase control transistor UT2 and the string selection transistor UT1), respectively. The remaining ones of the electrode layers EL1 and EL2 may serve as the word lines WL of FIG. 1A. In some example embodiments, at least one of the remaining ones of the electrode layers EL1 and EL2 may correspond to a dummy word line, which is not used for an actual operation. In one of the blocks BLKr, BLKd1, and BLKd3, each of the remaining ones of the electrode layers EL1 and EL2 may be cut by the second grooves G2 but may include a connecting portion, which is placed between the second grooves G2 in the first direction D1 or is not cut by the second grooves G2. In each of the remaining ones of the electrode layers EL1 and EL2, the cut portions may be connected to each other through the connecting portion, and in this case, ones of the electrode layers EL1 and EL2, which are located at the same height, may be in an equipotential state.

The electrode layers EL1 and EL2 may be formed of or include at least one of, for example, doped semiconductor materials (e.g., doped silicon), metallic materials (e.g., tungsten, copper, or aluminum), conductive metal nitrides (e.g., titanium nitride or tantalum nitride), or transition metals (e.g., titanium or tantalum). The inter-electrode insulating layers 12, 22, and 24 may have a single- or multi-layered structure including at least one of a silicon oxide layer, a silicon nitride layer, a silicon oxynitride layer, or a porous insulating layer.

The source structure SCL may include a first source pattern SC1, which is interposed between the lowermost inter-electrode insulating layer 12 and the second substrate 201, and a second source pattern SC2, which is interposed between the first source pattern SC1 and the second substrate 201. As shown in FIG. 4C, a portion of the first source pattern SC1 adjacent to a second source contact line CSPLG2 may be provided to penetrate the second source pattern SC2 and to be in contact with the second substrate 201. The first source pattern SC1 may include a doped semiconductor pattern (e.g., a doped polysilicon pattern of the first conductivity type). The second source pattern SC2 may include a doped semiconductor pattern (e.g., a doped polysilicon pattern). The second source pattern SC2 may further include a semiconductor material that is different from the first source pattern SC1. The second source pattern SC2 may have the same conductivity type as the first source pattern SC1. A doping concentration of the second source pattern SC2 may be equal to or different from that of the first source pattern SC1. The source structure SCL may serve as the common source line CSL of FIG. 1A.

Figure 8A:
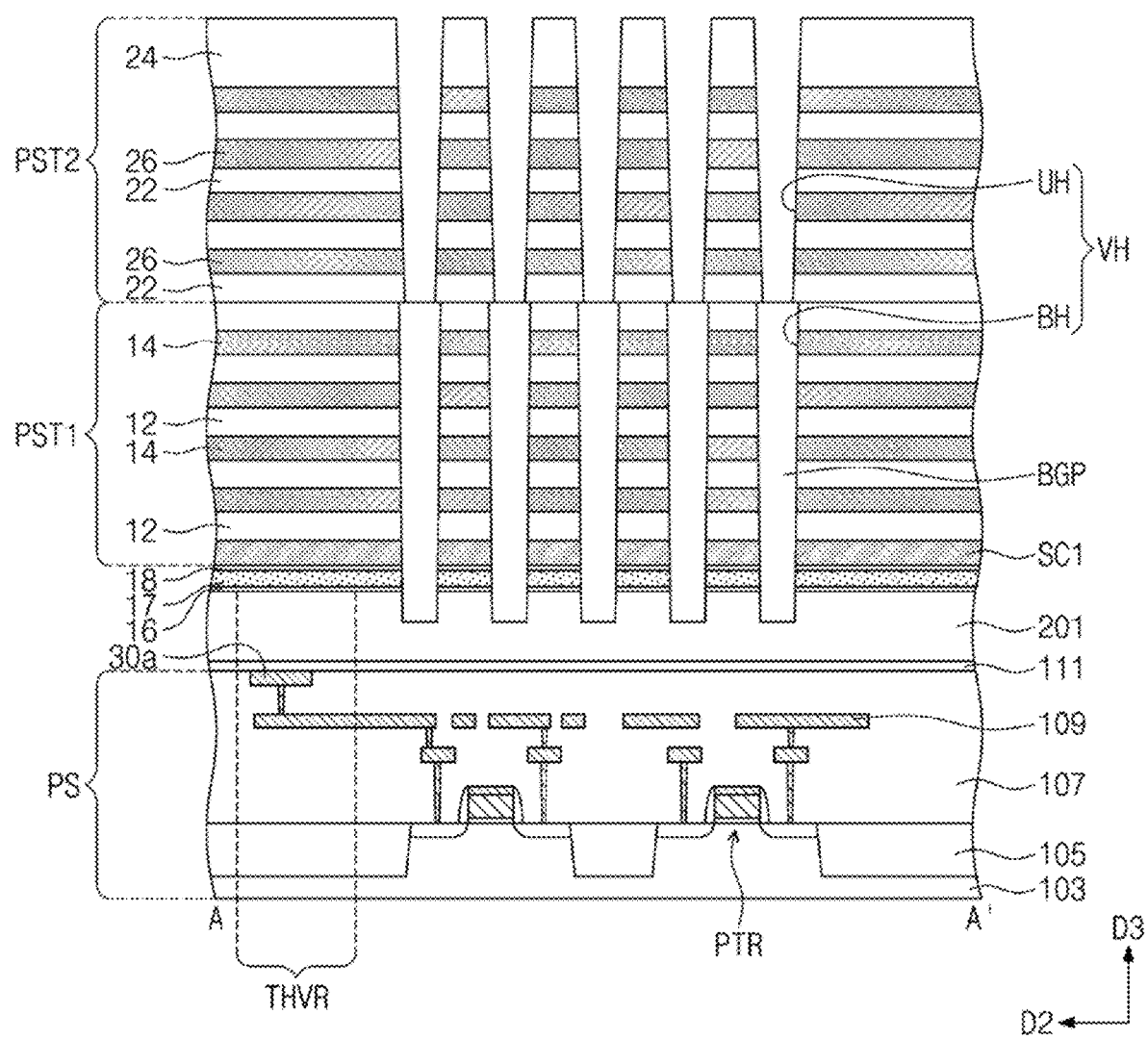
FIGS. 8A, 9A, 10A, 11A, 12A, 13A, 14A, 15A, and 16A are sectional views sequentially illustrating a process of fabricating a three-dimensional semiconductor memory device having the section of FIG. 4A.
Figure 9A:
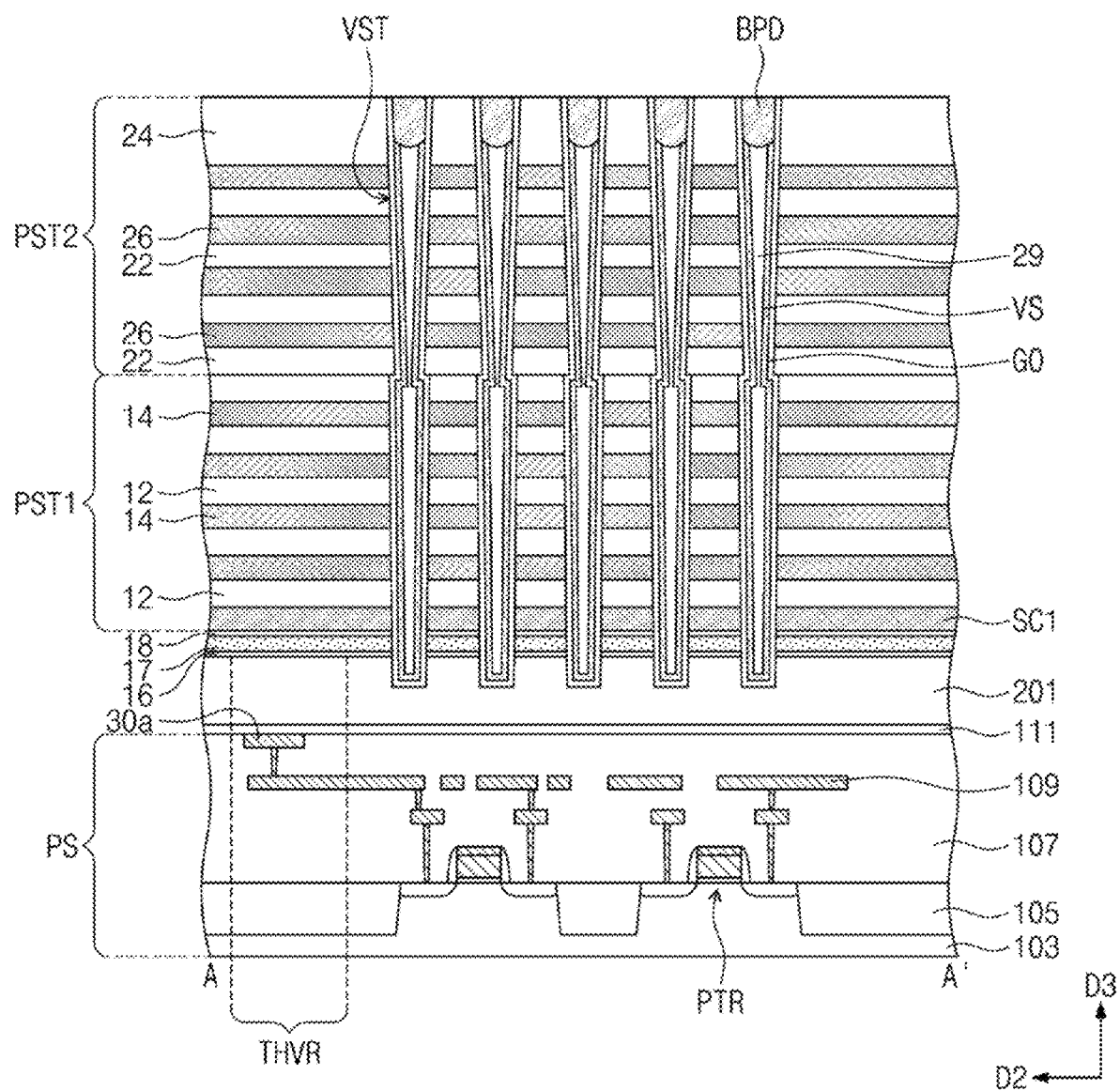
Figure 9B:
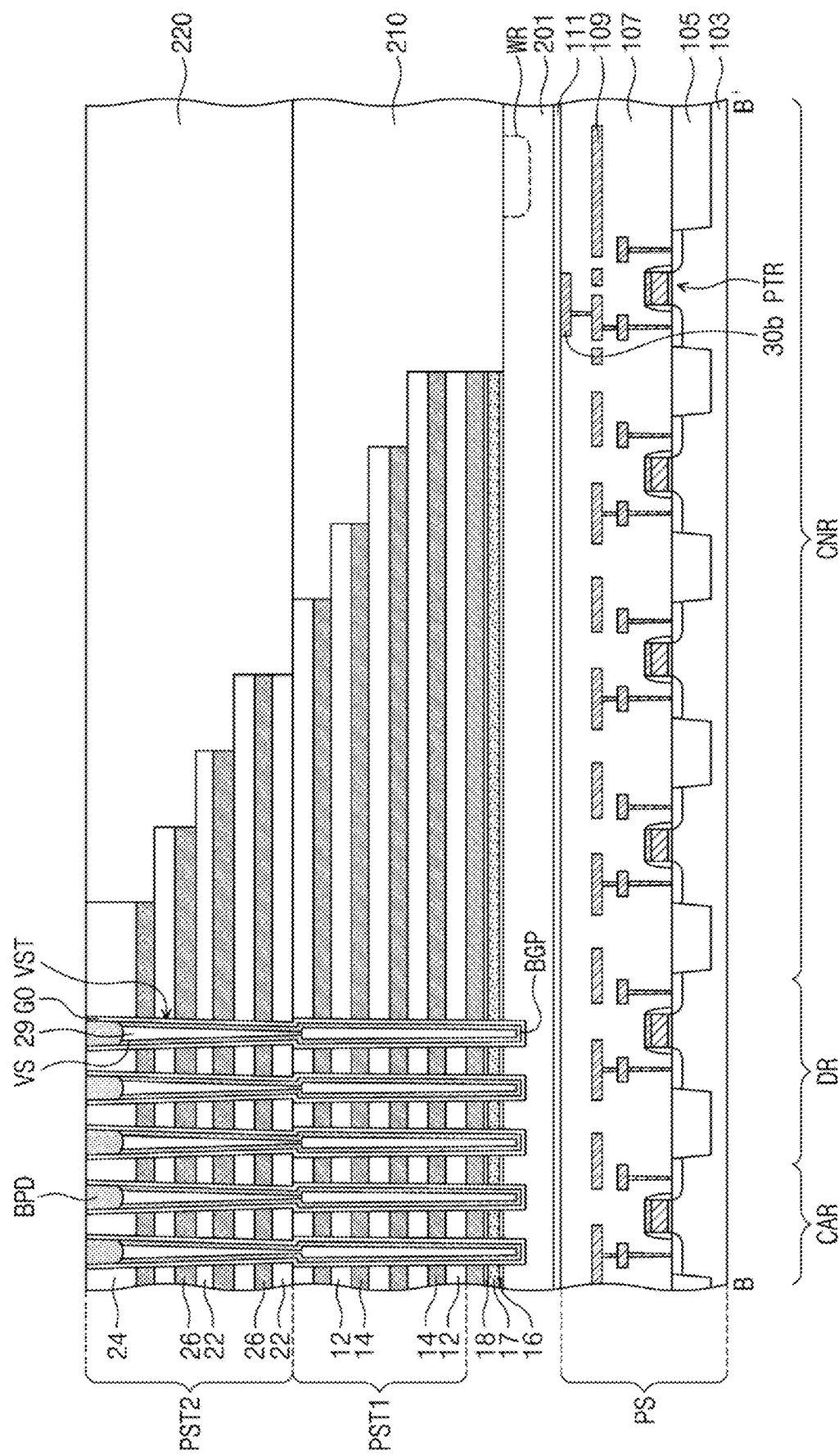

Referring to FIGS. 3A and 4A, cell vertical patterns VS and central dummy vertical patterns CDVS may be provided on the cell array region CAR and the dummy region DR in each of the blocks BLKr and BLKd1 to BLKd3 to penetrate the inter-electrode insulating layers 12, 22, and 24 and the electrode layers EL1 and EL2 and may penetrate the source structure SCL and may be adjacent to the second substrate 201. The first and second stack structures ST1 and ST2 may define a vertical hole (VH as shown in at least FIG. 8A) in which a vertical structure(s) VST (e.g., as shown in FIGS. 9A-9B) are located. As shown, the vertical structure(s) may penetrate the first and second stack structures ST1 and ST2 and the source structure SCL and may be adjacent to the second substrate 201. The central dummy vertical patterns CDVS may be arranged to form a single column parallel to the first direction D1. The central separation pattern 9 may be disposed between upper portions of the central dummy vertical patterns CDVS. A gate insulating layer GO may be interposed between the electrode layers EL1 and EL2 and the cell vertical patterns VS and between the electrode layers EL1 and EL2 and the central dummy vertical patterns CDVS. In some example embodiments, each of the cell vertical patterns VS and the central dummy vertical patterns CDVS may have a hollow cup shape. The cell vertical patterns VS and the central dummy vertical patterns CDVS may be formed of or include undoped single-crystalline silicon or poly-crystalline silicon. A sidewall of each of the cell vertical patterns VS and the central dummy vertical patterns CDVS may have an inflection point IFP, which is located near an interface between the first and second stack structures ST1 and ST2, as shown in FIG. 4C.

An internal space of each of the cell vertical patterns VS and the central dummy vertical patterns CDVS may be filled with an insulating gapfill pattern 29. The insulating gapfill pattern 29 may have a single or multi-layered structure including at least one of, for example, a silicon oxide layer, a silicon nitride layer, or a silicon oxynitride layer. A bit line pad BPD may be disposed on each of the cell vertical patterns VS and the central dummy vertical patterns CDVS.

The bit line pad BPD may be doped with first impurities, and the second impurity injection region IR2 may be doped with the first impurities. The bit line pad BPD may be formed of or include at least one of doped polysilicon or metallic materials (e.g., tungsten, aluminum, and copper). The second source pattern SC2 may be provided to penetrate the gate insulating layer GO and to be in contact with a lower side surface of each of the cell vertical patterns VS and the central dummy vertical patterns CDVS. As shown, the vertical structure VST (e.g., as shown in FIGS. 9A-9B) may include a cell vertical pattern VS conformally formed along an inner sidewall of the vertical hole VH (as shown in FIG. 8A), a gate insulating layer GO interposed between the cell vertical pattern VS and the inner sidewall of the vertical hole VH, and a bit line pad BPD on the cell vertical pattern VS.

Figure 5:
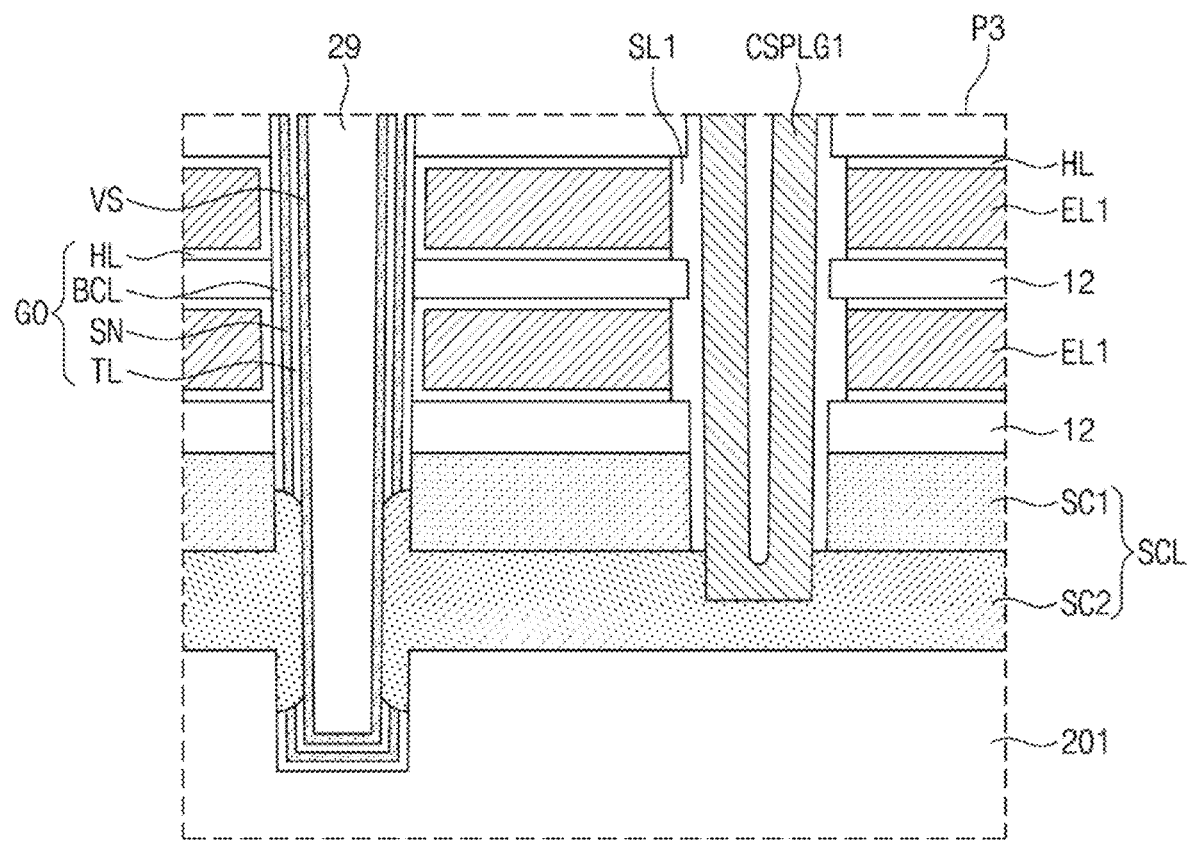
FIG. 5 is an enlarged sectional view illustrating a portion 'P3' of FIG. 4A.

FIG. 5 is an enlarged sectional view illustrating a portion 'P3' of FIG. 4A.

Referring to FIGS. 4A and 5, the gate insulating layer GO may include a tunnel insulating layer TL, a charge storing layer SN, and a blocking insulating layer BCL. The charge storing layer SN may be a trap insulating layer, a floating gate electrode, or an insulating layer including conductive nanodots. In detail, the charge storing layer SN may include at least one of a silicon nitride layer, a silicon oxynitride layer, a silicon-rich nitride layer, a nanocrystalline silicon layer, or a laminated trap layer. The tunnel insulating layer TL may be formed of or include one of materials having a band gap larger than the charge storing layer SN, and the blocking insulating layer BCL may be a high-k dielectric layer (e.g., an aluminum oxide layer and a hafnium oxide layer). The gate insulating layer GO may further include a high-k dielectric layer HL. The high-k dielectric layer HL may be interposed between the blocking insulating layer BCL and the electrode layers EL1 and EL2. The high-k dielectric layer HL may be interposed between the electrode layers EL1 and EL2 and the inter-electrode insulating layers 12, 22, and 24. The high-k dielectric layer HL may have a dielectric constant higher than the silicon oxide layer and may include a metal oxide layer (e.g., a hafnium oxide layer and an aluminum oxide layer). The second source pattern SC2 may be provided to penetrate the gate insulating layer GO and to be in contact with the cell vertical patterns VS. A lower portion of the gate insulating layer GO may be separated from an upper portion of the gate insulating layer GO by the second source pattern SC2. The first separation insulation pattern SL1 may include portions that protrude in the second direction D2 or toward the electrode layers EL1 and EL2 and are interposed between adjacent ones of the inter-electrode insulating layers 12, 22, and 24. A sidewall of the first separation insulation pattern SL1 may have an uneven structure. In some example embodiments, each of second and third separation insulation patterns SL2 and SL3 may also have the same or similar sidewall structure as the first separation insulation pattern SL1. The first and second separation insulation patterns SL1 and SL2 may each penetrate the first and second stack structures ST1 and ST2 and may each be spaced apart from (e.g., isolated from direct contact with) a vertical structure (e.g., the cell vertical patterns VS and/or the central dummy vertical patterns CDVS).

In some example embodiments, the tunnel insulating layer TL may be in contact with the cell vertical pattern VS, the blocking insulating layer BCL may be in contact with the inner sidewall of the vertical hole VH, and the charge storing layer SN may be between the tunnel insulating layer TL and the blocking insulating layer BCL.

Referring to FIGS. 4A and 4C, each of the first and second separation insulation patterns SL1 and SL2 may be provided to penetrate the first interlayer insulating layer 205 and the stack structures ST1 and ST2. A first source contact line CSPLG1 and a second source contact line CSPLG2 may be disposed in the first separation insulation patterns SL1 and the second separation insulation patterns SL2, respectively. The first and second source contact lines CSPLG1 and CSPLG2 may be formed of or include at least one of conductive materials. The first source contact line CSPLG1 may be in contact with the second source pattern SC2 of the source structure SCL. The second source contact line CSPLG2 may be in contact with the first source pattern SC1 of the source structure SCL. Each of the first and second source contact lines CSPLG1 and CSPLG2 may be a line-shaped pattern that is extended along the first and second separation insulation patterns SL1 and SL2 or in the first direction D1 when viewed in a plan view. In some example embodiments, although not shown, the first and second source contact lines CSPLG1 and CSPLG2 may not be the line-shaped pattern and may be composed of a plurality of patterns, which are spaced apart from each other and are shaped like a contact plug.

Figure 6A:
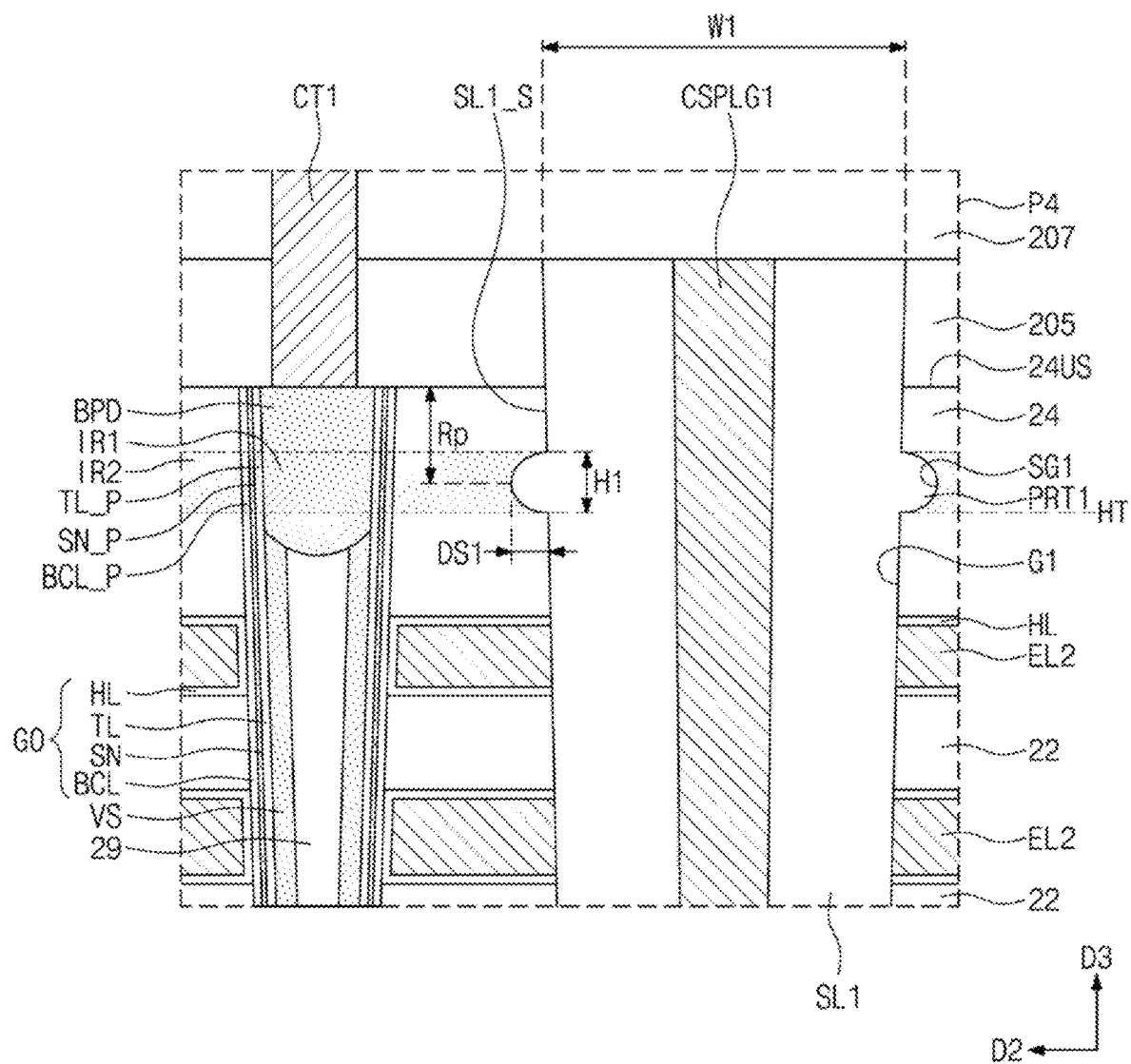
FIGS. 6A, 6B, and 6C are enlarged sectional views illustrating some examples of a portion 'P4' of FIG. 4A.
Figure 6B:
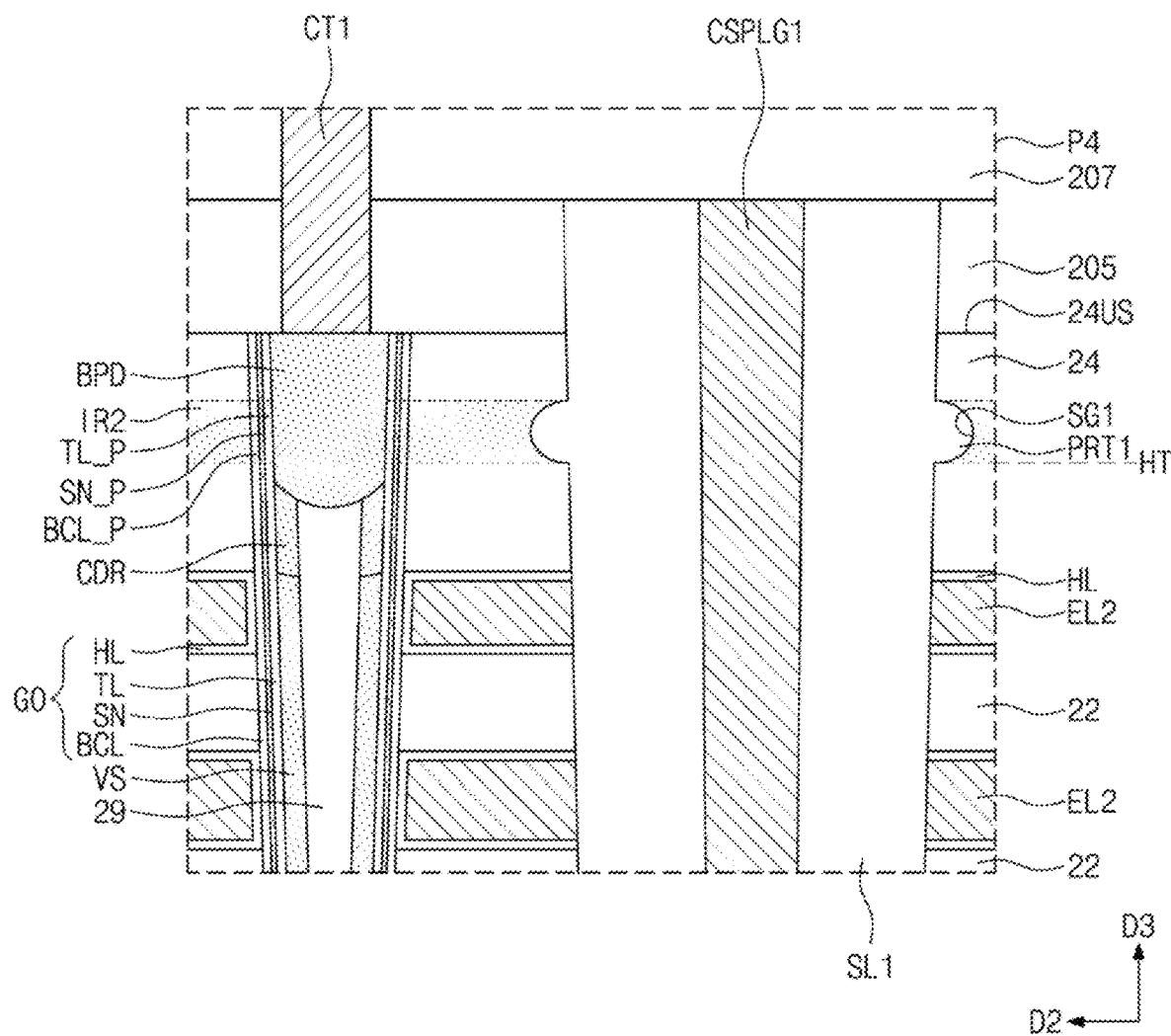
Figure 6C:
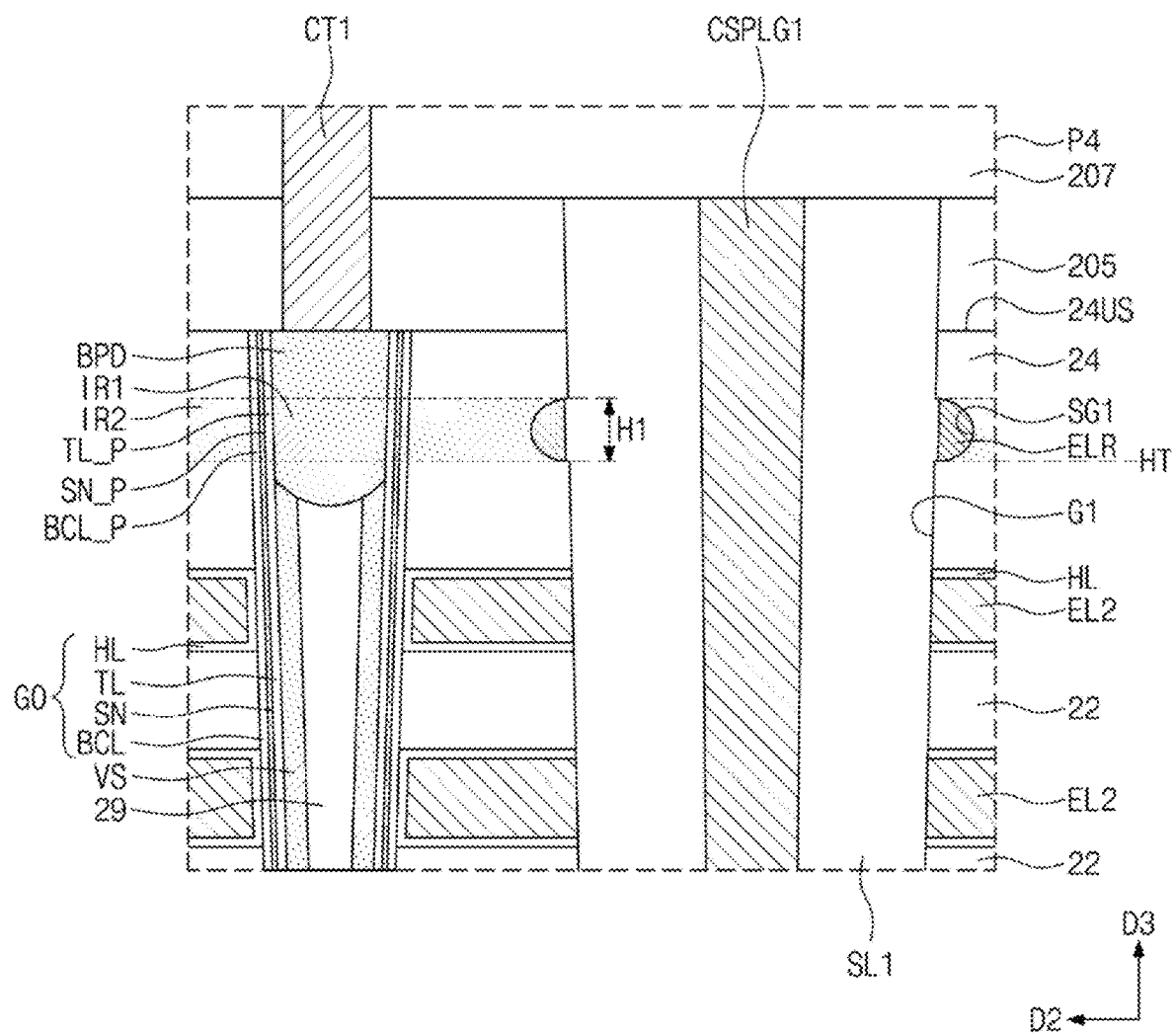

FIGS. 6A, 6B, and 6C are enlarged sectional views illustrating some examples of a portion 'P4' of FIG. 4A.

Referring to FIGS. 4A and 6A, a first impurity injection region IR1 may be disposed in the bit line pad BPD. The first and second stack structures ST1 and ST2 may be on the cell array region CAR, the dummy region DR, and the connection region CNR. A second impurity injection region IR2 may be disposed in the uppermost second inter-electrode insulating layer 24. Due to the second impurity injection region IR2, the uppermost second inter-electrode insulating layer 24 may exhibit an electrically insulating property, not a conductive property. The second impurity injection region IR2 may be disposed on only the cell array region CAR, not on the dummy region DR and the connection region CNR. Each of the first and second impurity injection regions IR1 and IR2 may be located at a first height or level HT from atop surface of the second substrate 201. The first and second impurity injection regions IR1 and IR2 may be doped with the same impurity ions and may have the same doping concentration. For example, the impurity ions may be phosphorus ions. In some example embodiments, the first and second impurity injection regions IR1 and IR2 may be doped with phosphorus atoms to have the doping concentration ranging from $1 \times 10^{20}$ ions/cm$^3$ to $1 \times 10^{22}$ ions/cm$^3$, in particular, from $9 \times 10^{20}$ ions/cm$^3$ to $2 \times 10^{21}$ ions/cm$^3$. A projection range (Rp) of the impurity ions from a top surface 24US of the uppermost second inter-electrode insulating layer 24 may range from 20 nm to 40 nm. A portion TL_P of the tunnel insulating layer TL, a portion SNP of the charge storing layer SN, and a portion BCL_P of the blocking insulating layer BCL, which are located at the first height HT, may be doped with the impurity ions (e.g., the same first impurities with which at least the second impurity region IRL2 are doped).

As shown, at least the first and/or second stack structures ST1 and/or ST2 may define the first groove G1, and the first separation insulation pattern SL1 may be located (e.g., inserted) in the first groove G1. An upper portion of the first groove G1 may have a first width W1. An inner sidewall of the first groove G1 (e.g., an upper sidewall of the first groove G1) may have (e.g., may define) a first recess region SG1, which is recessed toward the second stack structure ST2 at the first height HT from the top surface of the second substrate 201 and is recessed towards the vertical structure (e.g., the cell vertical patterns VS and/or the central dummy vertical patterns CDVS). The first recess region SG1 may have a first vertical width H1. In some example embodiments, the first vertical width H1 may range from 10 nm to 50 nm. The first vertical width H1 may be equal to or smaller than a vertical width of the second impurity injection region IR2. The first recess region SG1 may have a first depth DS1, when measured from a side surface SL1_S of the first separation insulation pattern SL1 in the second direction D2 (e.g., when measured from the inner sidewall of the first groove G1 toward a vertical structure VST (e.g., including the cell vertical pattern VS). The first recess region SG1 may have a height Rp from the top surface 24US of the uppermost second inter-electrode insulating layer 24. The first separation insulation pattern SL1 may have a first insulating protruding portion PRT1 inserted in (e.g., located in, occupying, filling, etc.) the first recess region SG1. The first insulating protruding portion PRT1 may be located at the first height HT and may have the first vertical width H1. In addition, a distance from the side surface SL1_S of the first separation insulation pattern SL1 to an end portion of the first insulating protruding portion PRT1 may be a first distance DS1 that is equal to the first depth DS1. The first distance DS1 may be referred to as a 'width' of the first insulating protruding portion PRT1.

Referring to FIG. 4C, the second separation insulation pattern SL2 may have a second insulating protruding portion PRT2, which is located at the first height HT. The second insulating protruding portion PRT2 may have substantially the same shape as the first insulating protruding portion PRT1.

In the plan views of FIGS. 3A and 3B, each of the first and second insulating protruding portions PRT1 and PRT2 may be provided in the form of line-shaped patterns, which are formed at both sides of a corresponding one of the first and second separation insulation patterns SL1 and SL2 in the cell array region CAR.

Alternatively, the first impurity injection region IR1 of FIG. 6A may have no observable border in the bit line pad BPD, as shown in FIG. 6B. In this case, the impurity ions injected in the first impurity injection region IR1 of FIG. 6A may be uniformly diffused into the bit line pad BPD. The bit line pad BPD may be an overall uniform doping concentration. For example, the impurity may be phosphorus, and the doping concentration may range from $1 \times 10^{20}$ ions/cm³ to $1 \times 10^{22}$ ions/cm³, and in particular, from $9 \times 10^{20}$ ions/cm³ to $2 \times 10^{21}$ ions/cm³. Some of the impurity ions may be diffused into the cell vertical patterns VS to form a common drain region CDR. Since the bit line pad BPD is highly doped with the impurity ions, the uppermost one of the second electrode layers EL2 serving as the gate electrode of the upper erase control transistor UT2 may be effectively used for the erase operation using a gate induced drain leakage (e.g., GIDL) phenomenon. This may make it possible to improve reliability of the three-dimensional semiconductor memory device.

Alternatively, a remaining electrode pattern ELR may be disposed (e.g., located) in the first recess region SG1, as shown in FIG. 6C. The remaining electrode pattern ELR may be in contact (e.g., direct contact) with the first separation insulation pattern SL1. The remaining electrode pattern ELR may be formed of or include the same material as the electrode layers EL1 and EL2. The remaining electrode pattern ELR may be located at the first height HT and may have the first vertical width H1. The remaining electrode pattern ELR may be a line-shaped pattern extending in the first direction D1, when viewed in a plan view. The remaining electrode pattern ELR may be disposed at the position of each of the first and second insulating protruding portions PRT1 and PRT2 in FIG. 3A.

Referring to FIGS. 3A and 4A, bit line through vias BLTHV may be disposed in the central through-via region THVR of the second dummy block BLKd2. The bit line through vias BLTHV may be provided to penetrate the first interlayer insulating layer 205, the stack structures ST1 and ST2, the source structure SCL, the second substrate 201, and the etch stop layer 111 and to be in contact with the first peripheral conductive pads 30a, respectively. A first via insulating pattern SP1 may be interposed between the bit line through via BLTHV and the stack structures ST1 and ST2, between the bit line through via BLTHV and the source structure SCL, and between the bit line through via BLTHV and the etch stop layer 111. The bit line through vias BLTHV may be provided to form a zigzag arrangement in the first direction D1. As shown, the bit line through vias BLTHV may be spaced apart from the vertical structures VST (as shown in FIGS. 9A-9B) and the first separation insulating pattern SL1.

Figure 7:
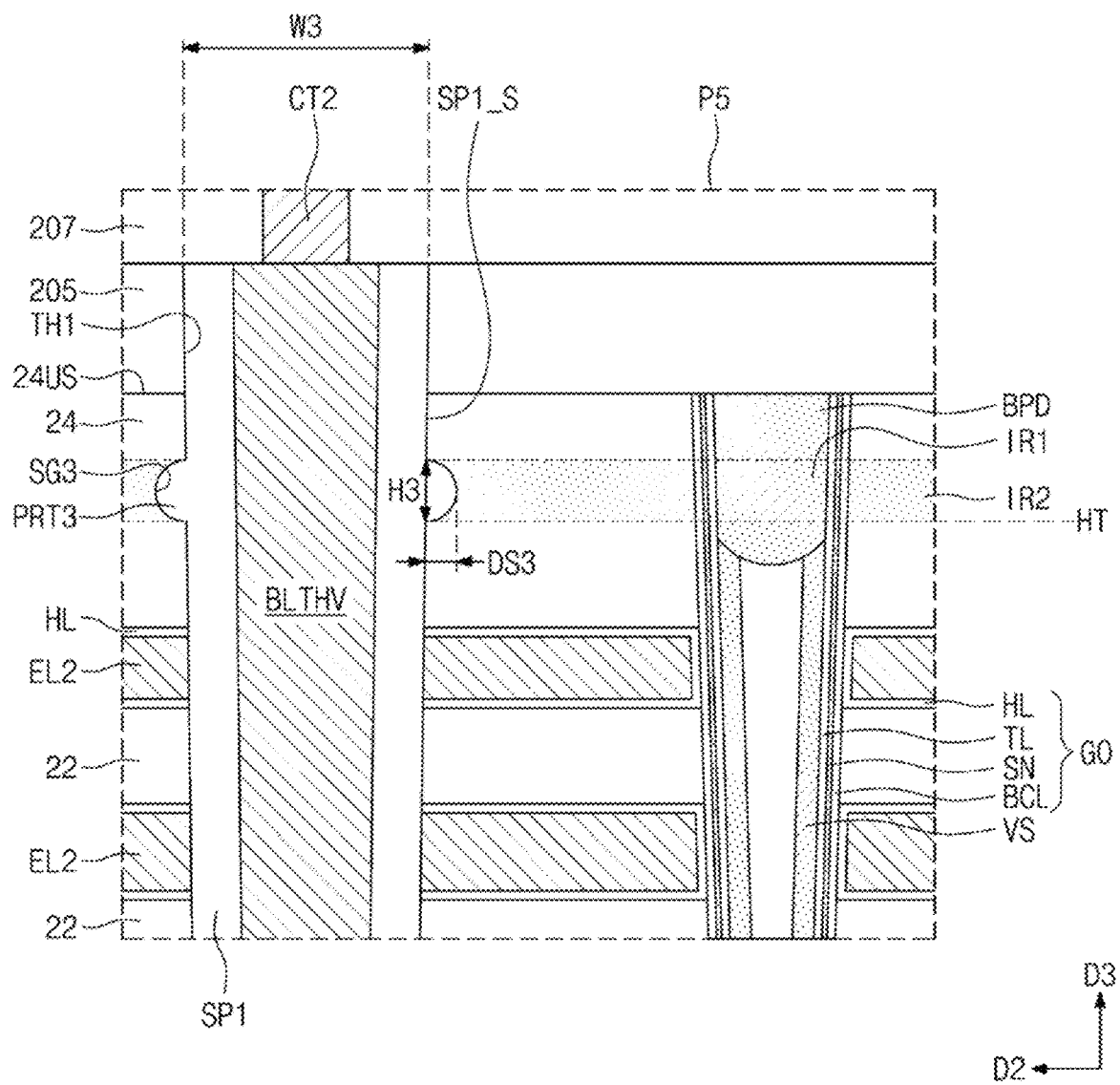
FIG. 7 is an enlarged sectional view illustrating a portion 'P5' of FIG. 4A.

FIG. 7 is an enlarged sectional view illustrating a portion 'P5' of FIG. 4A.

Referring to FIG. 7, the bit line through via BLTHV may be disposed in a first via hole TH1. An upper portion of the first via hole TH1 may have a third width W3. An inner sidewall of the first via hole TH1 may have a third recess region SG3, which is recessed toward the second stack structure ST2 at the first height HT. The third recess region SG3 may have a third vertical width H3. The third vertical width H3 may be equal to the first vertical width H1. The third recess region SG3 may have a third depth DS3, when measured from a side surface SP1_S of the first via insulating pattern SP1 in the second direction D2. The first via insulating pattern SP1 may have a third insulating protruding portion PRT3 inserted in the third recess region SG3. The third insulating protruding portion PRT3 may be located at the first height HT from the top surface of the second substrate 201 and may protrude toward the second stack structure ST2 and may have the third vertical width H3. In addition, a distance from the side surface SP1_S of the first via insulating pattern SP1 to an end portion of the third insulating protruding portion PRT3 may be a third distance DS3 that is equal to the third depth DS3. The third distance DS3 may be referred to as a 'width' of the third insulating protruding portion PRT3. The third width W3 of the first via hole TH1 may be smaller than the first width W1 of the first groove G1, and the first depth DS1 of the first recess region SG1 in the second direction D2 may be equal to or larger than the third depth DS3 of the third recess region SG3 in the second direction D2. In FIG. 3A, the third insulating protruding portion PRT3 may have a ring shape enclosing the bit line through via BLTHV, when viewed in a plan view.

Referring to FIGS. 3A and 4A, the second interlayer insulating layer 207 may be disposed on the first interlayer insulating layer 205. First conductive lines BLL, which extend in the second direction D2 and are parallel to each other, may be disposed on the second interlayer insulating layer 207. The first conductive lines BLL may correspond to the bit lines BL of FIG. 1A. On the cell array region CAR, first contacts CT1 may be provided to penetrate the first and second interlayer insulating layers 205 and 207 and to connect the bit line pads BPD, which are disposed on the cell vertical patterns VS, to one of the first conductive lines BLL. The first contacts CT1, which are connected to the one of the first conductive lines BLL, may be disposed on odd- or even-numbered ones of the cell vertical patterns VS overlapping the one of the first conductive lines BLL. The bit line pads BPD disposed on the dummy region DR may not be connected to the first contacts CT1. The cell vertical patterns VS, which are disposed on the dummy region DR, may not be used for an actual memory operation and may be used to prevent a failure caused by a loading effect during a fabrication process.

The first contacts CT1 may not be disposed on the bit line pad BPD, which is provided on the central dummy vertical pattern CDVS. A second contact CT2 may be provided to penetrate the second interlayer insulating layer 207 and to connect the bit line through via BLTHV to one of the first conductive lines BLL. Accordingly, the cell vertical patterns VS may be connected to the first conductive lines BLL. The first conductive lines BLL may be electrically connected to the page buffer circuit 1120 (e.g., see FIG. 1A) of the peripheral circuit structure PS through the bit line through vias BLTHV.

Referring to FIGS. 3B and 4B, the stack structures ST1 and ST2, which are included in each of the blocks BLKr and BLKd1 to BLKd3, may have a staircase structure in the connection region CNR. In other words, the electrode layers (EL) EL1 and EL2 and the inter-electrode insulating layers 12, 22, and 24 may have (e.g., may form, may define, etc.) the staircase structure in/on the connection region CNR. The lengths, in the first direction D1, of the electrode layers EL1 and EL2 and the inter-electrode insulating layers 12, 22, and 24 may increase and protrude with decreasing distance to the peripheral circuit structure PS. In the connection region CNR, end portions of the first stack structures ST1 may be covered with a first planarization insulating layer 210. In the connection region CNR, end portions of the second stack structures ST2 may be covered with a second planarization insulating layer 220. The planarization insulating layers 210 and 220 may include a silicon oxide layer or a porous insulating layer. The first interlayer insulating layer 205 and the second interlayer insulating layer 207 may be sequentially stacked on the planarization insulating layers 210 and 220. End portions of the electrode layers EL1 and EL2 may be connected to cell contact plugs CC, respectively. The cell contact plugs CC may be provided to penetrate the second interlayer insulating layer 207, the first interlayer insulating layer 205, and the inter-electrode insulating layers 12, 22, and 24 and to be in contact with the electrode layers EL1 and EL2. Each of the cell contact plugs CC may have a sidewall that is straightly extended in a vertical direction without a protruding portion.

Referring to FIG. 4B, edge dummy vertical patterns EDVS may be provided to penetrate the planarization insulating layers 210 and 220 and the end portions of the electrode layers EL1 and EL2 and the inter-electrode insulating layers 12, 22, and 24 constituting the staircase structure. The edge dummy vertical patterns EDVS may have an elliptical shape that is elongated in a specific direction when viewed in a plan view. The edge dummy vertical patterns EDVS may have the same or similar sections as the cell vertical pattern VS or the central dummy vertical pattern CDVS of FIG. 4A. Internal spaces of the edge dummy vertical patterns EDVS may be filled with the insulating gapfill pattern 29. The gate insulating layer GO may be interposed between the edge dummy vertical patterns EDVS and the electrode layers EL1 and EL2.

Referring to FIG. 4B, an electrode connection line CL may be disposed on the second interlayer insulating layer 207. Edge through vias ETHV may be provided on the connection region CNR to penetrate the first interlayer insulating layer 205, the planarization insulating layers 210 and 220, the second substrate 201, and the etch stop layer 111 and to be in contact with the second peripheral conductive pads 30b, respectively. In some example embodiments, the edge through vias ETHV may be spaced apart from the stack structures ST1 and ST2. The edge through vias ETHV may be connected to the electrode connection line CL, respectively, through third contacts CT3 disposed in the second interlayer insulating layer 207. Accordingly, the electrode layers EL1 and EL2 may be connected to the peripheral circuit structure PS (e.g., the decoder circuit 1110 of FIG. 1A). A second via insulating pattern SP2 may be interposed between the edge through via ETHV and the planarization insulating layers 210 and 220 and between the edge through via ETHV and the etch stop layer 111.

Each of the edge through vias ETHV and the bit line through vias BLTHV may be formed of or include at least one of metallic materials (e.g., tungsten, aluminum, copper, titanium, and tantalum). The via insulating patterns SP1 and SP2 may be formed of or include at least one of insulating materials (e.g., silicon oxide, silicon nitride, and silicon oxynitride).

Referring to FIGS. 3B and 4B, a substrate ground region WR may be disposed in a portion of the second substrate 201 spaced apart from the edge through vias ETHV. The substrate ground region WR may be doped to have the same conductivity type as the second substrate 201 (i.e., the first conductivity type) and to have a higher doping concentration than that in the second substrate 201. A substrate contact plug WC may be provided on the connection region CNR to penetrate the first interlayer insulating layer 205 and the planarization insulating layers 210 and 220 and to be in contact with the substrate ground region WR. The electrode connection lines CL may be covered with a third interlayer insulating layer 209. An outer terminal CP may be disposed on the third interlayer insulating layer 209. A fourth contact CT4 may be provided to penetrate the third interlayer insulating layer 209 and the second interlayer insulating layer 207 and to connect the outer terminal CP to the substrate contact plug WC. A side surface of the substrate contact plug WC may be covered with a contact insulating pattern SP3. In some example embodiments, unlike the first via insulating pattern SP1 of FIG. 4A, the second via insulating pattern SP2 and the contact insulating pattern SP3 may have a substantially vertical sidewall, without the insulating protruding portion PRT3.

FIGS. 8A, 9A, 10A, 11A, 12A, 13A, 14A, 15A, and 16A are sectional views sequentially illustrating a process of fabricating a three-dimensional semiconductor memory device having the section of FIG. 4A. FIGS. 8B, 9B, 10B, 11B, 12B, 13B, 14B, 15B, and 16B are sectional views sequentially illustrating a process of fabricating a three-dimensional semiconductor memory device having the section of FIG. 4B.

Figure 8B:
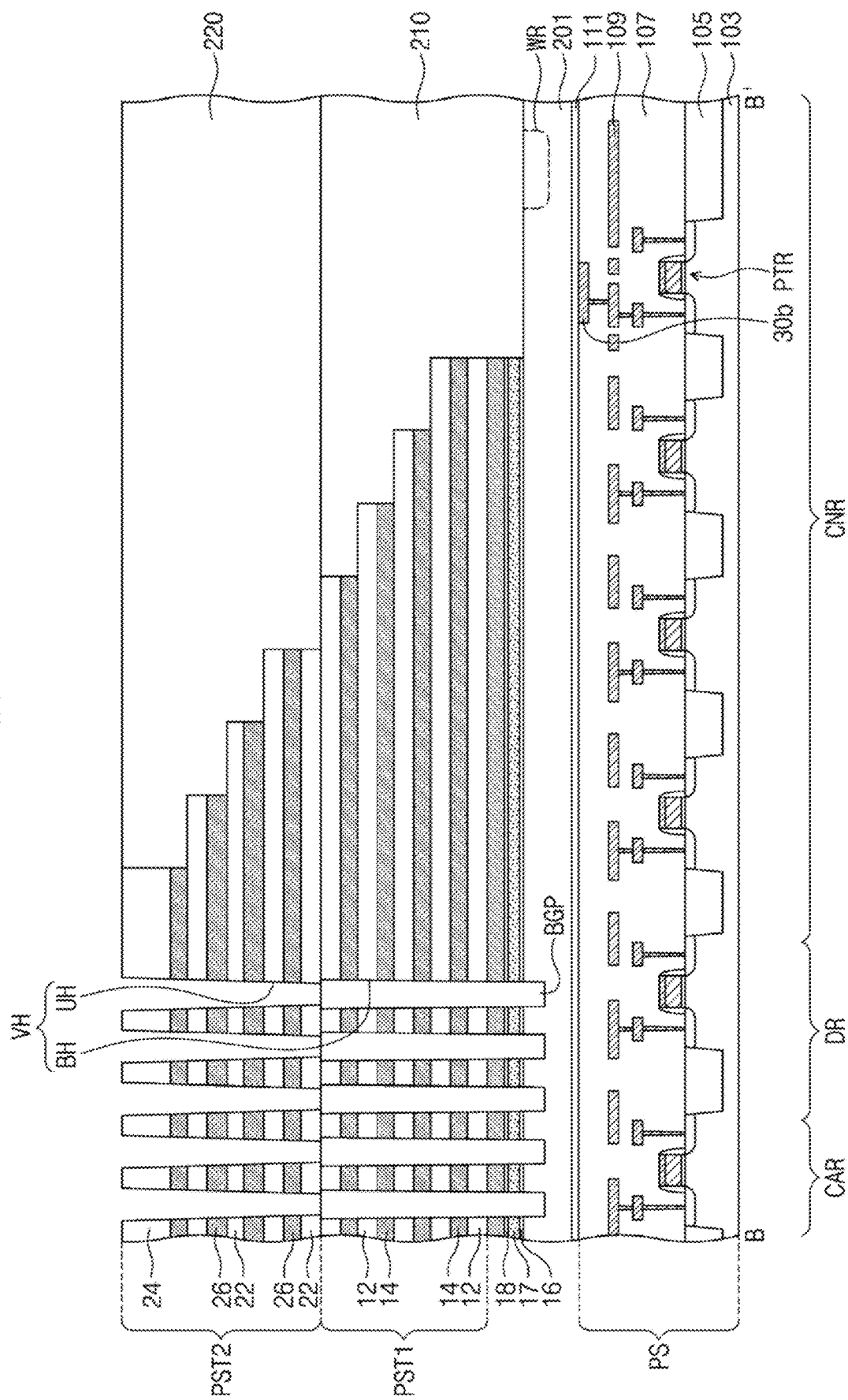
FIGS. 8B, 9B, 10B, 11B, 12B, 13B, 14B, 15B, and 16B are sectional views sequentially illustrating a process of fabricating a three-dimensional semiconductor memory device having the section of FIG. 4B.

Referring to FIGS. 8A and 8B, the peripheral circuit structure PS may be fabricated. In detail, the device isolation layer 105 may be formed in the first substrate 103 to delimit the active regions. Peripheral transistors PTR may be formed on the active regions. The peripheral interlayer insulating layer 107 may be formed to cover the peripheral transistors PTR. In some example embodiments, the peripheral interlayer insulating layer 107 may be formed to have a multi-layered structure, and in this case, the peripheral contacts 33 and the peripheral lines 109 may be formed in the peripheral interlayer insulating layer 107. The first and second peripheral conductive pads 30a and 30b may be formed in the uppermost portion of the peripheral circuit structure PS. In some example embodiments, the etch stop layer 111 may be additionally formed on the peripheral circuit structure PS.

Next, the second substrate 201 may be formed on the etch stop layer 111. The second substrate 201 may be formed by forming a semiconductor epitaxial layer or by attaching a single crystalline semiconductor substrate to the etch stop layer 111. The second substrate 201 may be referred to as a semiconductor layer. The second substrate 201 may be doped to have, for example, the first conductivity type. The substrate ground region WR may be formed in the second substrate 201. The substrate ground region WR may be formed by doping the second substrate 201 with impurities of the first conductivity type and may have a higher doping concentration than that in the second substrate 201. The second substrate 201 may include the cell array region CAR, the dummy region DR, and the connection region CNR, as shown in FIG. 2.

A first buffer layer 16, a first sacrificial layer 17, a second buffer layer 18, and the first source pattern SC1 may be sequentially stacked on the second substrate 201. Although not shown, the first source pattern SC1 may be formed to have a portion that is in contact with the top surface of the second substrate 201, as shown in FIG. 4C. For this, the portion of the first source pattern SC1 may be formed to penetrate the second buffer layer 18, the first sacrificial layer 17, and the first buffer layer 16.

A first preliminary stack structure PST1 may be formed by alternately and repeatedly stacking the first inter-electrode insulating layers 12 and second sacrificial layers 14 on the first source pattern SC1. The first source pattern SC1 may be a doped poly-silicon layer. In some example embodiments, the first and second buffer layers 16 and 18 and the inter-electrode insulating layers 12 may be formed of or include a silicon oxide layer. The first sacrificial layer 17 may be formed of or include a material having an etch selectivity with respect to all of the first and second buffer layers 16 and 18, the first inter-electrode insulating layers 12, the first source pattern SC1, and the second sacrificial layers 14. For example, the second sacrificial layers 14 may be formed of or include silicon nitride. The first sacrificial layer 17 may be a silicon germanium layer or a silicon oxynitride layer. Alternatively, the first sacrificial layer 17 may be a doped poly-silicon layer, which is doped to have a doping concentration different from the first source pattern SC1.

A trimming process and an anisotropic etching process may be repeatedly performed to form end portions of the first inter-electrode insulating layers 12 and the second sacrificial layers 14, which are formed on the connection region CNR, in a staircase structure. Here, the first buffer layer 16, the first sacrificial layer 17, the second buffer layer 18, and the first source pattern SC1 may be etched to expose the top surface of the second substrate 201 on the connection region CNR. An insulating layer may be formed on the resulting structure, and then, a chemical mechanical polishing (CMP) process may be performed on the insulating layer to form the first planarization insulating layer 210 covering the end portions of the first preliminary stack structure PST1.

A plurality of bottom holes BH may be formed by etching the first preliminary stack structure PST1, the first source pattern SC1, the second buffer layer 18, the first sacrificial layer 17, the first buffer layer 16, and the second substrate 201 on the cell array region CAR and the dummy region DR. Sacrificial gapfill patterns BGP may be formed to fill the bottom holes BH, respectively. The sacrificial gapfill pattern BGP may be formed of or include a material having an etch selectivity with respect to all of the first inter-electrode insulating layers 12, the second sacrificial layers 14, the first source pattern SC1, the second buffer layer 18, the first sacrificial layer 17, the first buffer layer 16, and the second substrate 201. For example, the sacrificial gapfill pattern BGP may be formed of or include at least one of spin-on-hardmask (SOH) materials, amorphous carbon layer (ACL), or SiGe.

A second preliminary stack structure PST2 may be formed by alternately and repeatedly stacking the second inter-electrode insulating layers 22 and 24 and third sacrificial layers 26 on the first preliminary stack structure PST1 and the first planarization insulating layer 210. The second inter-electrode insulating layers 22 and 24 may be formed of or include the same material as the first inter-electrode insulating layers 12. The third sacrificial layers 26 may be formed of or include the same material as the second sacrificial layers 14. A trimming process and an anisotropic etching process may be repeatedly performed to form end portions of the second inter-electrode insulating layers 22 and 24 and the third sacrificial layers 26, which are formed on the connection region CNR, in a staircase structure. An insulating layer may be formed on the resulting structure, and then, a chemical mechanical polishing (CMP) process may be performed on the insulating layer to form the second planarization insulating layer 220 covering the end portions of the second preliminary stack structure PST2. Thereafter, upper holes UH may be formed by etching the second preliminary stack structure PST2 on the cell array region CAR and the dummy region DR, and in some example embodiments, the upper holes UH may be formed to expose the sacrificial gapfill patterns BGP, respectively.

Referring to FIGS. 9A and 9B, the bottom holes BH may be re-opened by removing the sacrificial gapfill patterns BGP through the upper holes UH. The upper holes UH and the bottom holes BH, which overlap each other, may constitute vertical holes VH. The vertical holes VH may be formed not only on the cell array region CAR and the dummy region DR but also on the connection region CNR. Next, vertical structures VST may be formed in the vertical holes VH, respectively. For this, first, the gate insulating layer GO may be formed to conformally cover inner surfaces of the vertical holes VH. The cell vertical pattern VS and the central dummy vertical pattern CDVS may be formed on the cell array region CAR and in the vertical holes VH covered with the gate insulating layer GO. The edge dummy vertical pattern EDVS (e.g., see FIG. 3B) may be formed on the connection region CNR and in the vertical holes VH covered with the gate insulating layer GO. The insulating gapfill pattern 29 may be formed to fill the remaining space of each of the vertical holes VH. The bit line pads BPD may be formed by partially recessing the insulating gapfill pattern 29, the cell vertical pattern VS, the central dummy vertical pattern CDVS, and the edge dummy vertical pattern EDVS and filling the recessed portions with a poly-silicon layer.

Figure 10A:
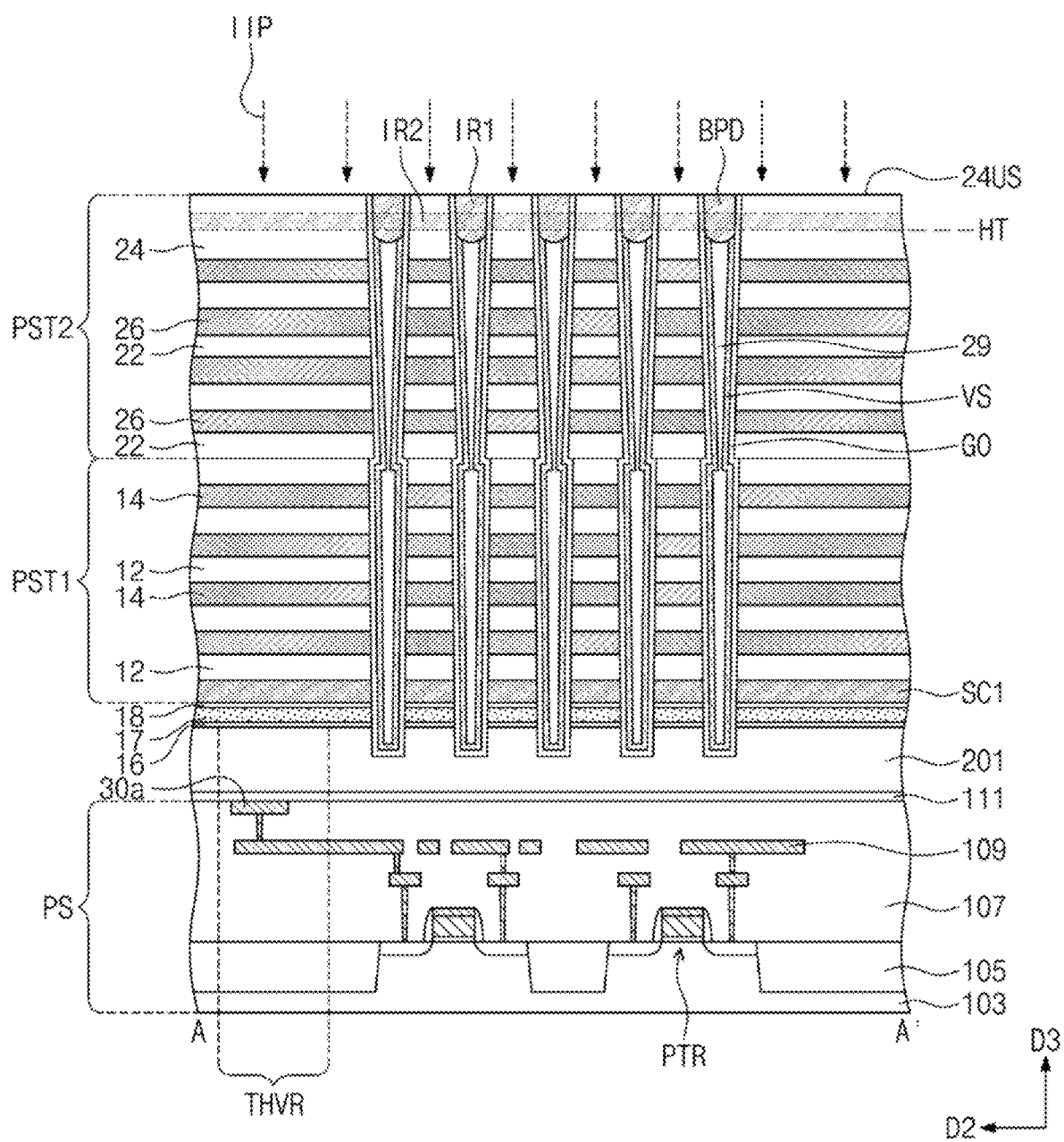
Figure 10B:
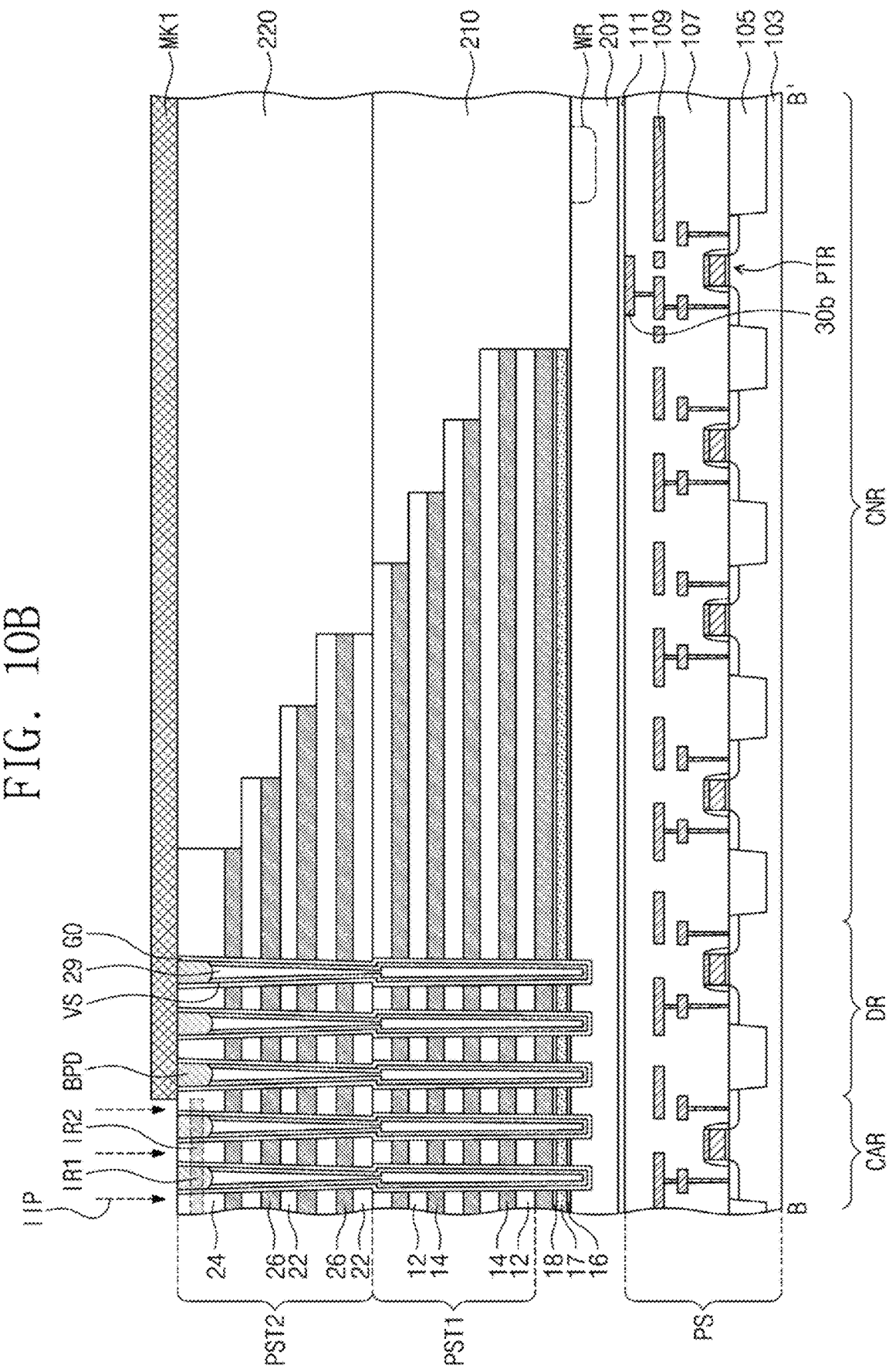

Referring to FIGS. 10A and 10B, a first mask pattern MK1 may be formed on the second preliminary stack structure PST2. The first mask pattern MK1 may be formed to expose the cell array region CAR and to cover the connection region CNR and the dummy region DR. The first mask pattern MK1 may be formed of or include at least one of, for example, photoresist materials, silicon nitride, SiOC, SOH, or ACL. The first impurity injection region IR1 may be formed in the bit line pad BPD by performing an ion implantation process IIP using the first mask pattern MK1 as an ion injection mask. During the ion implantation process IIP, the second impurity injection region IR2 may be formed in the uppermost second inter-electrode insulating layer 24 on the cell array region CAR. Accordingly, as described with reference to FIG. 6A, the first and second impurity injection regions IR1 and IR2 may be doped with the same impurity ions and may have the same doping concentration. For example, the impurity ions may be phosphorus ions. In some example embodiments, the first and second impurity injection regions IR1 and IR2 may be doped with phosphorus atoms to have the doping concentration ranging from $1\times10^{20}$ ions/cm$^3$ to $1\times10^{22}$ ions/cm$^3$ (in particular, from $9\times10^{20}$ ions/cm$^3$ to $2\times10^{21}$ ions/cm$^3$). A projection range (Rp) of the impurity ions from the top surface 24US of the uppermost second inter-electrode insulating layer 24 may range from 20 nm to 40 nm. In addition, the portion TL_P of the tunnel insulating layer TL, the portion SN P of the charge storing layer SN, and the portion BCL_P of the blocking insulating layer BCL, which are located at the first height HT and constitute the gate insulating layer GO, may be doped with the impurity ions. Due to the first mask pattern MK1, the first and second impurity injection regions IR1 and IR2 may not be formed in the dummy region DR and the connection region CNR.

Figure 11A:
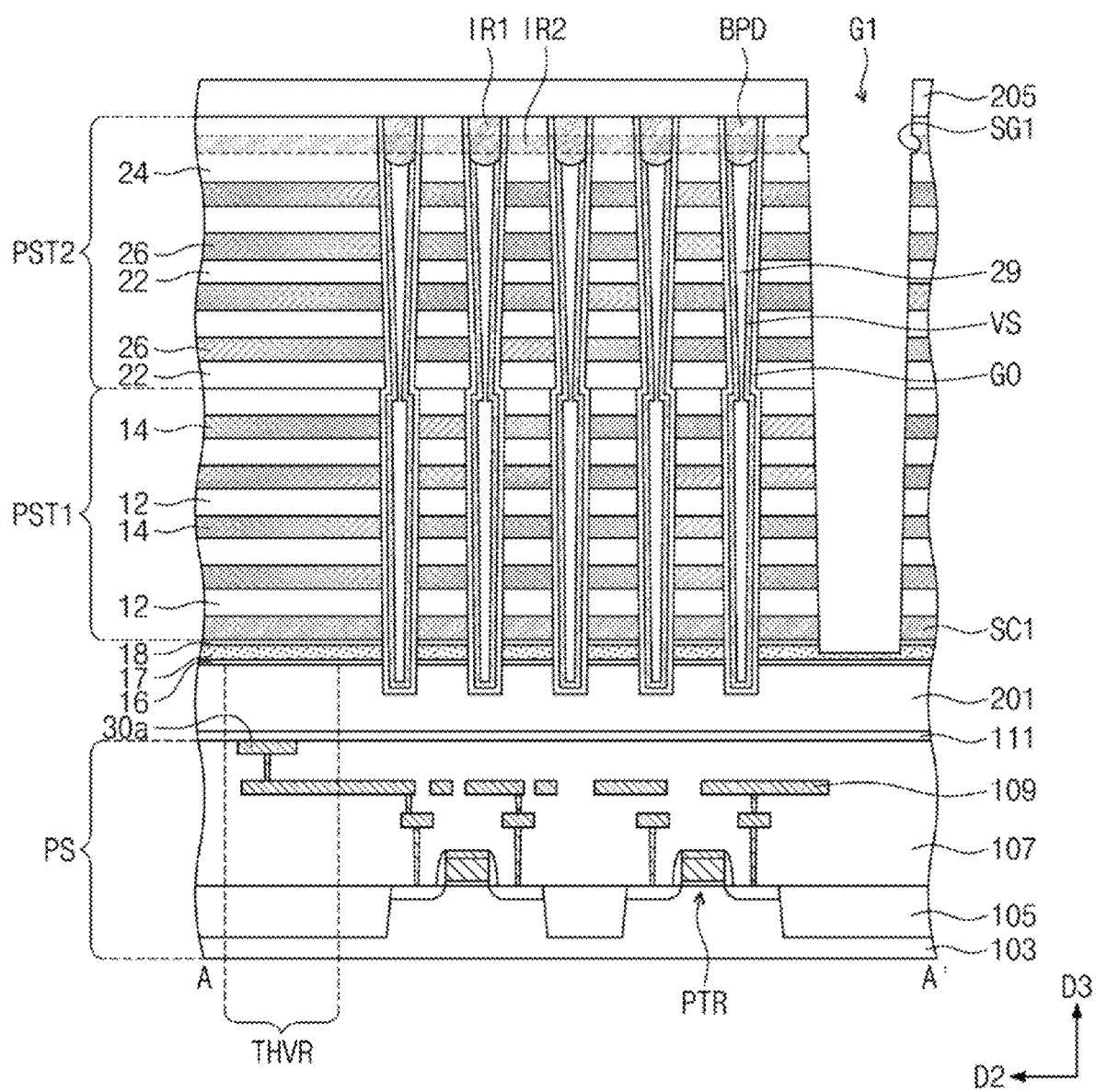
Figure 11B:
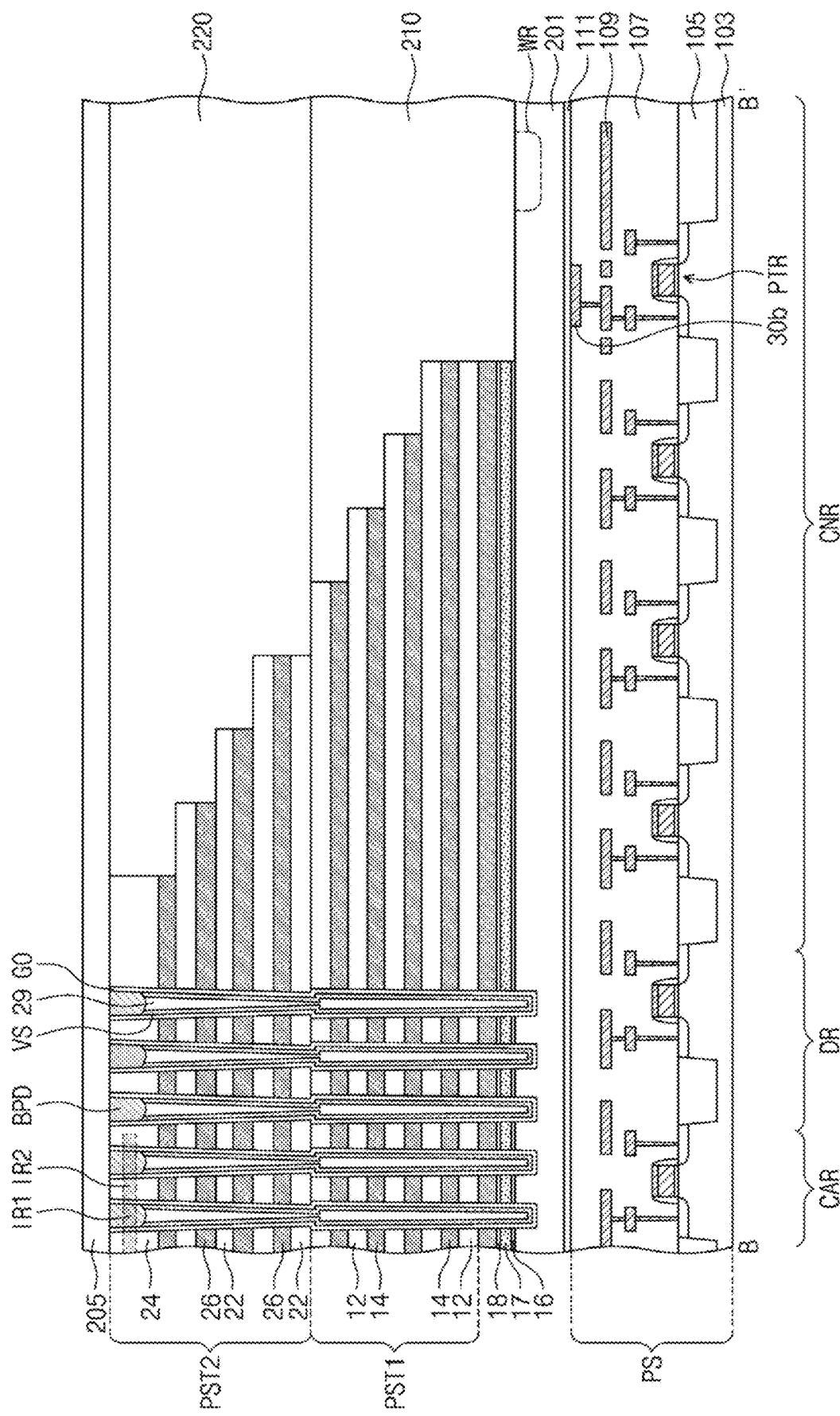

Referring to FIGS. 2, 11A, and 11B, the first mask pattern MK1 may be removed. The first interlayer insulating layer 205 may be formed on the second preliminary stack structure PST2. The first grooves G1 exposing the first sacrificial layer 17 may be formed by sequentially etching the first interlayer insulating layer 205, the second preliminary stack structure PST2, the first preliminary stack structure PST1, the first source pattern SC1, and the second buffer layer 18. During this process, the second grooves G2 may be formed to have the structure shown in FIGS. 2 and 4C. A cleaning process may be performed to remove etch residues from the first and second grooves G1 and G2.

During the etching and cleaning processes, the first recess region SG1 may be formed in upper inner sidewalls of the first and second grooves G1 and G2. Since the second impurity injection region IR2 in the uppermost second inter-electrode insulating layer 24 are damaged by the impurity ions, a bonding strength between atoms in the second impurity injection region IR2 may be weaker than that in other regions. Accordingly, an amount of the second impurity injection region IR2 etched or removed during the etching and cleaning processes may be increased. As a result, the first recess region SG1 may be formed. Furthermore, in the case where the second impurity injection region IR2 is formed to have a high doping concentration (e.g., from $1\times10^{20}$ ions/cm$^3$ to $1\times10^{22}$ ions/cm$^3$ or from $9\times10^{20}$ ions/cm$^3$ to $2\times10^{21}$ ions/cm$^3$), the first recess region SG1 may be more easily formed. If the second impurity injection region IR2 has a doping concentration lower than the above range, the first recess region SG1 may not be formed.

In a three-dimensional semiconductor memory device and a method of fabricating the same according to some example embodiments of the inventive concepts, in order to effectively exploit a gate induced drain leakage (e.g., GIDL) phenomenon in an erase operation, it may be necessary to form a highly doped region (e.g., the first impurity injection region IR1) in the bit line pad BPD. As a result of an ion implantation process performed for this purpose, the second impurity injection region IR2 may be formed in the uppermost second inter-electrode insulating layer 24. That is, the formation of the first recess region SG1 may be inevitable.

Figure 12A:
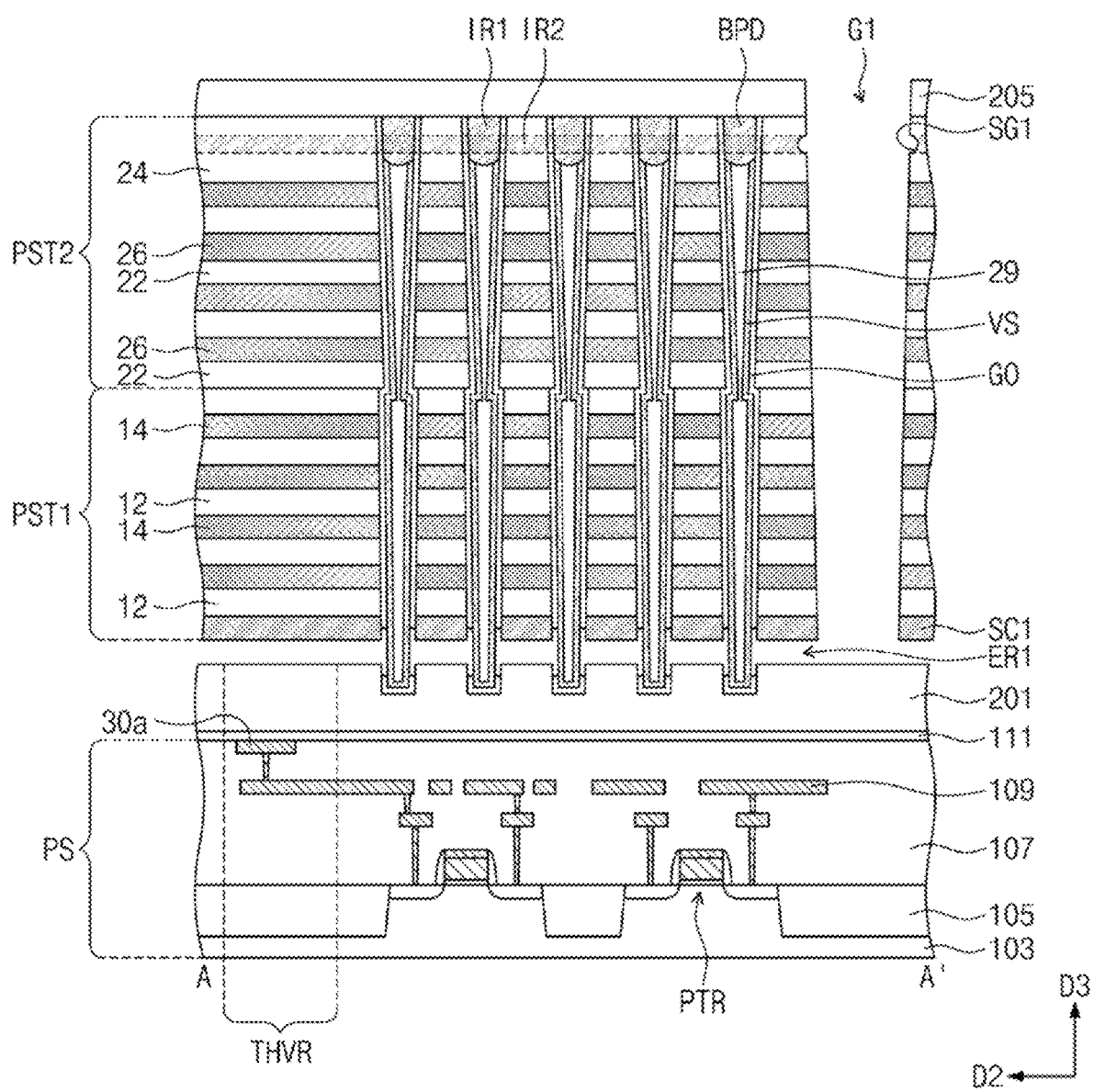
Figure 12B:
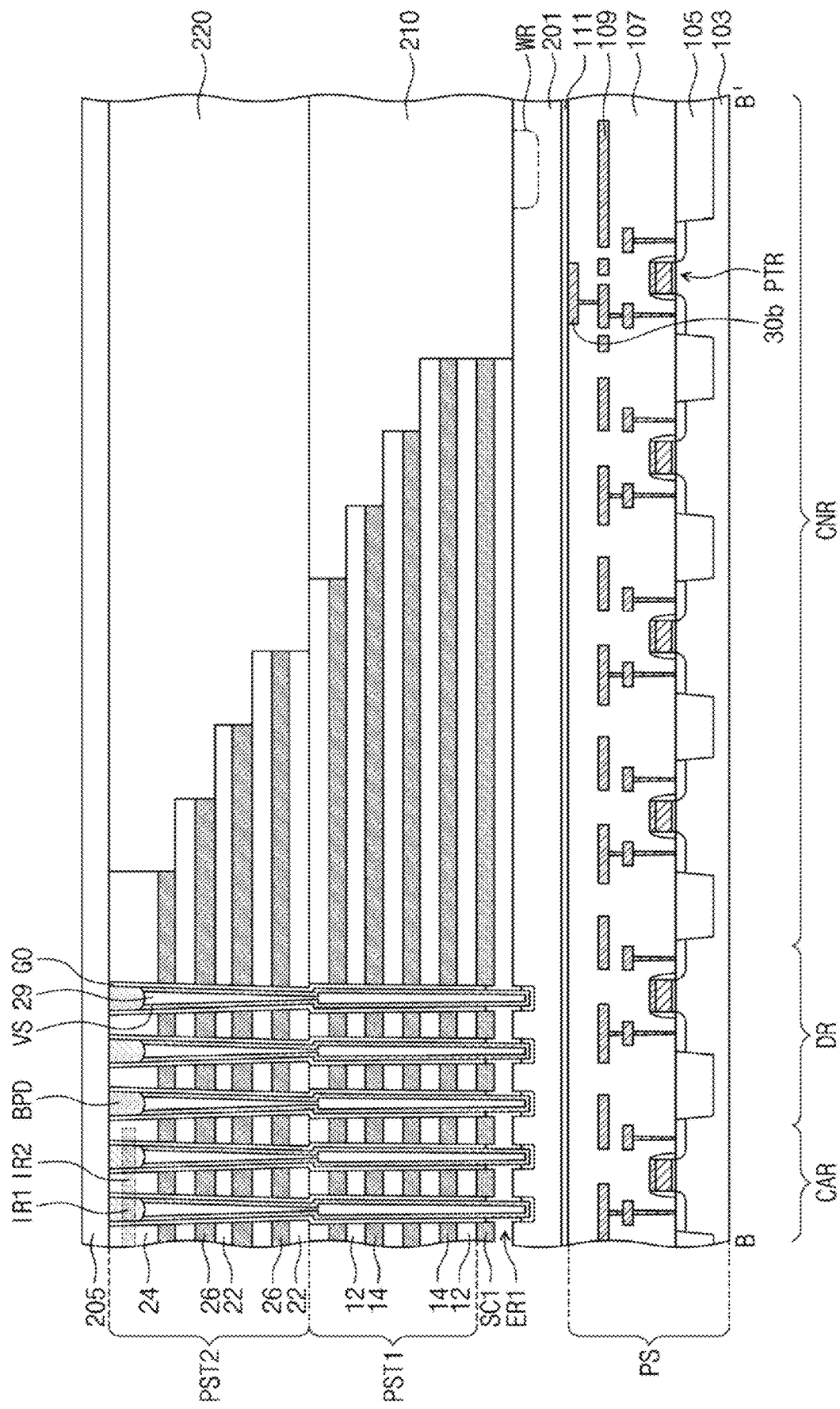

Referring to FIGS. 12A and 12B, a first empty space ER1 may be formed by removing the second buffer layer 18, the first sacrificial layer 17, and the first buffer layer 16 through the first and second grooves G1 and G2. During this process, the gate insulating layer GO may be partially removed, and in this case, side surfaces of the cell vertical pattern VS, the central dummy vertical pattern CDVS, and the edge dummy vertical pattern EDVS may be exposed through the first empty space ER1. Furthermore, the first empty space ER1 may be formed to expose the bottom surface of the first source pattern SC1 and the top surface of the second substrate 201. The cell vertical pattern VS, the central dummy vertical pattern CDVS, and the edge dummy vertical pattern EDVS may be used to support the first and second preliminary stack structures PST1 and PST2, when the first empty space ER1 is formed, and thus, may prevent the first and second preliminary stack structures PST1 and PST2 from being collapsed.

Figure 13A:
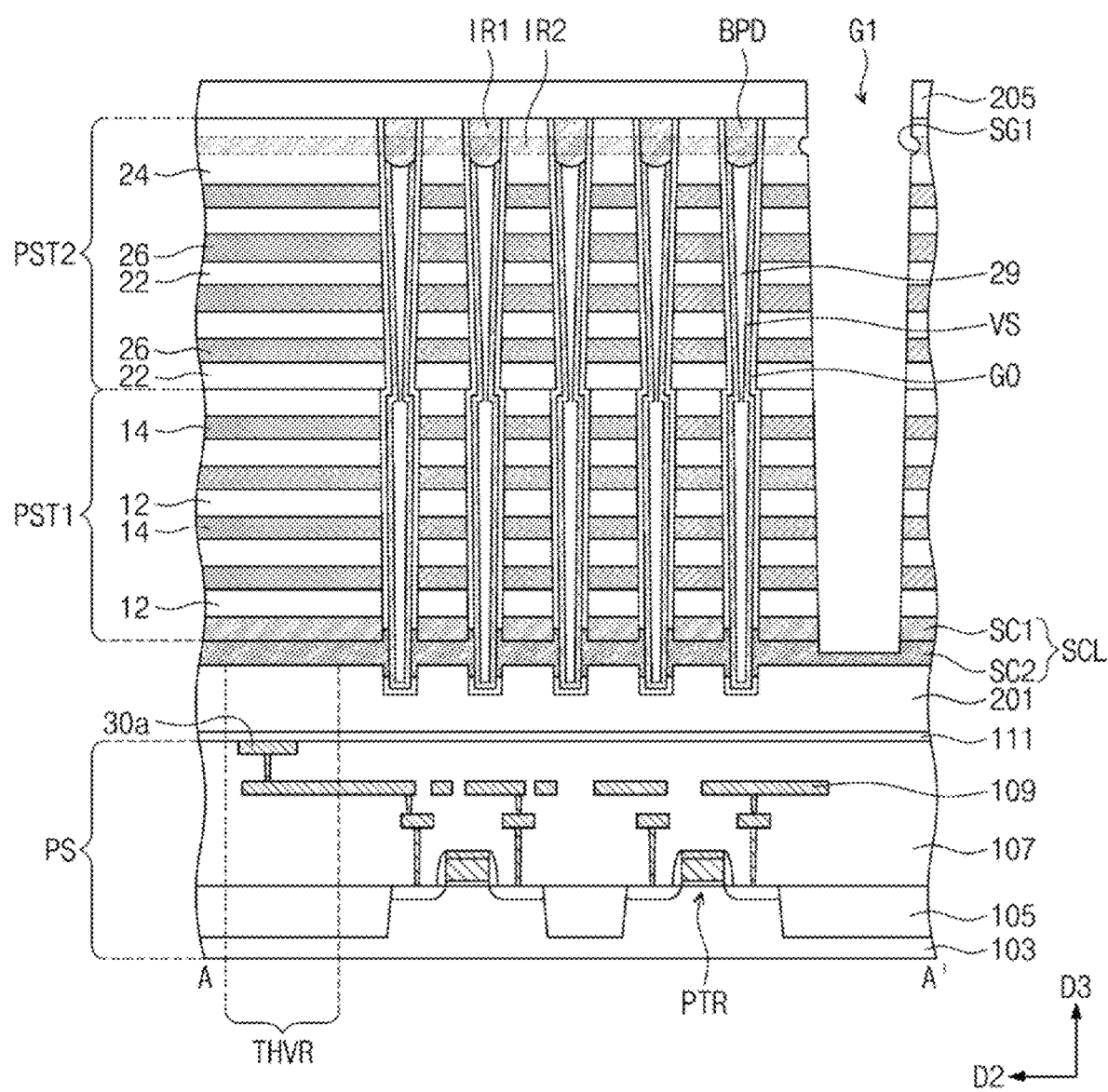
Figure 13B:
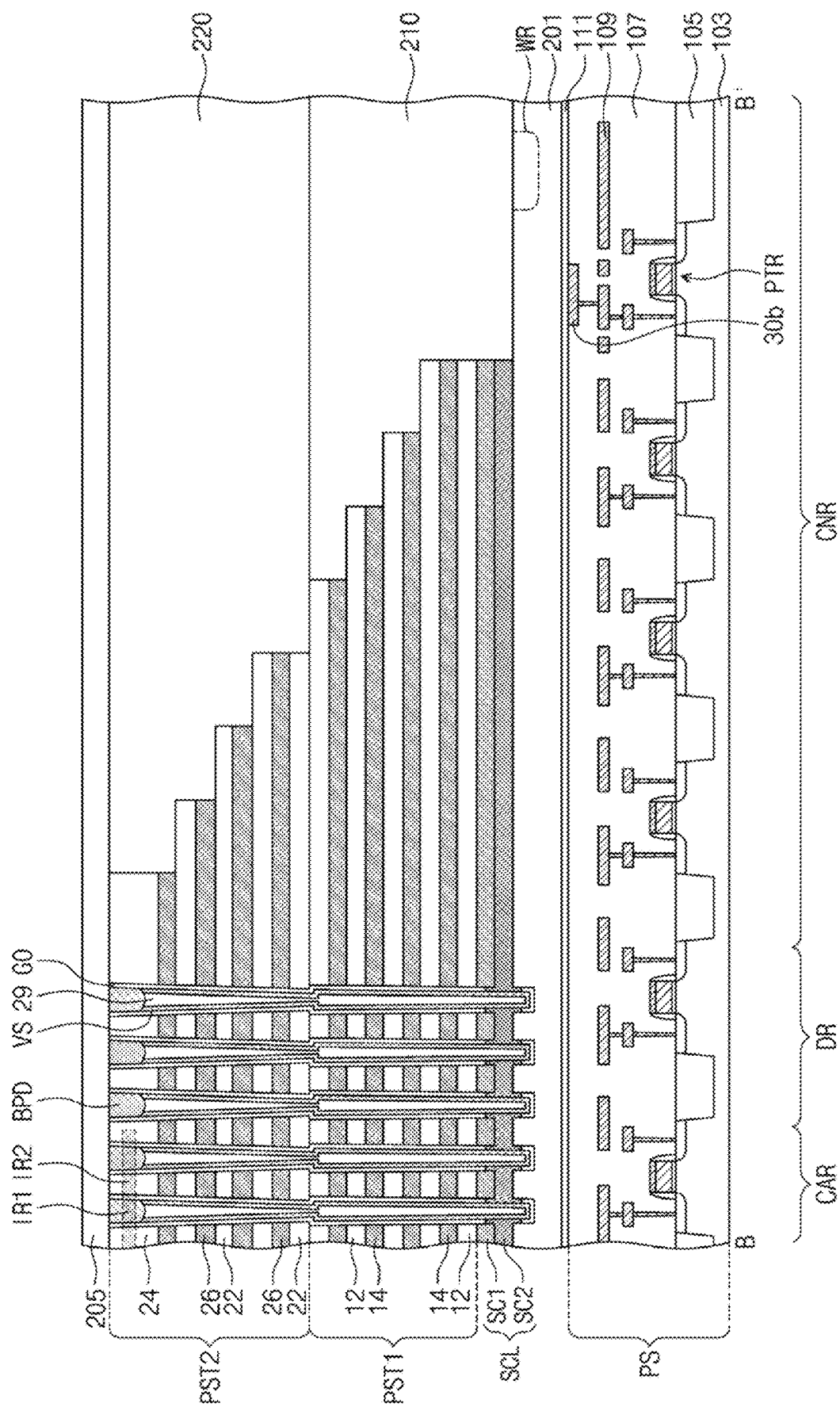

Referring to FIGS. 13A and 13B, a second source layer may be conformally deposited to fill the first empty space ER1 through the first and second grooves G1 and G2, and an anisotropic etching process may be performed to remove the second source layer from the first and second grooves G1 and G2 and to leave the second source layer in the first empty space ER1. As a result, the second source pattern SC2 may be formed in the first empty space ER1, and the second source pattern SC2, along with the first source pattern SC1, may constitute the source structure SCL.

Figure 14A:
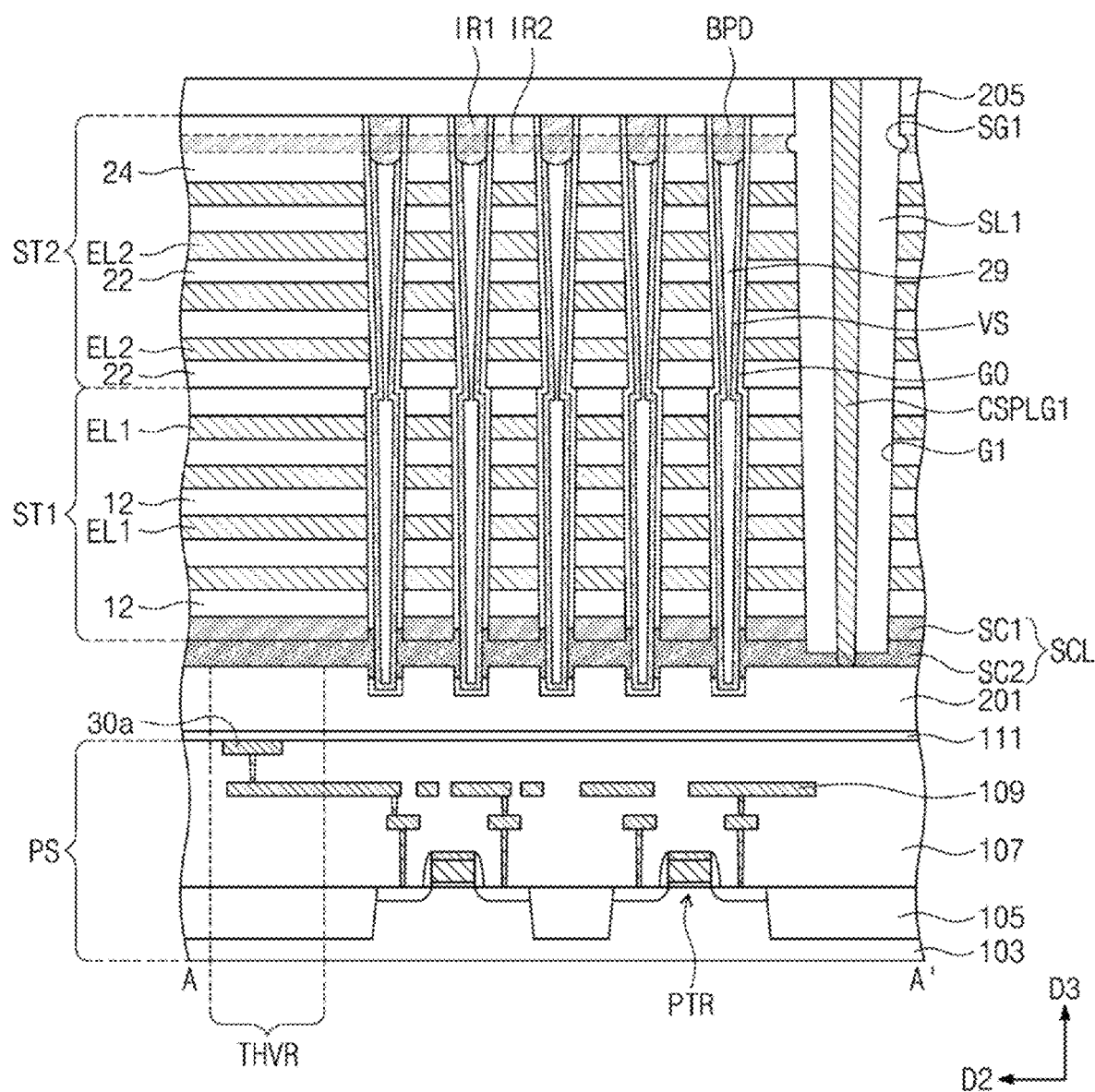
Figure 14B:
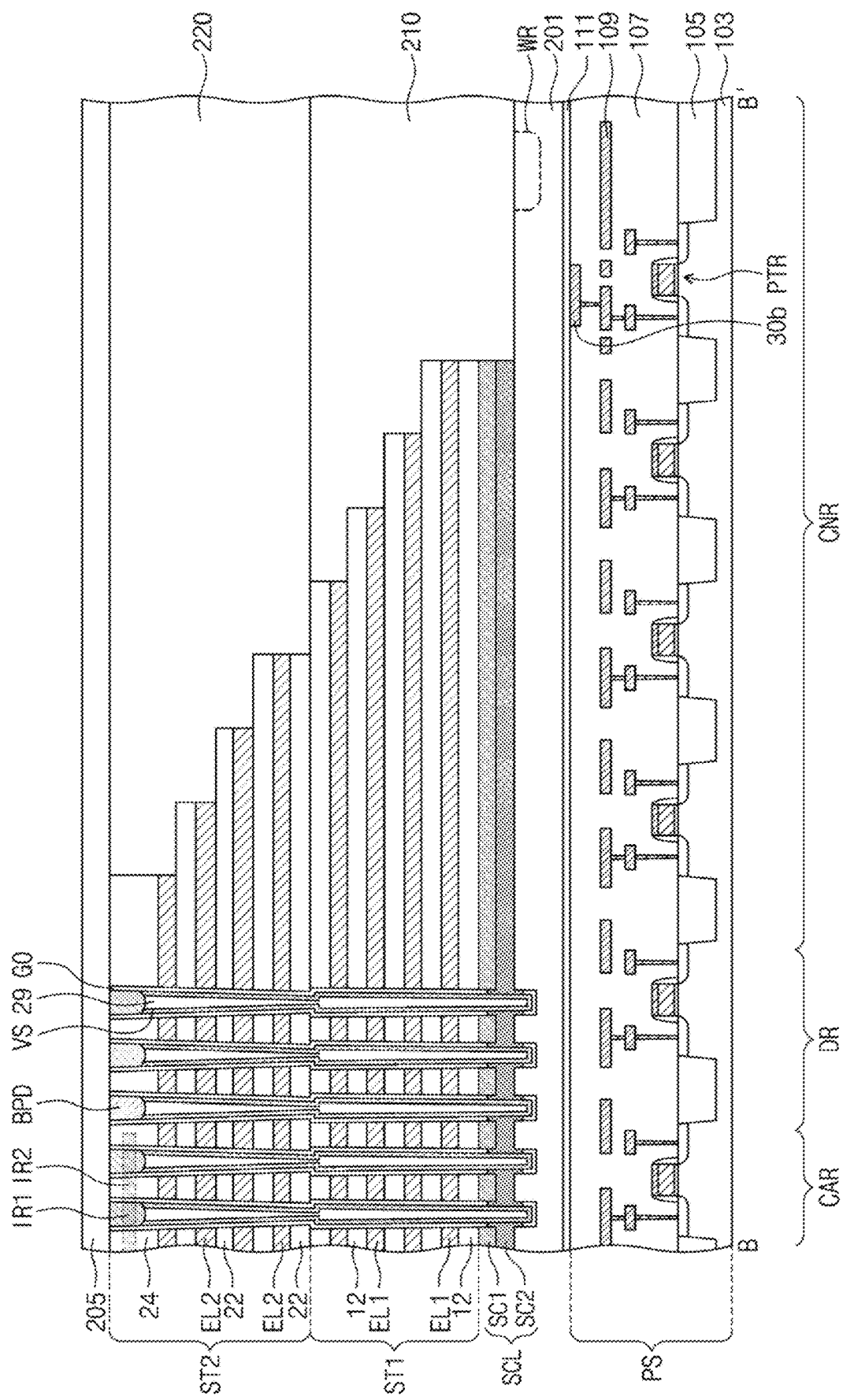

Referring to FIGS. 14A and 14B, second empty spaces may be formed between the inter-electrode insulating layers 12, 22, and 24 by removing the second sacrificial layers 14 and the third sacrificial layers 26 through the first and second grooves G1 and G2. A first conductive layer may be conformally deposited to fill the second empty spaces through the first and second grooves G1 and G2. Thereafter, an anisotropic etching process may be performed to remove the first conductive layer from the first and second grooves G1 and G2, and in this case, the electrode layers EL1 and EL2 may be formed in the second empty spaces, respectively. As a result, the first stack structure ST1 and the second stack structure ST2 may be formed. In some example embodiments, the high-k dielectric layer HL of FIG. 6A may be conformally formed before the deposition of the first conductive layer. A portion of the first conductive layer may be left in the first recess region SG1, when the first conductive layer is removed from the first and second grooves G1 and G2 or the electrode layers EL1 and EL2 are formed in the second empty spaces. In this case, the remaining electrode pattern ELR may be formed to have the structure shown in FIG. 6C.

An insulating layer may be conformally deposited and may be anisotropically etched to form the first and second separation insulation patterns SL1 and SL2 covering inner surfaces of the first and second grooves G1 and G2. Thereafter, a second conductive layer may be deposited to fill the first and second grooves G1 and G2, and then, an etch-back process may be performed on the second conductive layer to form the first and second source contact lines CSPLG1 and CSPLG2 in the first and second grooves G1 and G2, respectively.

Figure 15A:
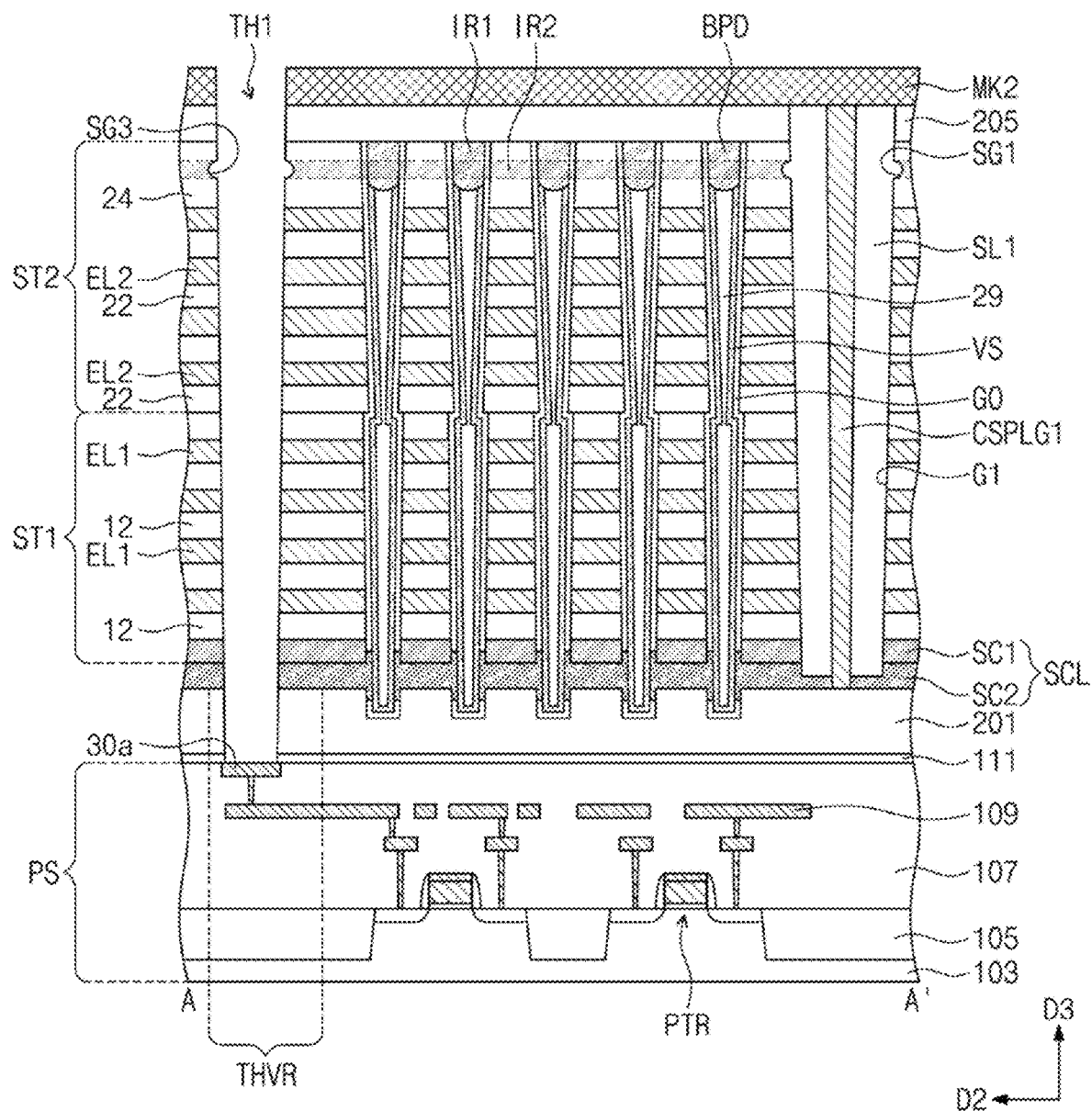
Figure 15B:
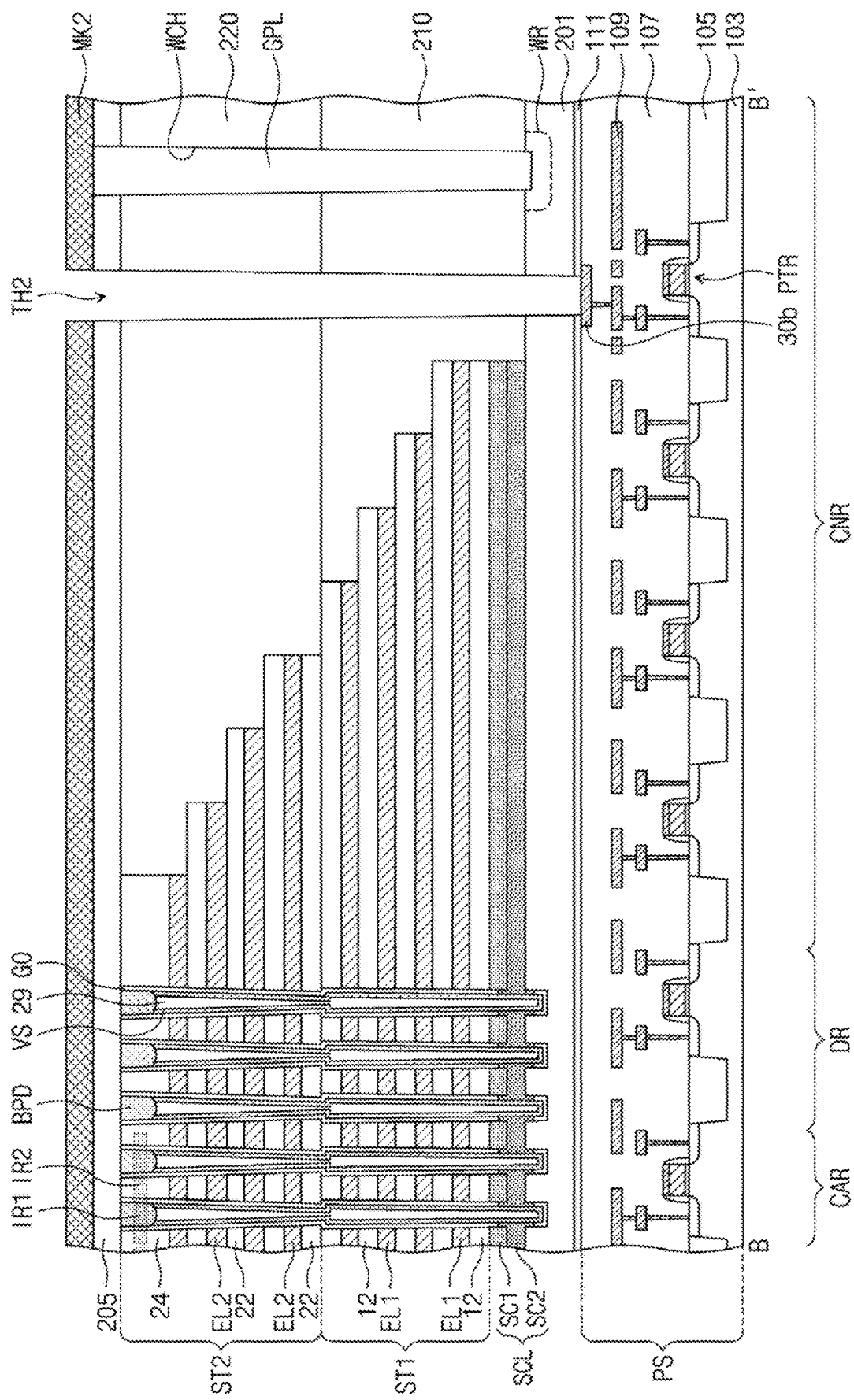
Figure 16A:
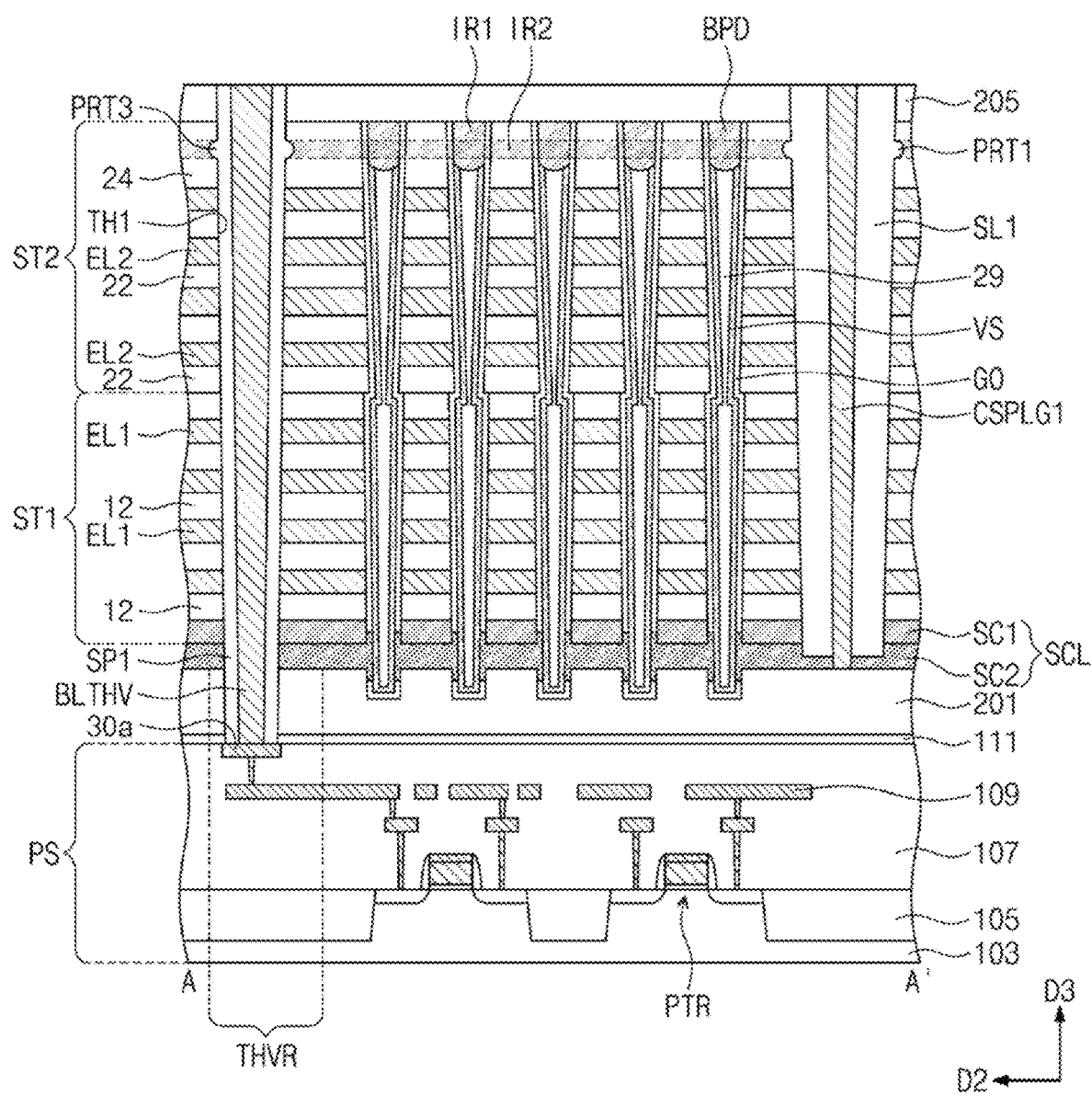
Figure 16B:
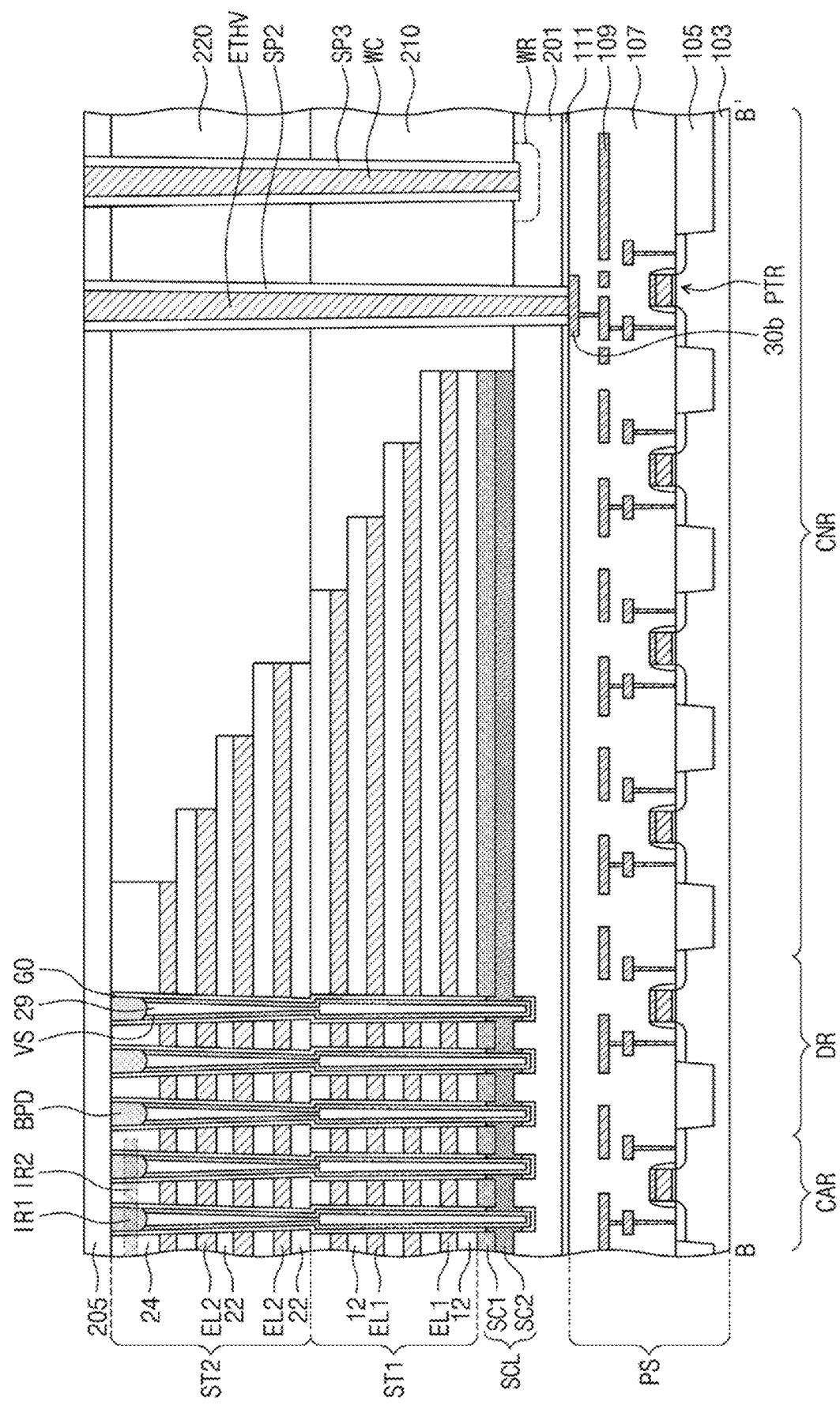

Referring to FIGS. 15A and 15B, the first interlayer insulating layer 205, the second planarization insulating layer 220, and the first planarization insulating layer 210 on the connection region CNR may be etched to form a substrate contact hole WCH exposing the substrate ground region WR. The substrate contact hole WCH may be formed to have an inner side surface, which is substantially perpendicular to the top surface of the first substrate 103, without a recessed region. A sacrificial fill layer GPL may be formed to fill the substrate contact hole WCH. A second mask pattern MK2 may be formed on the first interlayer insulating layer 205. The second mask pattern MK2 may have openings, which are formed on the central through-via region THVR to delimit the first via holes TH1 for the bit line through vias BLTHV, and openings, which are formed on the connection region CNR to delimit second via holes TH2 for the edge through vias ETHV.

The first via hole TH1 exposing the first peripheral conductive pad 30a may be formed by etching the first interlayer insulating layer 205, the second stack structure ST2, the first stack structure ST1, the source structure SCL, the second substrate 201, and the etch stop layer 111, which are formed on the central through-via region THVR, using the second mask pattern MK2 as an etch mask. In some example embodiments, the etching process may be performed to etch the first interlayer insulating layer 205, the second planarization insulating layer 220, the first planarization insulating layer 210, the second substrate 201, and the etch stop layer 111, which are formed on the connection region CNR, and in this case, the second via hole TH2 may be formed to expose the second peripheral conductive pad 30b. Thereafter, a cleaning process may be further performed.

During the etching process and/or the cleaning process, the third recess region SG3 may be formed in an upper inner side surface of the first via hole TH1, but any recess region may not be formed in an upper inner side surface of the second via hole TH2. Since, as described above, the second impurity injection region IR2, which is formed in the uppermost second inter-electrode insulating layer 24 on the cell array region CAR, is damaged by the impurity ions, a bonding strength between atoms may be weaker in the second impurity injection region IR2 than in other regions, and thus, the third recess region SG3 may be selectively formed in the first via hole TH1. However, since the second impurity injection region IR2 is not formed on the dummy region DR and the connection region CNR, the recess region may not be formed on the dummy region DR and the connection region CNR.

The first groove G1 may be formed to have the first width W1, as shown in FIG. 6A. The first via hole TH1 may be formed to have the third width W3, as shown in FIG. 7. The first width W1 may be larger than the third width W3. According to a loading effect, the larger the width of the groove or hole, the more the amount of etchant or cleaning solution supplied through the groove or hole. This may lead to an increase of an etching or removing amount of the second impurity injection region IR2 of the uppermost second inter-electrode insulating layer 24, and as a result, the first depth DS1 of the first recess region SG1 may be larger than the third depth DS3 of the third recess region SG3.

In some example embodiments, the first via hole TH1 and the second via hole TH2 may be simultaneously formed using the second mask pattern MK2, but in some example embodiments, the first via hole TH1 and the second via hole TH2 may be independently formed by respective etching steps using different mask patterns from each other.

Referring to FIGS. 15A, 15B, 16A, and 16B, the second mask pattern MK2 and the sacrificial fill layer GPL may be removed. Thereafter, an insulating layer may be conformally deposited and may be anisotropically etched to form the first via insulating pattern SP1, the second via insulating pattern SP2, and the contact insulating pattern SP3 which respectively cover inner side surfaces of the first via hole TH1, the second via hole TH2, and the substrate contact hole WCH. Next, a third conductive layer may be deposited to fill the first via hole TH1, the second via hole TH2, and the substrate contact hole WCH, and then, an etch-back process may be performed on the third conductive layer to form the bit line through vias BLTHV, the edge through vias ETHV, and the substrate contact plug WC.

Thereafter, the second interlayer insulating layer 207, the cell contact plugs CC, the first to fourth contacts CT1 to CT4, the first conductive lines BLL, the electrode connection lines CL, the third interlayer insulating layer 209, and the outer terminal CP may be formed to have the structure described with reference to FIGS. 4A to 4C.

Figure 17:
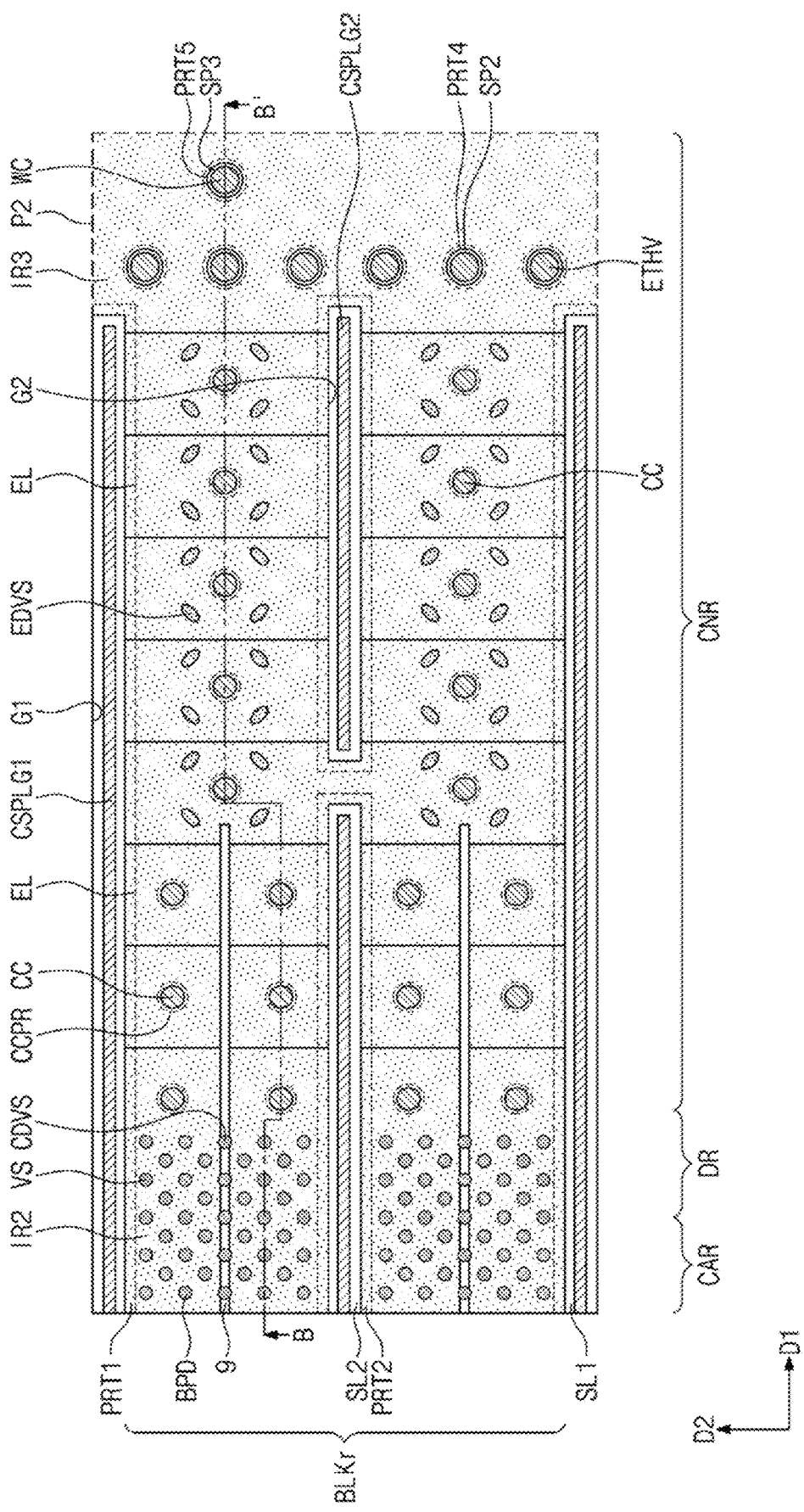
FIG. 17 is a plan view illustrating a three-dimensional semiconductor memory device according to some example embodiments of the inventive concepts.
Figure 18:
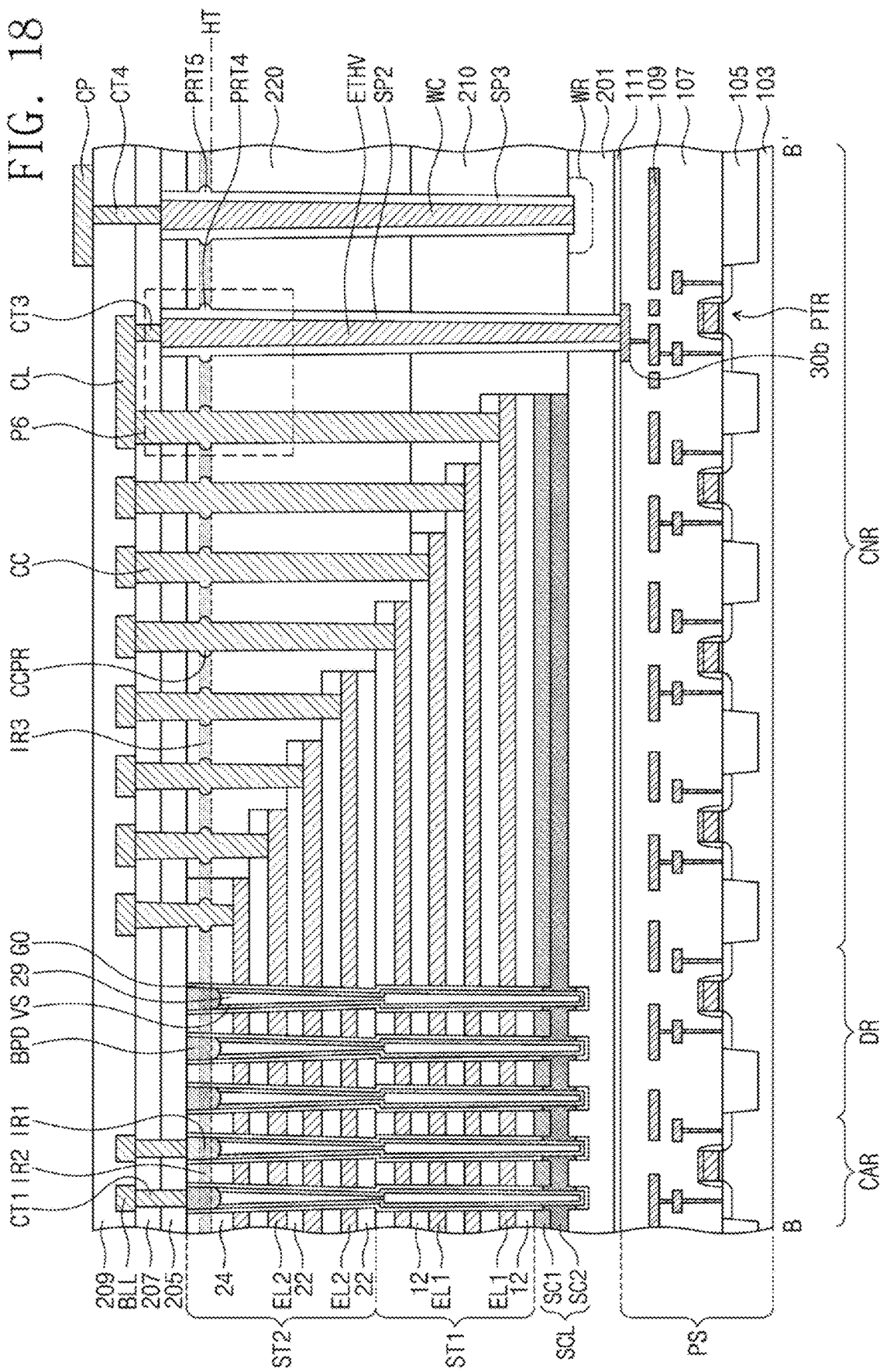
FIG. 18 is a sectional view, which is taken along a line B-B' of FIG. 17 to illustrate a three-dimensional semiconductor memory device according to some example embodiments of the inventive concepts.
Figure 19:
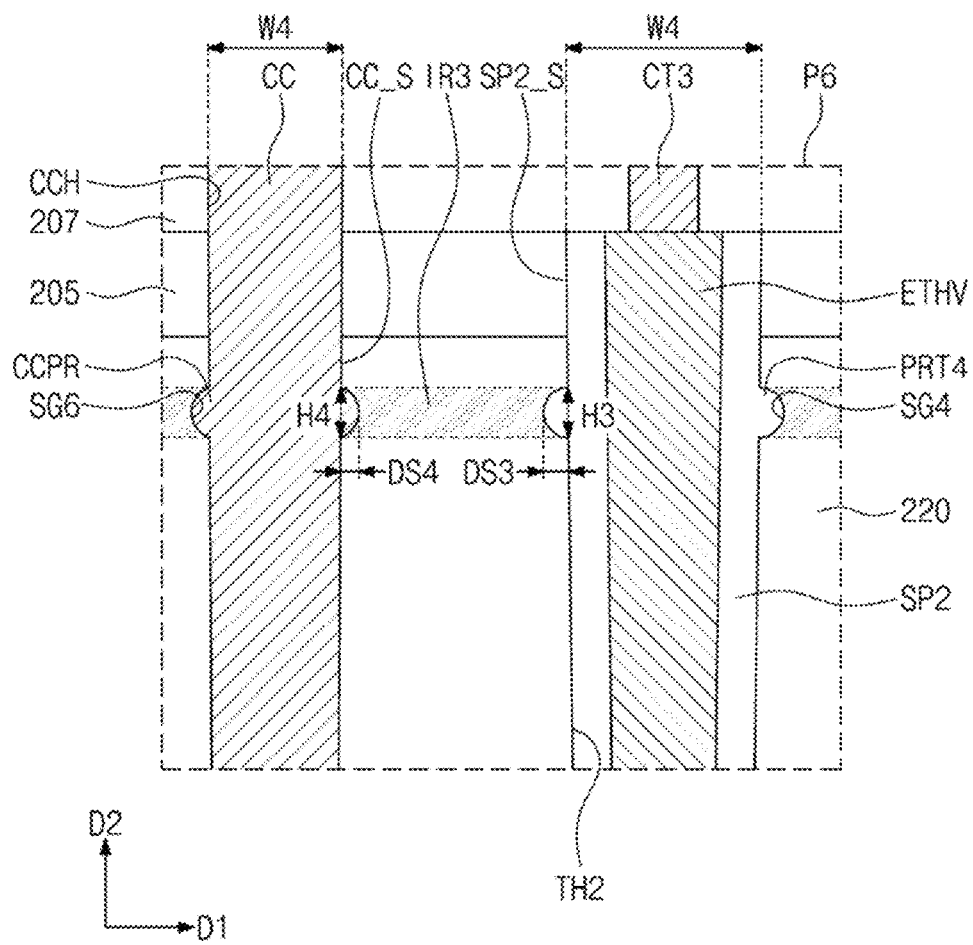
FIG. 19 is an enlarged sectional view illustrating a portion 'P6' of FIG. 18.

FIG. 17 is a plan view illustrating a three-dimensional semiconductor memory device according to some example embodiments of the inventive concepts. FIG. 18 is a sectional view, which is taken along a line B-B' of FIG. 17 to illustrate a three-dimensional semiconductor memory device according to some example embodiments of the inventive concepts. FIG. 19 is an enlarged sectional view illustrating a portion 'P6' of FIG. 18.

Referring to FIGS. 17 to 19, in the three-dimensional semiconductor memory device according to some example embodiments, the second impurity injection region IR2 may be formed in the uppermost second inter-electrode insulating layer 24 provided on all of the cell array region CAR, the dummy region DR, and the connection region CNR. In addition, a third impurity injection region IR3 may be formed in the second planarization insulating layer 220. The third impurity injection region IR3 may be located at the same height as the second impurity injection region IR2 (i.e., the first height HT from the top surface of the second substrate 201) and may have the same vertical width H1 and the same projection range (Rp) as the second impurity injection region IR2. In addition, the second and third impurity injection regions IR2 and IR3 may contain the same kind (e.g., same type) of impurities and may have the same doping concentration. The second via insulating pattern SP2 may have a fourth insulating protruding portion PRT4 at the first height HT. The contact insulating pattern SP3 may have a fifth insulating protruding portion PRT5 at the first height HT. The cell contact plugs CC may have contact protruding portions CCPR, respectively, at the first height HT and which protrudes towards the second planarization insulating layer 220.

An inner sidewall of the second via hole TH2 may have a fourth recess region SG4, which is recessed toward the second planarization insulating layer 220 at the first height HT. The fourth recess region SG4 may have the third vertical width H3. The third vertical width H3 may be equal to the first vertical width H1. The fourth recess region SG4 may have the third depth DS3, when measured from a side surface SP2_S of the second via insulating pattern SP2 in the first direction D1. The second via insulating pattern SP2 may have substantially the same features as the first via insulating pattern SP1 of FIG. 7. Each of the fourth and fifth insulating protruding portions PRT4 and PRT5 may have the same size and shape as the third insulating protruding portion PRT3 described with reference to FIG. 7.

The cell contact plugs CC, also referred to herein as cell contacts, may be disposed in cell contact holes CCH, respectively. As shown, the cell contact plugs CC may penetrate the first and/or second planarization insulating layers 210 and/or 220 and one or more inter-electrode insulating layers 24, 22, 12 to be connected to one or more electrode layers ELL EL2 on the connection region CNR, respectively. The cell contact hole CCH may have a fourth width W4. An inner sidewall of the cell contact hole CCH may have a sixth recess region SG6, which is recessed toward the second planarization insulating layer 220 at the first height HT. The sixth recess region SG6 may have a fourth vertical width H4. The fourth vertical width H4 may be equal to the first vertical width H1. The fourth recess region SG4 may have a fourth depth DS4, when measured from a side surface CC_S of the cell contact plug CC in the second direction D2. The fourth width W4 may be smaller than the third width W3, and the fourth depth DS4 may be smaller than the third depth DS3. This difference may be caused by a loading effect which may occur in the fabrication process.

The contact protruding portion CCPR may be inserted in a sixth recess region SG6. The contact protruding portion CCPR may be located at the first height HT and may have the fourth vertical width H4. In addition, a distance from the side surface CCS of the contact protruding portion CCPR to an end portion of the contact protruding portion CCPR may be a fourth distance DS4 that is equal to the fourth depth DS4. As shown in FIG. 17, the contact protruding portion CCPR may have a ring shape enclosing the cell contact plug CC, when viewed in a plan view.

Referring to FIGS. 6A, 7, and 19, the three-dimensional semiconductor memory device according to some example embodiments of the inventive concepts may be configured to satisfy the condition of H1≈H3≈H4 or H1=H3=H4. In the three-dimensional semiconductor memory device, the condition of W1≥W3≥W4 may be satisfied, and in this case, the condition of DS1≥DS3≥DS4 may also be satisfied.

Referring to at least FIGS. 18-19, the through via ETHV may penetrate the first and second planarization insulating layers 210 and 220 on the connection region CNR, and a via insulating pattern SP2 may be interposed between the through via ETHV and the first and second planarization insulating layers 210 and 220. As shown, the via insulating pattern SP2 may have an insulating protruding portion PRT4 which is located at the first height from the top surface of the second substrate 201 (e.g., HT) and protrudes towards the second planarization insulating layer 220.

Figure 20A:
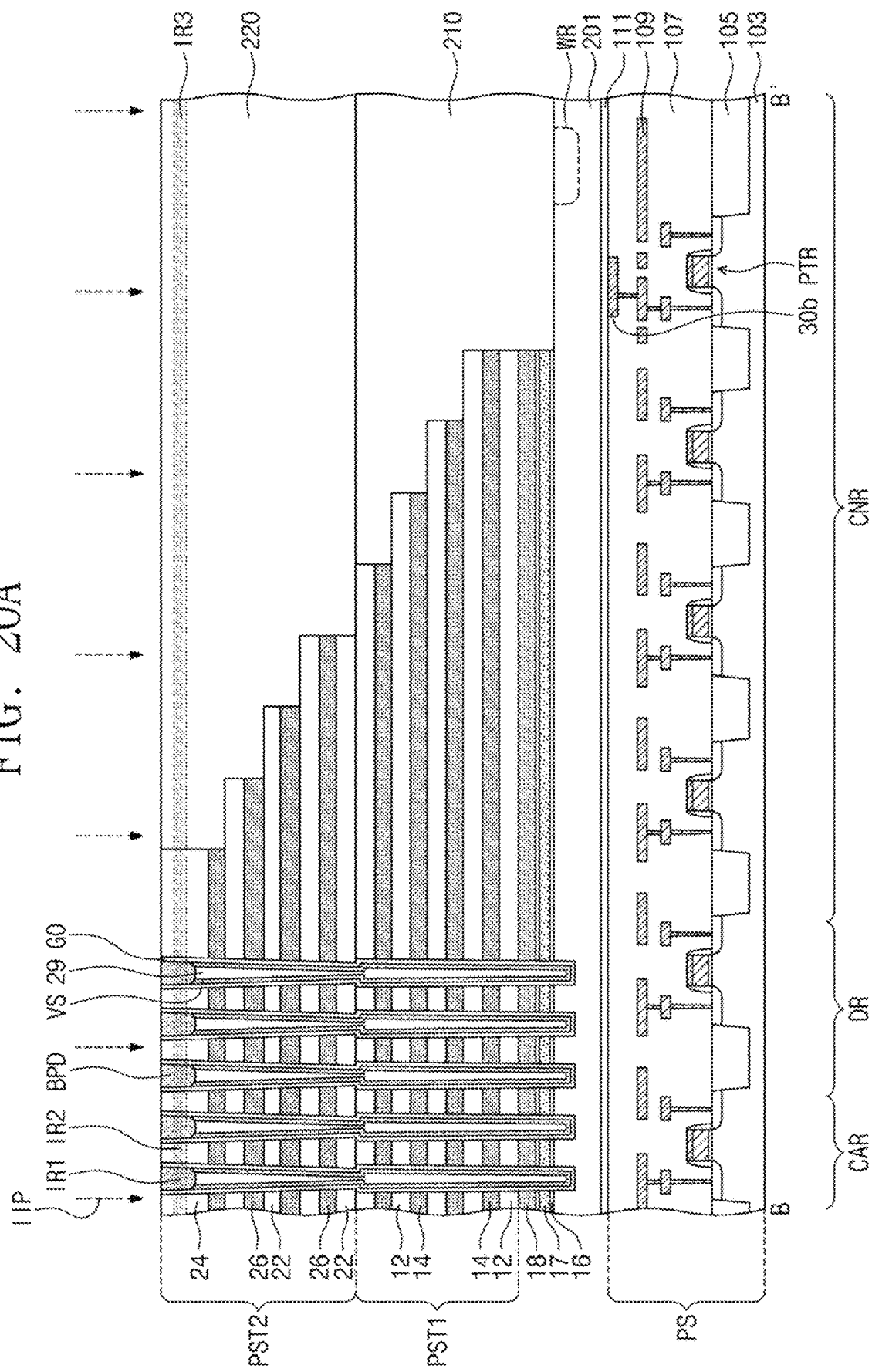
FIGS. 20A, 20B, and 20C are sectional views illustrating a process of fabricating a three-dimensional semiconductor memory device having the section of FIG. 18, according to some example embodiments of the inventive concepts.
Figure 20B:
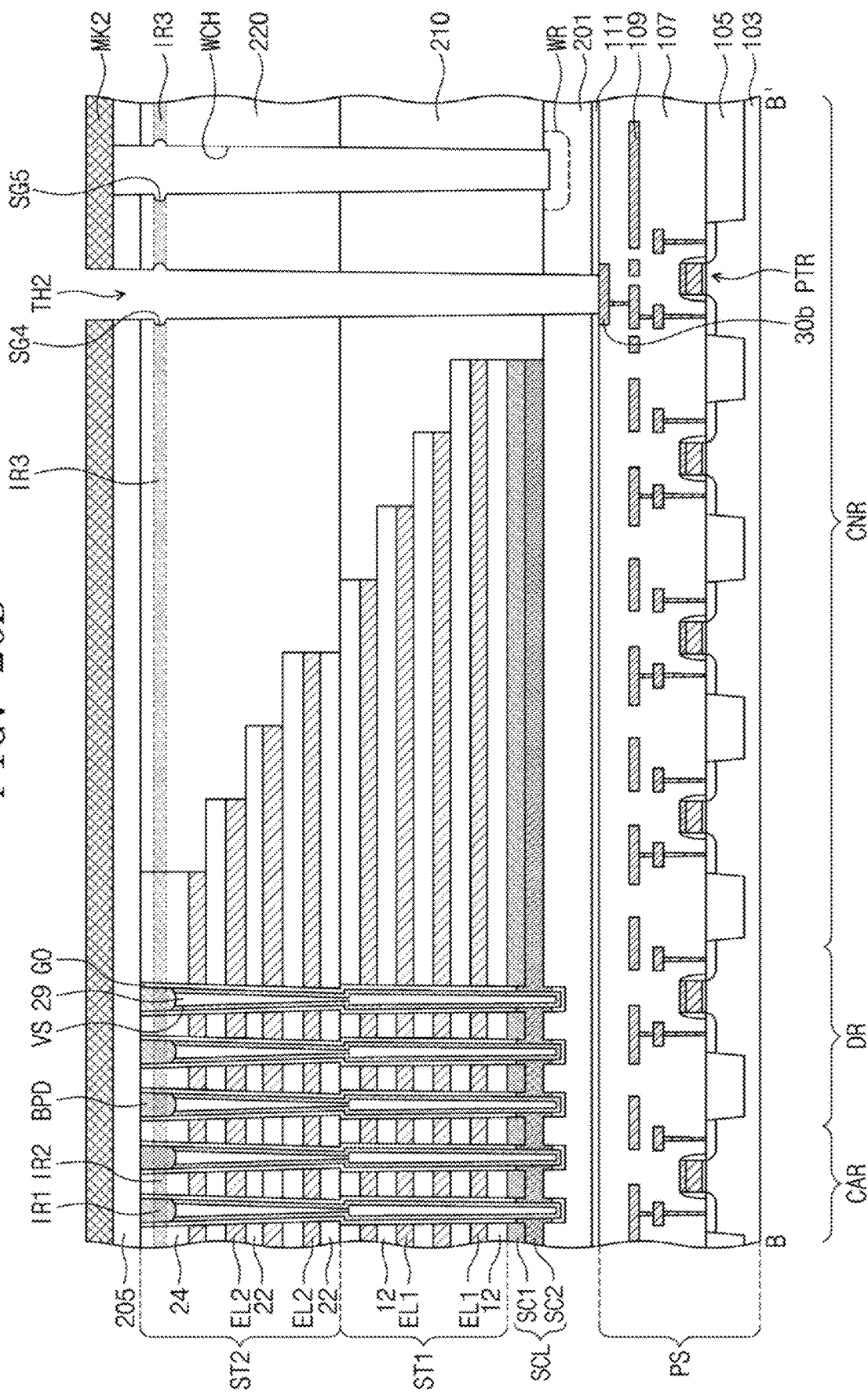
Figure 20C:
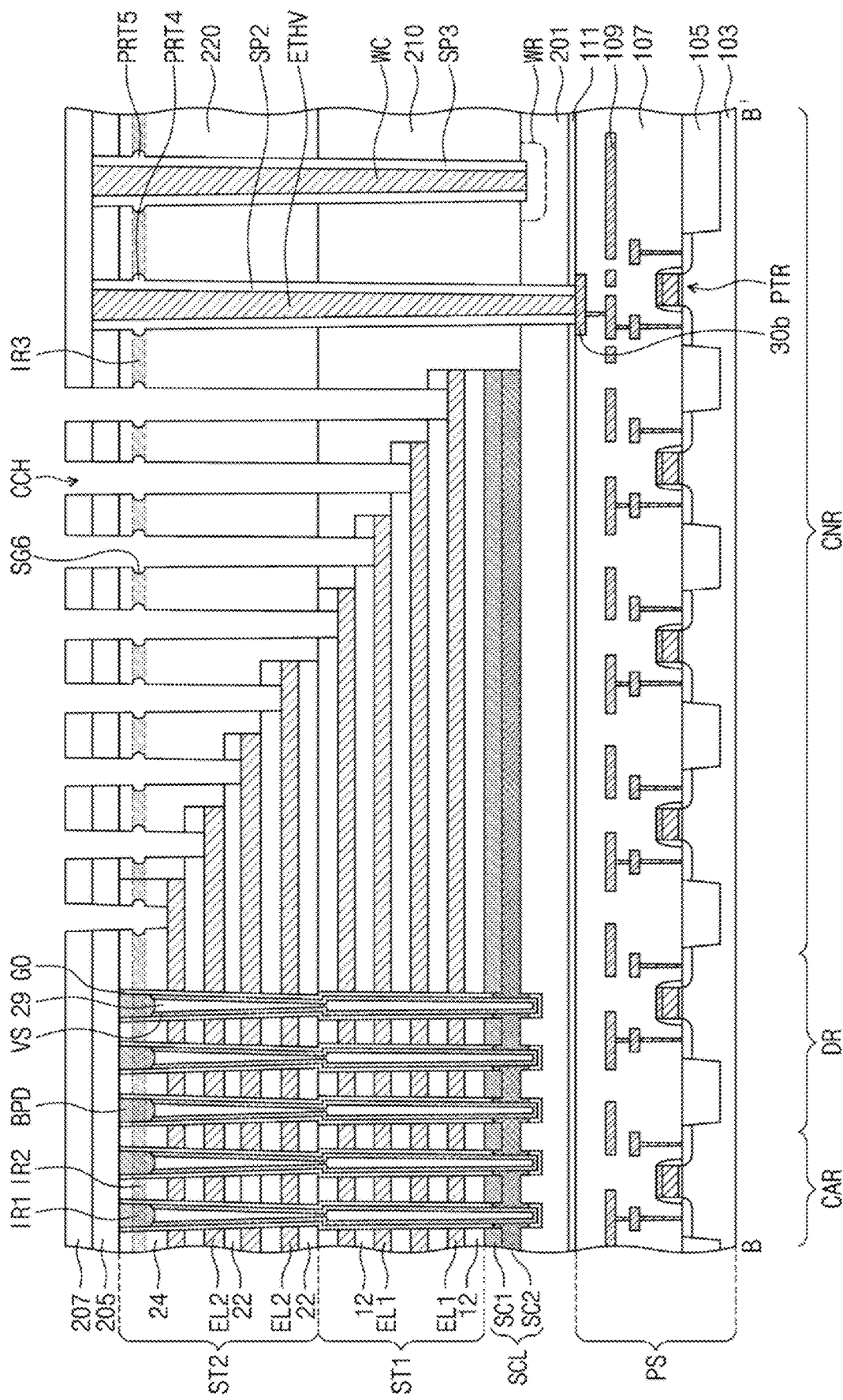

FIGS. 20A, 20B, and 20C are sectional views illustrating a process of fabricating a three-dimensional semiconductor memory device having the section of FIG. 18, according to some example embodiments of the inventive concepts.

Referring to FIG. 20A, the ion implantation process IIP may be performed on the structure of FIGS. 9A and 9B, without the first mask pattern MK1 of FIG. 10B; that is, the ion implantation process IIP may be performed on all of the cell array region CAR, the dummy region DR, and the connection region CNR to inject dopants into the second preliminary stack structure PST2 and the second planarization insulating layer 220. Accordingly, the first impurity injection region IR1 may be formed in the bit line pad BPD, the second impurity injection region IR2 may be formed in the uppermost second inter-electrode insulating layer 24, and the third impurity injection region IR3 may be formed in the second planarization insulating layer 220.

Referring to FIG. 20B, when the substrate contact hole WCH is formed, the third impurity injection region IR3 of the second planarization insulating layer 220 may be partially etched to form a fifth recess region SG5. In addition, when the second via hole TH2 is formed using the second mask pattern MK2, the third impurity injection region IR3 of the second planarization insulating layer 220 may be partially etched to form the fourth recess region SG4.

Referring to FIG. 20C, the contact insulating pattern SP3 and the substrate contact plug WC may be formed in the substrate contact hole WCH, and the second via insulating pattern SP2 and the edge through via ETHV may be formed in the second via hole TH2. The second interlayer insulating layer 207 may be formed on the first interlayer insulating layer 205. The cell contact holes CCH may be formed by etching the second interlayer insulating layer 207, the first interlayer insulating layer 205, and the inter-electrode insulating layers 12, 22, and 24 on the connection region CNR. During this process, the third impurity injection region IR3 of the second planarization insulating layer 220 and the second impurity injection region IR2 of the uppermost second inter-electrode insulating layer 24 may be partially etched to form the sixth recess region SG6. Thereafter, the cell contact plugs CC may be formed in the cell contact holes CCH, respectively. Except for these differences, other parts of the fabrication process according to some example embodiments may be performed in the same or similar manner as that in the previous embodiment.

Figure 21:
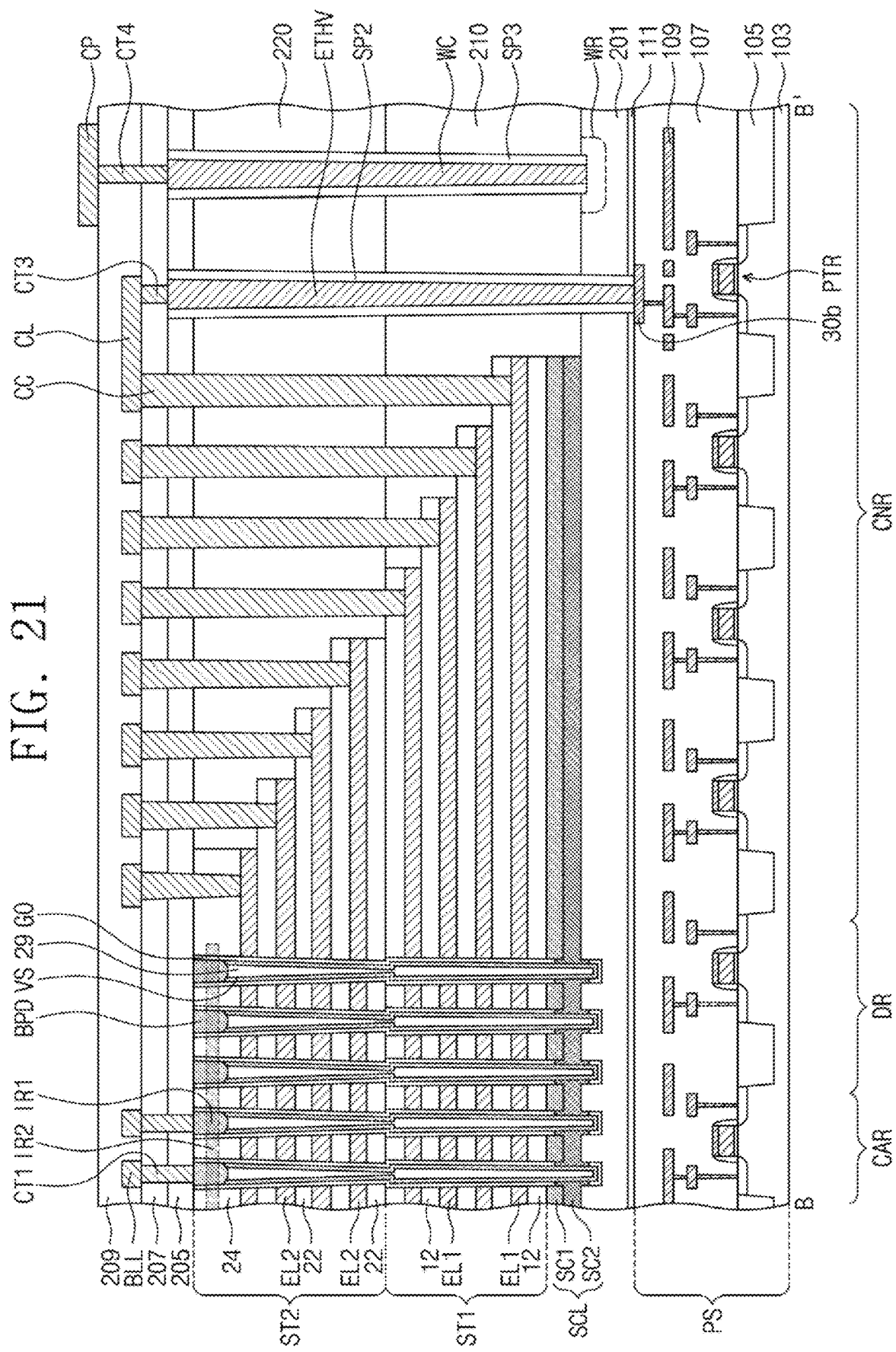
FIG. 21 is a sectional view illustrating a three-dimensional semiconductor memory device according to some example embodiments of the inventive concepts.

FIG. 21 is a sectional view illustrating a three-dimensional semiconductor memory device according to some example embodiments of the inventive concepts.

Referring to FIG. 21, in the three-dimensional semiconductor memory device, the second impurity injection region IR2 may be formed in the uppermost second inter-electrode insulating layer 24 provided on the cell array region CAR as well as the dummy region DR. The second impurity injection region IR2 may not be formed on the connection region CNR. Except for these differences, the three-dimensional semiconductor memory device according to some example embodiments of the inventive concepts may have the same or similar structure as that described with reference to FIGS. 2 to 7.

Figure 22:
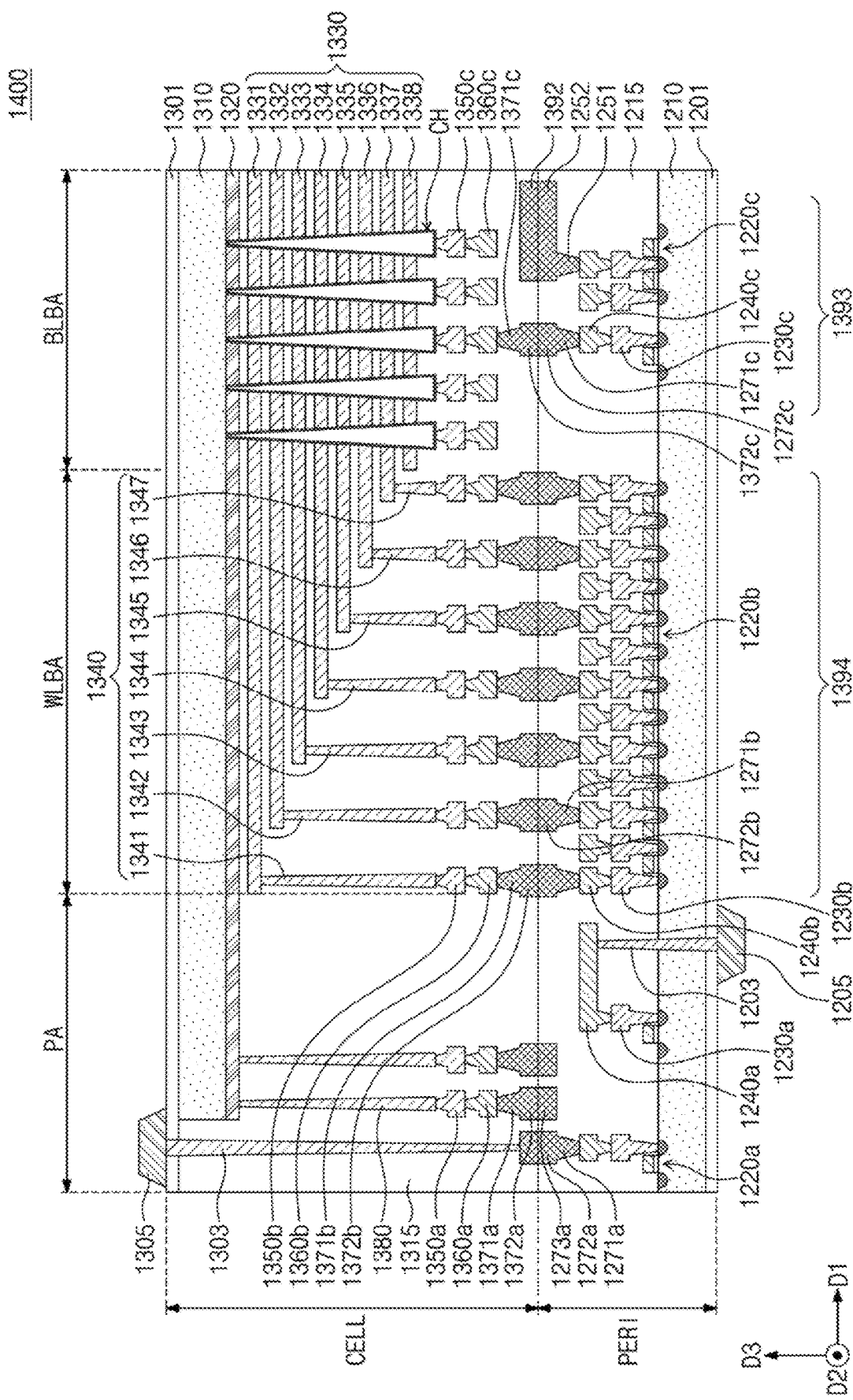
FIG. 22 is a sectional view illustrating a semiconductor device according to some example embodiments of the inventive concepts.

FIG. 22 is a sectional view illustrating a semiconductor device according to some example embodiments of the inventive concepts.

Referring to FIG. 22, a memory device 1400 may have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other in a bonding manner. The bonding manner may mean a way of electrically connecting a bonding metal formed in the uppermost metal layer of the upper chip to a bonding metal formed in the uppermost metal layer of the lower chip. For example, in the case where the bonding metal is formed of copper (Cu), the bonding manner may be a Cu-to-Cu bonding manner, but in some example embodiments, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1210, an interlayer insulating layer 1215, a plurality of circuit devices 1220a, 1220b, and 1220c formed on the first substrate 1210, first metal layers 1230a, 1230b, and 1230c connected to the circuit devices 1220a, 1220b, and 1220c, respectively, and second metal layers 1240a, 1240b, and 1240c formed on the first metal layers 1230a, 1230b, and 1230c. In some example embodiments, the first metal layers 1230a, 1230b, and 1230c may be formed of or include a material (e.g., tungsten) having relatively high electric resistivity, and the second metal layers 1240a, 1240b, and 1240c may be formed of or include a material (e.g., copper) having relatively low electric resistivity.

Although only the first metal layers 1230a, 1230b, and 1230c and the second metal layers 1240a, 1240b, and 1240c are illustrated and described in the present specification, the inventive concepts is not limited thereto and at least one metal layer may be further formed on the second metal layers 1240*a*, 1240*b*, and 1240*c*. At least one of the additional metal layers, which are formed on the second metal layers 1240*a*, 1240*b*, and 1240*c*, may be formed of a material (e.g., aluminum), which has lower electric resistivity than the material (e.g., copper) of the second metal layers 1240*a*, 1240*b*, and 1240*c*.

The interlayer insulating layer 1215 may be disposed on the first substrate 1210 to cover the circuit devices 1220*a*, 1220*b*, and 1220*c*, the first metal layers 1230*a*, 1230*b*, and 1230*c*, and the second metal layers 1240*a*, 1240*b*, and 1240*c* and may be formed of or include at least one of insulating materials (e.g., silicon oxide and silicon nitride).

Lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit structure PERI may be electrically connected to upper bonding metals 1371*b* and 1372*b* of the cell array structure CELL in a bonding manner, and the lower bonding metals 1271*b* and 1272*b* and the upper bonding metals 1371*b* and 1372*b* may be formed of or include at least one of aluminum, copper, or tungsten.

The cell array structure CELL may correspond to the cell array structure CS described with reference to FIGS. 2 to 21. The cell array structure CELL may include at least one memory block. The cell array structure CELL may include a second substrate 1310 and a common source line 1320. A plurality of word lines 1331-1338 (1330) may be stacked on the second substrate 1310 in a direction (e.g., a z-axis direction) that is perpendicular to a top surface of the second substrate 1310. String selection lines and a ground selection line may be respectively disposed on and below the word lines 1330; that is, the word lines 1330 may be disposed between the string selection lines and the ground selection line.

In the bit line bonding region BLBA, a channel structure CH may be provided to extend in the direction (e.g., the z-axis direction) perpendicular to a top surface of the second substrate 1310 and to penetrate the word lines 1330, the string selection lines, and the ground selection line. The channel structure CH may include a data storage layer, a channel layer, and an insulating gapfill layer, and the channel layer may be electrically connected to a first metal layer 1350*c* and a second metal layer 1360*c*. For example, the first metal layer 1350*c* may be a bit line contact, and the second metal layer 1360*c* may be a bit line. In some example embodiments, the bit line 1360*c* may be extended in a first direction (e.g., a y-axis direction) parallel to the top surface of the second substrate 1310.

In some example embodiments shown in FIG. 22, a region provided with the channel structure CH and the bit line 1360*c* may be defined as the bit line bonding region BLBA. In the bit line bonding region BLBA, the bit lines 1360*c* may be electrically connected to the circuit devices 1220*c*, which are provided in the peripheral circuit structure PERI to constitute a page buffer 1393. As an example, the bit lines 1360*c* may be connected to upper bonding metals 1371*c* and 1372*c* of the peripheral circuit structure PERI, and the upper bonding metals 1371*c* and 1372*c* may be connected to lower bonding metals 1271*c* and 1272*c*, which are connected to the circuit devices 1220*c* of the page buffer 1393.

In the word line bonding region WLBA, the word lines 1330 may be extended in a second direction (e.g., an x-axis direction), which is perpendicular to the first direction and is parallel to the top surface of the second substrate 1310, and may be connected to a plurality of cell contact plugs 1341-1347 (1340). The cell contact plugs 1341-1347 or 1340 may have the same shape as the cell contact plug CC of FIG. 4B or may have the same shape as the cell contact plug CC of FIG. 18.

The cell contact plugs 1340 may be connected to pads of the word lines 1330, which are extended to have different lengths from each other in the first direction. A first metal layer 1350*b* and a second metal layer 1360*b* may be sequentially connected to upper portions of the cell contact plugs 1340 connected to the word lines 1330 (e.g., word lines 1331, 1332, 1333, 1334, 1335, 1336, 1337, and 1338). In the word line bonding region WLBA, the cell contact plugs 1340 (e.g., cell contact plugs, 1341, 1342, 1343, 1344, 1345, 1346, and 1347) may be connected to the peripheral circuit structure PERI through the upper bonding metals 1371*b* and 1372*b* of the cell array structure CELL and the lower bonding metals 1271*b* and 1272*b* of the peripheral circuit structure PERI.

In the peripheral circuit structure PERI, the cell contact plugs 1340 may be electrically connected to the circuit devices 1220*b* constituting a row decoder 1394. In some example embodiments, an operation voltage of the circuit devices 1220*b* constituting the row decoder 1394 may be different from an operation voltage of the circuit devices 1220*c* constituting the page buffer 1393. As an example, the operation voltage of the circuit devices 1220*c* constituting the page buffer 1393 may be higher than the operation voltage of the circuit devices 1220*b* constituting the row decoder 1394.

A common source line contact plug 1380 may be disposed in the outer pad bonding region PA. The common source line contact plug 1380 may have a protruding portion at the first height HT (e.g., see FIG. 4A). The common source line contact plug 1380 may be formed of a conductive material (e.g., metals, metal compounds, or polysilicon) and may be electrically connected to the common source line 1320. A first metal layer 1350*a* and a second metal layer 1360*a* may be sequentially stacked on the common source line contact plug 1380. A region, in which the common source line contact plug 1380, the first metal layer 1350*a*, and the second metal layer 1360*a* are provided, may be defined as the outer pad bonding region PA.

Meanwhile, input/output pads 1205 and 1305 may be disposed in the outer pad bonding region PA. Referring to FIG. 22, a lower insulating layer 1201 may be formed below the first substrate 1210 to cover the bottom surface of the first substrate 1210, and a first input/output pad 1205 may be formed on the lower insulating layer 1201. The first input/output pad 1205 may be connected to at least one of the circuit devices 1220*a*, 1220*b*, and 1220*c* of the peripheral circuit structure PERI through a first input/output contact plug 1203 and may be separated apart from the first substrate 1210 by the lower insulating layer 1201. In addition, a sidewall insulating layer (not shown) may be disposed between the first input/output contact plug 1203 and the first substrate 1210 to electrically separate the first input/output contact plug 1203 from the first substrate 1210.

Referring to FIG. 22, an upper insulating layer 1301 may be formed on the second substrate 1310 to cover the top surface of the second substrate 1310, and a second input/output pad 1305 may be disposed on the upper insulating layer 1301. The second input/output pad 1305 may be connected to at least one of the circuit devices 1220*a*, 1220*b*, and 1220*c* of the peripheral circuit structure PERI through a second input/output contact plug 1303. The second input/output contact plug 1303 may have a protruding portion at the first height HT (e.g., see FIG. 4A). In some example embodiments, the second input/output pad 1305 may be electrically connected to the circuit device 1220a. The second input/output contact plug 1303 may be connected to lower bonding metals 1271a and 1272a, which are connected to the circuit devices 1220a.

In some example embodiments, the second substrate 1310 and the common source line 1320 may not be disposed in a region provided with the second input/output contact plug 1303. In addition, the second input/output pad 1305 may not overlap the word lines 1330 in the third direction (i.e., the z-axis direction). Referring to FIG. 22, the second input/output contact plug 1303 may be separated from the second substrate 1310 in a direction parallel to the top surface of the second substrate 1310, may penetrate an interlayer insulating layer 1315 of the cell array structure CELL, and may be connected to the second input/output pad 1305.

In some example embodiments, the first input/output pad 1205 and the second input/output pad 1305 may be selectively formed. As an example, the memory device 1400 may be configured to include only the first input/output pad 1205, which is provided on the first substrate 1210, or to include only the second input/output pad 1305, which is provided on the second substrate 1310. Alternatively, the memory device 1400 may be configured to include both of the first and second input/output pads 1205 and 1305.

A metal pattern, which is used as a dummy pattern, may be provided in the uppermost metal layer of the outer pad bonding region PA and the bit line bonding region BLBA, which are included in each of the cell array structure CELL and the peripheral circuit structure PERI, or may not be provided in the uppermost metal layer.

The memory device 1400 may include upper metal patterns 1371a and 1372a and a lower metal pattern 1273a, which are provided in the outer pad bonding region PA, and here, the lower metal pattern 1273a may be formed in the uppermost metal layer of the peripheral circuit structure PERI to correspond to the upper metal patterns 1371a and 1372a, which are formed in the uppermost metal layer of the cell array structure CELL, or to have the same shape as the upper metal patterns 1371a and 1372a of the cell array structure CELL. The lower metal pattern 1273a, which is formed in the uppermost metal layer of the peripheral circuit structure PERI, may not be connected to any contact plug in the peripheral circuit structure PERI. Similarly, in the outer pad bonding region PA, the upper metal patterns 1371a and 1372a may be formed in the uppermost metal layer of the cell array structure CELL to correspond to the lower metal pattern 1273a, which is formed in the uppermost metal layer of the peripheral circuit structure PERI, or to have the same shape as the lower metal pattern 1273a of the peripheral circuit structure PERI.

The lower bonding metals 1271b and 1272b may be formed on the second metal layer 1240b of the word line bonding region WLBA. In the word line bonding region WLBA, the lower bonding metals 1271b and 1272b of the peripheral circuit structure PERI may be electrically connected to the upper bonding metals 1371b and 1372b of the cell array structure CELL in a bonding manner.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI, and in this case, the upper metal pattern 1392 may have the same shape as the lower metal pattern 1252 of the peripheral circuit structure PERI. The lower metal pattern 1252 may be connected to lower bonding metal 1251, which may be connected to the circuit devices 1220c of the page buffer 1393. In some example embodiments, any contact plug may not be formed on the upper metal pattern 1392, which is formed in the uppermost metal layer of the cell array structure CELL.

In a three-dimensional semiconductor memory device according to some example embodiments of the inventive concepts and an electronic system including the same, a bit line pad may be highly doped with impurity ions, and in this case, an erase operation may be more effectively performed using a gate induced drain leakage (e.g., GIDL) phenomenon. This may make it possible to improve reliability of the three-dimensional semiconductor memory device.

As described herein, any devices, systems, modules, units, controllers, circuits, and/or portions thereof according to any of the example embodiments (including, without limitation, the electronic system 1000, semiconductor device 1100, controller 1200, decoder circuit 1110, page buffer circuit 1120, logic circuit 1130, processor 1211, NAND controller 1220, electronic system 2000, controller 2002, semiconductor packages 2003, DRAM 2004, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, and/or portions thereof according to any of the example embodiments, and/or any portions thereof.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a source structure on a substrate;
   a stack structure including electrode layers and inter-electrode insulating layers which are alternately stacked on the source structure;
   a vertical structure penetrating the stack structure and the source structure and being adjacent to the substrate; and
   a separation insulation pattern penetrating the stack structure and the source structure and being spaced apart from the vertical structure, wherein an uppermost one of the inter-electrode insulating layers includes a first impurity injection region located at a first height from a top surface of the substrate,
the stack structure defines a groove, in which the separation insulation pattern is located, and
an inner sidewall of the groove defines a recess region, which is located at the first height from the top surface of the substrate and is recessed toward the vertical structure.

2. The device of claim 1, wherein the separation insulation pattern includes an insulating protruding portion located in the recess region.

3. The device of claim 1, further comprising a remaining electrode pattern, which is located in the recess region and is in contact with the separation insulation pattern.

4. The device of claim 3, wherein the remaining electrode pattern includes a same material as the electrode layers.

5. The device of claim 1, wherein
the stack structure defines a vertical hole, in which the vertical structure is located,
the vertical structure further includes
a cell vertical pattern conformally formed along an inner sidewall of the vertical hole,
a gate insulating layer interposed between the cell vertical pattern and the inner sidewall of the vertical hole, and
a bit line pad on the cell vertical pattern,
the bit line pad is doped with first impurities, and
the first impurity injection region is doped with the first impurities.

6. The device of claim 5, wherein a doping concentration of the first impurities in the bit line pad ranges from $9 \times 10^{20}$ ions/cm$^3$ to $2 \times 10^{21}$ ions/cm$^3$.

7. The device of claim 5, wherein the gate insulating layer comprises:
a tunnel insulating layer in contact with the cell vertical pattern;
a blocking insulating layer in contact with the inner sidewall of the vertical hole; and
a charge storing layer between the tunnel insulating layer and the blocking insulating layer,
wherein portions of the charge storing layer, the tunnel insulating layer, and the blocking insulating layer located at the first height are doped with the first impurities.

8. The device of claim 1, wherein a vertical width of the recess region ranges from 10 nm to 50 nm.

9. The device of claim 1, further comprising:
a through via that penetrates the stack structure and the source structure and is spaced apart from the vertical structure and the separation insulation pattern; and
a via insulating pattern between the through via and the stack structure,
wherein the via insulating pattern has an insulating protruding portion, which is located at the first height from the top surface of the substrate and protrudes toward the stack structure.

10. The device of claim 1, wherein
the substrate includes a cell array region, a dummy region, and a connection region, which are disposed side by side in a direction,
the stack structure is on the cell array region, the dummy region, and the connection region, and
the first impurity injection region is only on the cell array region.

11. The device of claim 1, wherein
the substrate includes a cell array region, a dummy region, and a connection region, which are disposed side by side in a direction,
the stack structure is on the cell array region, the dummy region, and the connection region,
the electrode layers and the inter-electrode insulating layers of the stack structure define a staircase structure on the connection region, and
the three-dimensional semiconductor memory device further includes
a planarization insulating layer on the connection region, the planarization insulating layer covering an end portion of the stack structure, and
a second impurity injection region, which is in the planarization insulating layer and at the first height from the top surface of the substrate.

12. The device of claim 11, wherein the first impurity injection region and the second impurity injection region are doped with impurities of a same kind and have a same doping concentration.

13. The device of claim 11, further comprising:
cell contacts, which penetrate the planarization insulating layer and the inter-electrode insulating layers to be connected to the electrode layers on the connection region, respectively,
wherein each of the cell contacts has a contact protruding portion, which is located at the first height and protrudes toward the planarization insulating layer.

14. The device of claim 11, further comprising:
a through via penetrating the planarization insulating layer on the connection region; and
a via insulating pattern interposed between the through via and the planarization insulating layer,
wherein the via insulating pattern has an insulating protruding portion, which is located at the first height and protrudes toward the planarization insulating layer.

15. The device of claim 14, wherein
the recess region has a first depth, when measured from the inner sidewall of the groove toward the vertical structure,
the insulating protruding portion has a first width, when measured from a side surface of the via insulating pattern toward the planarization insulating layer, and
the first depth is larger than the first width.

16. A three-dimensional semiconductor memory device, comprising:
a peripheral circuit structure and a cell array structure on the peripheral circuit structure,
wherein the cell array structure includes
a first substrate including a cell array region and a connection region,
a source structure on the first substrate,
a stack structure including electrode layers and inter-electrode insulating layers, which are alternately stacked on the first substrate,
a planarization insulating layer on the connection region, the planarization insulating layer covering an end portion of the stack structure,
a plurality of vertical patterns on the cell array region, the plurality of vertical patterns penetrating the stack structure and the source structure and adjacent to the first substrate,
bit line pads on the vertical patterns, respectively, and
a separation insulation pattern on the cell array region, the separation insulation pattern penetrating the stack structure and the source structure, wherein an uppermost one of the inter-electrode insulating layers includes a first impurity injection region that is located at a first height from a top surface of the first substrate, wherein the stack structure defines a groove in which the separation insulation pattern is located, wherein an upper sidewall of the groove defines a recess region which is located at the first height from the top surface of the first substrate and is recessed toward at least one vertical pattern of the plurality of vertical patterns, and wherein the bit line pads are doped with impurities with a doping concentration ranging from $9 \times 10^{20}$ ions/cm$^3$ to $2 \times 10^{21}$ ions/cm$^3$.

17. The device of claim 16, wherein the separation insulation pattern includes an insulating protruding portion located in the recess region.

18. The device of claim 16, further comprising:
a remaining electrode pattern which is located in the recess region and is in contact with the separation insulation pattern.

19. The device of claim 16, further comprising:
a second impurity injection region which is located at the first height from the top surface of the first substrate in the planarization insulating layer, wherein the first impurity injection region and the second impurity injection region are doped with impurities of a same kind and have a same doping concentration.

20. An electronic system, comprising:
a semiconductor device including a peripheral circuit structure, a cell array structure on the peripheral circuit structure, and an input/output pad electrically connected to the peripheral circuit structure; and a controller electrically connected to the semiconductor device through the input/output pad, the controller configured to control the semiconductor device, wherein the cell array structure includes
a first substrate including a cell array region and a connection region,
a source structure on the first substrate,
a stack structure including electrode layers and inter-electrode insulating layers alternately stacked on the first substrate,
a planarization insulating layer on the connection region, the planarization insulating layer covering an end portion of the stack structure,
a plurality of vertical patterns on the cell array region, the plurality of vertical patterns penetrating the stack structure and the source structure and adjacent to the first substrate, and
a separation insulation pattern located on the cell array region, the separation insulation pattern penetrating the stack structure and the source structure, wherein an uppermost one of the inter-electrode insulating layers includes a first impurity injection region at a first height from a top surface of the first substrate, wherein the stack structure defines a groove in which the separation insulation pattern is located, and wherein an upper sidewall of the groove defines a recess region located at the first height from the top surface of the first substrate and recessed toward at least one vertical pattern of the plurality of vertical patterns.

* * * * *